United States Patent
Anderson et al.

(10) Patent No.: US 9,106,064 B2
(45) Date of Patent: Aug. 11, 2015

(54) CABLE MANAGEMENT IN RACK SYSTEMS

(71) Applicant: ADC Telecommunications, Inc., Berwyn, PA (US)

(72) Inventors: Chad Anderson, New Prague, MN (US); Michael Wentworth, Belle Plaine, MN (US); Craig Fleming, Apple Valley, MN (US)

(73) Assignee: ADC Telecommunications, Inc., Berwyn, PA (US)

( * ) Notice: Subject to any disclaimer, the term of this patent is extended or adjusted under 35 U.S.C. 154(b) by 0 days.

(21) Appl. No.: 14/477,455

(22) Filed: Sep. 4, 2014

(65) Prior Publication Data
US 2014/0367161 A1    Dec. 18, 2014

Related U.S. Application Data

(63) Continuation of application No. 13/295,742, filed on Nov. 14, 2011, now Pat. No. 8,842,445.

(60) Provisional application No. 61/413,856, filed on Nov. 15, 2010, provisional application No. 61/466,696, filed on Mar. 23, 2011.

(51) Int. Cl.
*H02B 1/20* (2006.01)
*H02G 3/18* (2006.01)
(Continued)

(52) U.S. Cl.
CPC .............. *H02G 3/18* (2013.01); *G02B 6/4452* (2013.01); *H02G 1/00* (2013.01); *H04Q 1/03* (2013.01); *H04Q 1/062* (2013.01); *H04Q 1/064* (2013.01); *H04Q 1/066* (2013.01); *H04Q 1/068* (2013.01);
(Continued)

(58) Field of Classification Search
CPC ......... G02B 6/4452; H02G 1/00; H02G 3/18; H04Q 1/03; H04Q 1/062; H04Q 1/064; H04Q 1/066; H04Q 1/068; H04Q 1/09; H04Q 1/13; H05K 5/0247; H05K 7/10
USPC ................. 361/825–827, 724–727; 174/541; 254/134.3 R
See application file for complete search history.

(56) References Cited

U.S. PATENT DOCUMENTS 5,461,693 A * 10/1995 Pimpinella .................... 385/135
6,614,978 B1    9/2003 Caveney
(Continued)

FOREIGN PATENT DOCUMENTS

EP    1 160 605 A2    12/2001

OTHER PUBLICATIONS

ADC Glide Cable Management Cross-Connect and Inter-Connect Guide, ADCP-92-016, Issue 2, pp. 1-12 (Jul. 2002).
(Continued)

*Primary Examiner* — Yuriy Semenenko
(74) *Attorney, Agent, or Firm* — Merchant & Gould P.C.

(57) ABSTRACT

A rack system includes one or more racks each configured to receive at least one distribution module. Each rack includes management sections located at the front of the rack; troughs located at the rear of the rack; horizontal channels extending between the management sections and the trough; a storage area located at a first of opposing sides of the rack; a front vertical channel that connects to the storage area and at least some of the management sections; and a travel channel at the rear of the first rack that connects the storage area to the troughs.

7 Claims, 30 Drawing Sheets

(51) Int. Cl.

| | |
|---|---|
| *G02B 6/44* | (2006.01) |
| *H04Q 1/02* | (2006.01) |
| *H04Q 1/06* | (2006.01) |
| *H02G 1/00* | (2006.01) |
| *H05K 5/02* | (2006.01) |
| *H05K 7/10* | (2006.01) |

(52) U.S. Cl.
CPC . *H04Q 1/09* (2013.01); *H04Q 1/13* (2013.01); *H05K 5/0247* (2013.01); *H05K 7/10* (2013.01)

(56) References Cited

U.S. PATENT DOCUMENTS

| | | |
|---|---|---|
| 7,083,051 B2 | 8/2006 | Smith et al. |
| 7,995,357 B2 | 8/2011 | Hruby et al. |
| 2003/0095772 A1 | 5/2003 | Solheid et al. |
| 2003/0223724 A1 | 12/2003 | Puetz et al. |
| 2004/0037533 A1 | 2/2004 | Knudsen |
| 2005/0232566 A1 | 10/2005 | Rapp et al. |
| 2005/0247650 A1* | 11/2005 | Vogel et al. ............... 211/26 |
| 2006/0228087 A1 | 10/2006 | Bayazit et al. |
| 2007/0031100 A1 | 2/2007 | Garcia et al. |
| 2007/0047894 A1 | 3/2007 | Holmberg et al. |
| 2007/0280618 A1 | 12/2007 | Xin et al. |
| 2008/0175552 A1 | 7/2008 | Smrha et al. |
| 2009/0129033 A1 | 5/2009 | Smrha et al. |
| 2010/0054683 A1 | 3/2010 | Cooke et al. |
| 2010/0086273 A1 | 4/2010 | Rector, III |
| 2010/0166377 A1* | 7/2010 | Nair et al. ............... 385/135 |
| 2011/0150407 A1* | 6/2011 | Beamon et al. ............... 385/135 |
| 2012/0219262 A1* | 8/2012 | Hendrix et al. ............... 385/135 |
| 2013/0094827 A1 | 4/2013 | Haataja |
| 2013/0194772 A1* | 8/2013 | Rojo et al. ............... 361/818 |
| 2014/0241667 A1* | 8/2014 | Cote et al. ............... 385/59 |
| 2014/0241691 A1* | 8/2014 | Solheid et al. ............... 385/135 |
| 2014/0357118 A1* | 12/2014 | Takeuchi et al. ............... 439/540.1 |

OTHER PUBLICATIONS

Dual Storage NGF Installation and Cable Routing Guide, ADCP-90-282, Issue 2, 71 pages (Jun. 2001).
Dual Storage NGF Patch Cord Routing Guide, ADCP-90-283, Issue 1, pp. 1-13 (Jul. 2001).
Fiber Breakout Bay Cable Routing Guide, ADCP-90-329, Issue 1, pp. 1-8 (May 2002).
International Search Report mailed Feb. 29, 2012, 5 pages.
International Search Report and Written Opinion mailed Jul. 10, 2012.

* cited by examiner

CABLE MANAGEMENT IN RACK SYSTEMS

CROSS REFERENCE TO RELATED APPLICATIONS

This application is a continuation of application Ser. No. 13/295,742, filed Nov. 14, 2011, now issued as U.S. Pat. No. 8,842,445, which application claims the benefit of U.S. Provisional Application No. 61/413,856, filed Nov. 15, 2010 and U.S. Provisional Application No. 61/466,696, filed Mar. 23, 2011 and is titled "Cable Management in Rack Systems," which applications are incorporated herein by reference in their entirety

BACKGROUND

In communications infrastructure installations, a variety of communications devices can be used for switching or connecting (e.g., cross-connecting and/or interconnecting) communications signal transmission paths in a communications network. For example, some communications equipment can be mounted to one of a number of framework structures (e.g., cabinets or racks).

A vast number of cables are run from, to, and between the equipment mounted to the framework structures. For example, some racks can include distribution areas at which adapters or other couplers can be installed. Cables can extend from the adapters to various pieces of fiber optic equipment. Using patch cords or cables between the adapters, the pieces of optical equipment can be connected through the rack system.

SUMMARY

The present disclosure relates to rack systems including one or more racks that have cable termination locations, cable routing locations, and cable management locations to facilitate connecting distribution modules installed on the rack system. Certain types of rack systems include structure to aid in organizing, routing, and/or protecting the cables. In various implementations, distribution cables, patch cables, and/or additional cables can be routed throughout the rack system.

A variety of examples of desirable product features or methods are set forth in part in the description that follows, and in part will be apparent from the description, or may be learned by practicing various aspects of the disclosure. The aspects of the disclosure may relate to individual features as well as combinations of features. It is to be understood that both the foregoing general description and the following detailed description are explanatory only, and are not restrictive of the claimed invention.

BRIEF DESCRIPTION OF THE DRAWINGS

The accompanying drawings, which are incorporated in and constitute a part of the description, illustrate several aspects of the present disclosure. A brief description of the drawings is as follows.

DETAILED DESCRIPTION

Figure 1:
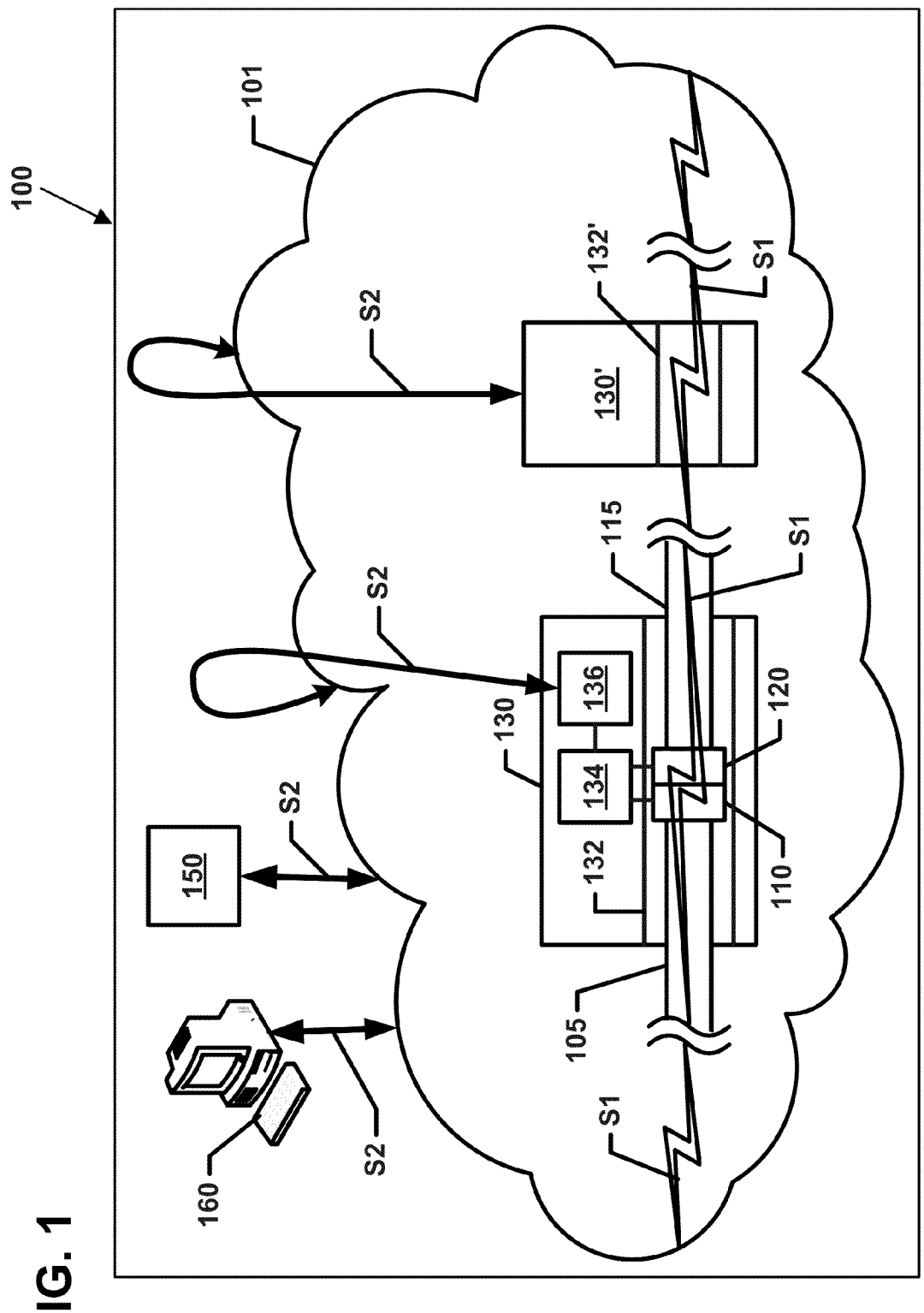
FIG. 1 is a diagram of a portion of an example communications and data management system in accordance with aspects of the present disclosure.

The present disclosure is directed to rack systems that include one or more racks. Each rack is configured to receive one or more distribution modules. Each distribution module includes a plurality of patch cable ports at which terminated ends of patch cables can be plugged. An opposite terminated end of each patch cable can be routed to another distribution module or other equipment at the same or a different rack in the rack system.

Each distribution module also includes one or more distribution cable ports at which terminated ends of distribution cables can be plugged. Opposite ends of the distribution cables can connect the distribution modules to a larger communications network as will be described in more detail herein. Communications signals pass through the distribution modules between the distribution cables and the patch cables.

Additional cables (e.g., PLI cables) also may be routed to the distribution modules of the rack systems. In accordance with some aspects, the PLI cables may provide power (e.g., electrical power) to the distribution modules. In accordance with other aspects, the PLI cables may carry additional data signals between the distribution modules and a data network as will be described in more detail herein. In certain implementations, the data network is different from the communications network to which the distribution cables connect.

The racks of the rack systems include cable management locations and structure to aid in organizing, routing, and/or protecting the patch cables, distribution cables, and/or PLI cables.

As the term is used herein, a "cable" refers to a physical medium that is capable of carrying one or more data signals along its length. Non-limiting examples of suitable cables include fiber cables, electrical cables, and hybrid cables. For example, a fiber optic cable includes one or more optical fibers that are configured to carry optical signals along their length. The fibers in a fiber optic cable may be buffered and/or jacketed (e.g., individually or as a group). Certain types of fiber optic cables may be terminated with one or more connectors (e.g., SC, LC, FC, LX.5, or MPO connectors).

An electrical cable includes one or more conductors (e.g., wires) that are configured to carry electrical signals along their length. The conductors in an electrical cable may be insulated (e.g., individually or as a group). Non-limiting examples of electrical cables include CAT-5, 6, and 7 twisted-pair cables, DS1 line, and DS3 line. Certain types of electrical cables may be terminated with one or more connectors or connector assemblies (e.g., RJ jacks and plugs, DSX jacks and plugs, BNC connectors, F connectors, punch-down terminations, or bantam jacks and plugs). A hybrid cable includes a combination of one or more wires and one or more optical fibers that may be insulated/jacketed.

Reference will now be made in detail to exemplary aspects of the present disclosure that are illustrated in the accompanying drawings. Wherever possible, the same reference numbers will be used throughout the drawings to refer to the same or like parts.

FIG. 1 is a diagram of a portion of an example communications and data management system 100. The example system 100 shown in FIG. 1 includes a part of a communications network 101 along which communications signals S1 pass. In one example implementation, the network 101 can include an Internet Protocol network. In other implementations, however, the communications network 101 may include other types of networks.

The communications network 101 includes interconnected network components (e.g., connector assemblies, inter-networking devices, internet working devices, servers, outlets, and end user equipment (e.g., computers)). In one example implementation, communications signals S1 pass from a computer, to a wall outlet, to a port of communication panel, to a first port of an inter-networking device, out another port of the inter-networking device, to a port of the same or another communications panel, to a rack mounted server. In other implementations, the communications signals S1 may follow other paths within the communications network 101.

The portion of the communications network 101 shown in FIG. 1 includes first and second connector assemblies 130, 130' at which communications signals S1 pass from one portion of the communications network 101 to another portion of the communications network 101. Non-limiting examples of connector assemblies 130, 130' include, for example, rack-mounted connector assemblies (e.g., patch panels, distribution units, and media converters for fiber and copper physical communication media), wall-mounted connector assemblies (e.g., boxes, jacks, outlets, and media converters for fiber and copper physical communication media), and inter-networking devices (e.g., switches, routers, hubs, repeaters, gateways, and access points).

In the example shown, the first connector assembly 130 defines at least one port 132 configured to communicatively couple at least a first media segment (e.g., cable) 105 to at least a second media segment (e.g., cable) 115 to enable the communication signals S1 to pass between the media segments 105, 115. The at least one port 132 of the first connector assembly 130 may be directly connected to a port 132' of the second connector assembly 130'. As the term is used herein, the port 132 is directly connected to the port 132' when the communications signals S1 pass between the two ports 132, 132' without passing through an intermediate port. For example, plugging a first terminated end of a patch cable into the port 132 and a second terminated end of the patch cable into the port 132' directly connects the ports 132, 132'.

The port 132 of the first connector assembly 130 also may be indirectly connected to the port 132' of the second connector assembly 130'. As the term is used herein, the port 132 is indirectly connected to the port 132' when the communications signals S1 pass through an intermediate port when traveling between the ports 132, 132'. For example, in one implementation, the communications signals S1 may be routed over one media segment from the port 132 at the first connector assembly 130, to a port of a third connector assembly at which the media segment is coupled, to another media segment that is routed from the port of the third connector assembly to the port 132' of the second connector assembly 130'.

Non-limiting examples of media segments include optical cables, electrical cables, and hybrid cables. The media segments may be terminated with electrical plugs, electrical jacks, fiber optic connectors, fiber optic adapters, media converters, or other termination components. In the example shown, each media segment 105, 115 is terminated at a plug or connector 110, 120, respectively, which is configured to communicatively connect the media segments 105, 115. For example, in one implementation, the port 132 of the connector assembly 130 can be configured to align ferrules of two fiber optic connectors 110, 120. In another implementation, the port 132 of the connector assembly 130 can be configured to electrically connect an electrical plug with an electrical socket (e.g., a jack). In yet another implementation, the port 132 can include a media converter configured to connect an optical fiber to an electrical conductor.

In accordance with some aspects, the connector assembly 130 does not actively manage (e.g., is passive with respect to) the communications signals S1 passing through port 132. For example, in some implementations, the connector assembly 130 does not modify the communications signal S1 carried over the media segments 105, 115. Further, in some implementations, the connector assembly 130 does not read, store, or analyze the communications signal S1 carried over the media segments 105, 115.

In accordance with aspects of the disclosure, the communications and data management system 100 also provides physical layer information (PLI) functionality as well as physical layer management (PLM) functionality. As the term is used herein, "PLI functionality" refers to the ability of a physical component or system to identify or otherwise associate physical layer information with some or all of the physical components used to implement the physical layer of the system. As the term is used herein, "PLM functionality" refers to the ability of a component or system to manipulate or to enable others to manipulate the physical components used to implement the physical layer of the system (e.g., to track what is connected to each component, to trace connections that are made using the components, or to provide visual indications to a user at a selected component).

As the term is used herein, "physical layer information" refers to information about the identity, attributes, and/or status of the physical components used to implement the physical layer of the communications system 100. In accordance with some aspects, physical layer information of the communications system 100 can include media information, device information, and location information.

As the term is used herein, "media information" refers to physical layer information pertaining to cables, plugs, connectors, and other such physical media. In accordance with some aspects, the media information is stored on or in the physical media, themselves. In accordance with other aspects, the media information can be stored at one or more data repositories for the communications system, either alternatively or in addition to the media, themselves.

Non-limiting examples of media information include a part number, a serial number, a plug or other connector type, a conductor or fiber type, a cable or fiber length, cable polarity, a cable or fiber pass-through capacity, a date of manufacture, a manufacturing lot number, information about one or more visual attributes of physical communication media (e.g., information about the color or shape of the physical communication media or an image of the physical communication media), and an insertion count (i.e., a record of the number of times the media segment has been connected to another media segment or network component). Media information also can include testing or media quality or performance information. The testing or media quality or performance information, for example, can be the results of testing that is performed when a particular segment of media is manufactured.

As the term is used herein, "device information" refers to physical layer information pertaining to the communications panels, inter-networking devices, media converters, computers, servers, wall outlets, and other physical communications devices to which the media segments attach. In accordance with some aspects, the device information is stored on or in the devices, themselves. In accordance with other aspects, the device information can be stored at one or more data repositories for the communications system, either alternatively or in addition to the devices, themselves. In accordance with still other aspects, the device information can be stored in the media segments attached thereto. Non-limiting examples of device information include a device identifier, part number, model number, catalogue number, a device type, date of manufacture, insertion counts, port priority data (that associates a priority level with each port), and port updates (described in more detail herein).

As the term is used herein, "location information" refers to physical layer information pertaining to a physical layout of a building or buildings in which the network 101 is deployed. Location information also can include information indicating where each communications device, media segment, network component, or other component is physically located within the building. In accordance with some aspects, the location information of each system component is stored on or in the respective component. In accordance with other aspects, the location information can be stored at one or more data repositories for the communications system, either alternatively or in addition to the system components, themselves.

In accordance with some aspects, one or more of the components of the communications network 101 are configured to store physical layer information pertaining to the component as will be disclosed in more detail herein. In FIG. 1, the connectors 110, 120, the media segments 105, 115, and/or the connector assemblies 130, 130' may store physical layer information. For example, in FIG. 1, each connector 110, 120 may store information pertaining to itself (e.g., type of connector, data of manufacture, etc.) and/or to the respective media segment 105, 115 (e.g., type of media, test results, etc.).

In another example implementation, the media segments 105, 115 or connectors 110, 120 may store media information that includes a count of the number of times that the media segment (or connector) has been inserted into port 132. In such an example, the count stored in or on the media segment is updated each time the segment (or plug or connector) is inserted into port 132. This insertion count value can be used, for example, for warranty purposes (e.g., to determine if the connector has been inserted more than the number of times specified in the warranty) or for security purposes (e.g., to detect unauthorized insertions of the physical communication media).

One or more of the components of the communications network 101 can read the physical layer information from one or more media segments retained thereat. In certain implementations, one or more network components includes a media reading interface that is configured to read physical layer information stored on or in the media segments or connectors attached thereto. For example, in one implementation, the connector assembly 130 includes a media reading interface 134 that can read media information stored on the media cables 105, 115 retained within the port 132. In another implementation, the media reading interface 134 can read media information stored on the connectors or plugs 110, 120 terminating the cables 105, 115, respectively.

In accordance with some aspects of the disclosure, the physical layer information read by a network component may be processed or stored at the component. For example, in certain implementations, the first connector assembly 130 shown in FIG. 1 is configured to read physical layer information stored on the connectors 110, 120 and/or on the media segments 105, 115 using media reading interface 134. Accordingly, in FIG. 1, the first connector assembly 130 may store not only physical layer information about itself (e.g., the total number of available ports at that assembly 130, the number of ports currently in use, etc.), but also physical layer information about the connectors 110, 120 inserted at the ports and/or about the media segments 105, 115 attached to the connectors 110, 120.

The physical layer information obtained by the media reading interface may be communicated (see PLI signals S2) over the network 101 for processing and/or storage. In accordance with some aspects, the communications network 101 includes a data network (e.g., see network 218 of FIG. 2) along which the physical layer information is communicated. At least some of the media segments and other components of the data network may be separate from those of the communications network 101 to which such physical layer information pertains. For example, in some implementations, the first connector assembly 130 may include a plurality of "normal" ports (e.g., fiber optic adapter ports) at which connectorized media segments (e.g., optical fibers) are coupled together to create a path for communications signals S1. The first connector assembly 130 also may include one or more PLI ports 136 at which the physical layer information (see PLI signals S2) are passed to components of the data network (e.g., to one or more aggregation points 150 and/or to one or more computer systems 160).

In other implementations, however, the physical layer information may be communicated over the communications network 101 just like any other signal, while at the same time not affecting the communication signals S1 that pass through the connector assembly 130 on the normal ports 132. Indeed, in some implementations, the physical layer information may be communicated as one or more of the communication signals S1 that pass through the normal ports 132 of the connector assemblies 130, 130'. For example, in one implementation, a media segment may be routed between the PLI port 136 and one of the "normal" ports 132. In another implementation, the media segment may be routed between the PLI port 136 and a "normal" port of another connector assembly. In such implementations, the physical layer information may be passed along the communications network 101 to other components of the communications network 101 (e.g., to another connector assembly, to one or more aggregation points 150 and/or to one or more computer systems 160). By using the network 101 to communicate physical layer information pertaining to it, an entirely separate data network need not be provided and maintained in order to communicate such physical layer information.

For example, in the implementation shown in FIG. 1, each connector assembly 130 includes at least one PLI port 136 that is separate from the "normal" ports 132 of the connector assembly 130. Physical layer information is communicated between the connector assembly 130 and the communications network 101 through the PLI port 136. Components of the communications network 101 may be connected to one or more aggregation devices 150 and/or to one or more computing systems 160. In the example shown in FIG. 1, the connector assembly 130 is connected to a representative aggregation device 150, a representative computing system 160, and to other components of the network 101 (see looped arrows) via the PLI port 136.

In some implementations, some types of physical layer information pertaining to media segments can be obtained by the connector assembly 130 from a user at the connector assembly 130 via a user interface (e.g., a keypad, a scanner, a touch screen, buttons, etc.). For example, physical layer information pertaining to media that is not configured to store such information can be entered manually into the connector assembly 130 by the user. In certain implementations, the connector assembly 130 can provide the physical layer information obtained from the user to other devices or systems that are coupled to the communications network 101 and/or a separate data network.

In other implementations, some or all physical layer information can be obtained by the connector assembly 130 from other devices or systems that are coupled to the communications network 101 and/or a separate data network. For example, physical layer information pertaining to media that is not configured to store such information can be entered manually into another device or system (e.g., at the connector assembly 130, at the computer 160, or at the aggregation point 150) that is coupled to the network 101 and/or a separate data network.

In some implementations, some types of non-physical layer information (e.g., network information) also can be obtained by one network component (e.g., a connector assembly 130, an aggregation point 150, or a computer 160) from other devices or systems that are coupled to the communications network 101 and/or a separate data network. For example, the connector assembly 130 may pull non-physical layer information from one or more components of the network 101. In other implementations, the non-physical layer information can be obtained by the connector assembly 130 from a user at the connector assembly 130.

In some implementations, the connector assembly 130 is configured to modify (e.g., add, delete, and/or change) the physical layer information stored in or on the segment of physical communication media 105, 115 (i.e., or the associated connectors 110, 120). For example, in some implementations, the media information stored in or on the segment of physical communication media 105, 115 can be updated to include the results of testing that is performed when a segment of physical media is installed or otherwise checked. In other implementations, such testing information is supplied to the aggregation point 150 for storage and/or processing. The modification of the physical layer information does not affect the communications signals S1 passing through the connector assembly 130.

Figure 2:
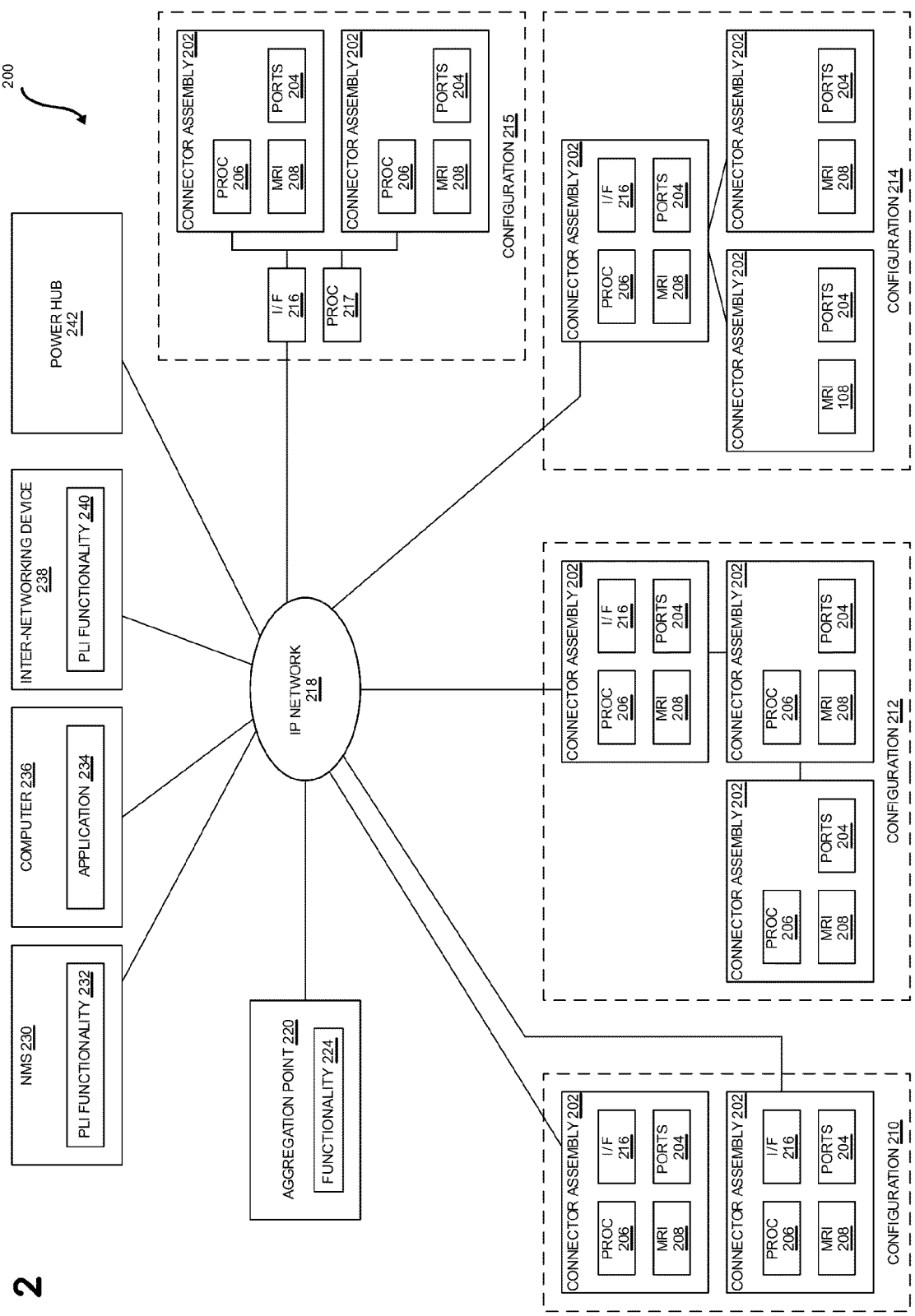
FIG. 2 is a block diagram of one implementation of a communications management system that includes PLI functionality as well as PLM functionality in accordance with aspects of the present disclosure.

FIG. 2 is a block diagram of one example implementation of a communications management system 200 that includes PLI functionality as well as PLM functionality. The management system 200 comprises a plurality of connector assemblies 202. The management system 200 includes one or more connector assemblies 202 connected to an IP network 218. The connector assemblies 202 shown in FIG. 2 illustrate various example implementations of the connector assemblies 130, 130' of FIG. 1.

Each connector assembly 202 includes one or more ports 204, each of which is used to connect two or more segments of physical communication media to one another (e.g., to implement a portion of a logical communication link for communication signals S1 of FIG. 1). At least some of the connector assemblies 202 are designed for use with segments of physical communication media that have physical layer information stored in or on them. The physical layer information is stored in or on the segment of physical communication media in a manner that enables the stored information, when the segment is attached to a port 204, to be read by a programmable processor 206 associated with the connector assembly 202.

Each programmable processor 206 is configured to execute software or firmware that causes the programmable processor

206 to carry out various functions described below. Each programmable processor 206 also includes suitable memory (not shown) that is coupled to the programmable processor 206 for storing program instructions and data. In general, the programmable processor 206 determines if a physical communication media segment is attached to a port 204 with which that processor 206 is associated and, if one is, to read the identifier and attribute information stored in or on the attached physical communication media segment (if the segment includes such information stored therein or thereon) using the associated media reading interface 208.

In some implementations, each of the ports 204 of the connector assemblies 202 comprises a respective media reading interface 208 via which the respective programmable processor 206 is able to determine if a physical communication media segment is attached to that port 204 and, if one is, to read the physical layer information stored in or on the attached segment (if such media information is stored therein or thereon). In other implementations, a single media reading interface 208 may correspond to two or more ports 204. The programmable processor 206 associated with each connector assembly 202 is communicatively coupled to each of the media reading interfaces 208 using a suitable bus or other interconnect (not shown).

In FIG. 2, four example types of connector assembly configurations 210, 212, 214, and 215 are shown. In the first connector assembly configuration 210 shown in FIG. 2, each connector assembly 202 includes its own respective programmable processor 206 and its own respective network interface 216 that is used to communicatively couple that connector assembly 202 to an Internet Protocol (IP) network 218. In some implementations, the ports 204 of the connector assemblies 202 also connect to the IP network 218. In other implementations, however, only the network interfaces 216 couple to the IP network 218.

In the second type of connector assembly configuration 212, a group of connector assemblies 202 are physically located near each other (e.g., in a rack, rack system, or equipment closet). Each of the connector assemblies 202 in the group includes its own respective programmable processor 206. However, in the second connector assembly configuration 212, some of the connector assemblies 202 (referred to here as "interfaced connector assemblies") include their own respective network interfaces 216 while some of the connector assemblies 202 (referred to here as "non-interfaced connector assemblies") do not. The non-interfaced connector assemblies 202 are communicatively coupled to one or more of the interfaced connector assemblies 202 in the group via local connections. In this way, the non-interfaced connector assemblies 202 are communicatively coupled to the IP network 218 via the network interface 216 included in one or more of the interfaced connector assemblies 202 in the group. In the second type of connector assembly configuration 212, the total number of network interfaces 216 used to couple the connector assemblies 202 to the IP network 218 can be reduced. Moreover, in the particular implementation shown in FIG. 2, the non-interfaced connector assemblies 202 are connected to the interfaced connector assembly 202 using a daisy chain topology (though other topologies can be used in other implementations and embodiments).

In the third type of connector assembly configuration 214, a group of connector assemblies 202 are physically located near each other (e.g., within a rack, rack system, or equipment closet). Some of the connector assemblies 202 in the group (also referred to here as "master" connector assemblies 202) include both their own programmable processors 206 and network interfaces 216, while some of the connector assemblies 202 (also referred to here as "slave" connector assemblies 202) do not include their own programmable processors 206 or network interfaces 216. Each of the slave connector assemblies 202 is communicatively coupled to one or more of the master connector assemblies 202 in the group via one or more local connections. The programmable processor 206 in each of the master connector assemblies 202 is able to carry out the PLM functions for both the master connector assembly 202 of which it is a part and any slave connector assemblies 202 to which the master connector assembly 202 is connected via the local connections. As a result, the cost associated with the slave connector assemblies 202 can be reduced. In the particular implementation shown in FIG. 2, the slave connector assemblies 202 are connected to a master connector assembly 202 in a star topology (though other topologies can be used in other implementations and embodiments).

In the fourth type of connector assembly configuration 215, a group of connector assemblies (e.g., distribution modules) 202 are housed within a common chassis or other enclosure. Each of the connector assemblies 202 in the configuration 215 includes their own programmable processors 206. In the context of this configuration 215, the programmable processors 206 in the connector assemblies 202 are "slave" processors 206. Each of the slave programmable processors 206 in the group is communicatively coupled to a common "master" programmable processor 217 (e.g., over a backplane included in the chassis or enclosure). The master programmable processor 217 is coupled to a network interface 216 that is used to communicatively couple the master programmable processor 217 to the IP network 218.

In the fourth configuration 215, each slave programmable processor 206 is configured to manage the media reading interfaces 208 to determine if physical communication media segments are attached to the port 204 and to read the physical layer information stored in or on the attached physical communication media segments (if the attached segments have such information stored therein or thereon). The physical layer information is communicated from the slave programmable processor 206 in each of the connector assemblies 202 in the chassis to the master processor 217. The master processor 217 is configured to handle the processing associated with communicating the physical layer information read from by the slave processors 206 to devices that are coupled to the IP network 218.

In accordance with some aspects, the communications management system 200 includes functionality that enables the physical layer information captured by the connector assemblies 202 to be used by application-layer functionality outside of the traditional physical-layer management application domain. That is, the physical layer information is not retained in a PLM "island" used only for PLM purposes but is instead made available to other applications. For example, in the particular implementation shown in FIG. 2, the management system 200 includes an aggregation point 220 that is communicatively coupled to the connector assemblies 202 via the IP network 218.

The aggregation point 220 includes functionality that obtains physical layer information from the connector assemblies 202 (and other devices) and stores the physical layer information in a data store. The aggregation point 220 can be used to receive physical layer information from various types of connector assemblies 202 that have functionality for automatically reading information stored in or on the segment of physical communication media. Also, the aggregation point 220 and aggregation functionality 224 can be used to receive physical layer information from other types of devices that have functionality for automatically reading information stored in or on the segment of physical communication media. Examples of such devices include end-user devices—such as computers, peripherals (e.g., printers, copiers, storage devices, and scanners), and IP telephones—that include functionality for automatically reading information stored in or on the segment of physical communication media.

The aggregation point 220 also can be used to obtain other types of physical layer information. For example, in this implementation, the aggregation point 220 also obtains information about physical communication media segments that is not otherwise automatically communicated to an aggregation point 220. This information can be provided to the aggregation point 220, for example, by manually entering such information into a file (e.g., a spreadsheet) and then uploading the file to the aggregation point 220 (e.g., using a web browser) in connection with the initial installation of each of the various items. Such information can also, for example, be directly entered using a user interface provided by the aggregation point 220 (e.g., using a web browser).

The aggregation point 220 also includes functionality that provides an interface for external devices or entities to access the physical layer information maintained by the aggregation point 220. This access can include retrieving information from the aggregation point 220 as well as supplying information to the aggregation point 220. In this implementation, the aggregation point 220 is implemented as "middleware" that is able to provide such external devices and entities with transparent and convenient access to the PLI maintained by the access point 220. Because the aggregation point 220 aggregates PLI from the relevant devices on the IP network 218 and provides external devices and entities with access to such PLI, the external devices and entities do not need to individually interact with all of the devices in the IP network 218 that provide PLI, nor do such devices need to have the capacity to respond to requests from such external devices and entities.

For example, as shown in FIG. 2, a network management system (NMS) 230 includes PLI functionality 232 that is configured to retrieve physical layer information from the aggregation point 220 and provide it to the other parts of the NMS 230 for use thereby. The NMS 230 uses the retrieved physical layer information to perform one or more network management functions. In certain implementations, the NMS 230 communicates with the aggregation point 220 over the IP network 218. In other implementations, the NMS 230 may be directly connected to the aggregation point 220.

As shown in FIG. 2, an application 234 executing on a computer 236 also can use the API implemented by the aggregation point 220 to access the PLI information maintained by the aggregation point 220 (e.g., to retrieve such information from the aggregation point 220 and/or to supply such information to the aggregation point 220). The computer 236 is coupled to the IP network 218 and accesses the aggregation point 220 over the IP network 218.

In the example shown in FIG. 2, one or more inter-networking devices 238 used to implement the IP network 218 include physical layer information (PLI) functionality 240. The PLI functionality 240 of the inter-networking device 238 is configured to retrieve physical layer information from the aggregation point 220 and use the retrieved physical layer information to perform one or more inter-networking functions. Examples of inter-networking functions include Layer 1, Layer 2, and Layer 3 (of the OSI model) inter-networking functions such as the routing, switching, repeating, bridging, and grooming of communication traffic that is received at the inter-networking device.

The aggregation point 220 can be implemented on a standalone network node (e.g., a standalone computer running appropriate software) or can be integrated along with other network functionality (e.g., integrated with an element management system or network management system or other network server or network element). Moreover, the functionality of the aggregation point 220 can be distribute across many nodes and devices in the network and/or implemented, for example, in a hierarchical manner (e.g., with many levels of aggregation points). The IP network 218 can include one or more local area networks and/or wide area networks (e.g., the Internet). As a result, the aggregation point 220, NMS 230, and computer 236 need not be located at the same site as each other or at the same site as the connector assemblies 202 or the inter-networking devices 238.

Also, power can be supplied to the connector assemblies 202 using conventional "Power over Ethernet" techniques specified in the IEEE 802.3af standard, which is hereby incorporated herein by reference. In such an implementation, a power hub 242 or other power supplying device (located near or incorporated into an inter-networking device that is coupled to each connector assembly 202) injects DC power onto one or more power cables (e.g., a power wire included in a copper twisted-pair cable) used to connect each connector assembly 202 to the IP network 218. In other implementations, power may be provided using "Power over Ethernet Plug" techniques specified in the IEEE 802.3at standard, which is hereby incorporated herein by reference.

Figure 3:
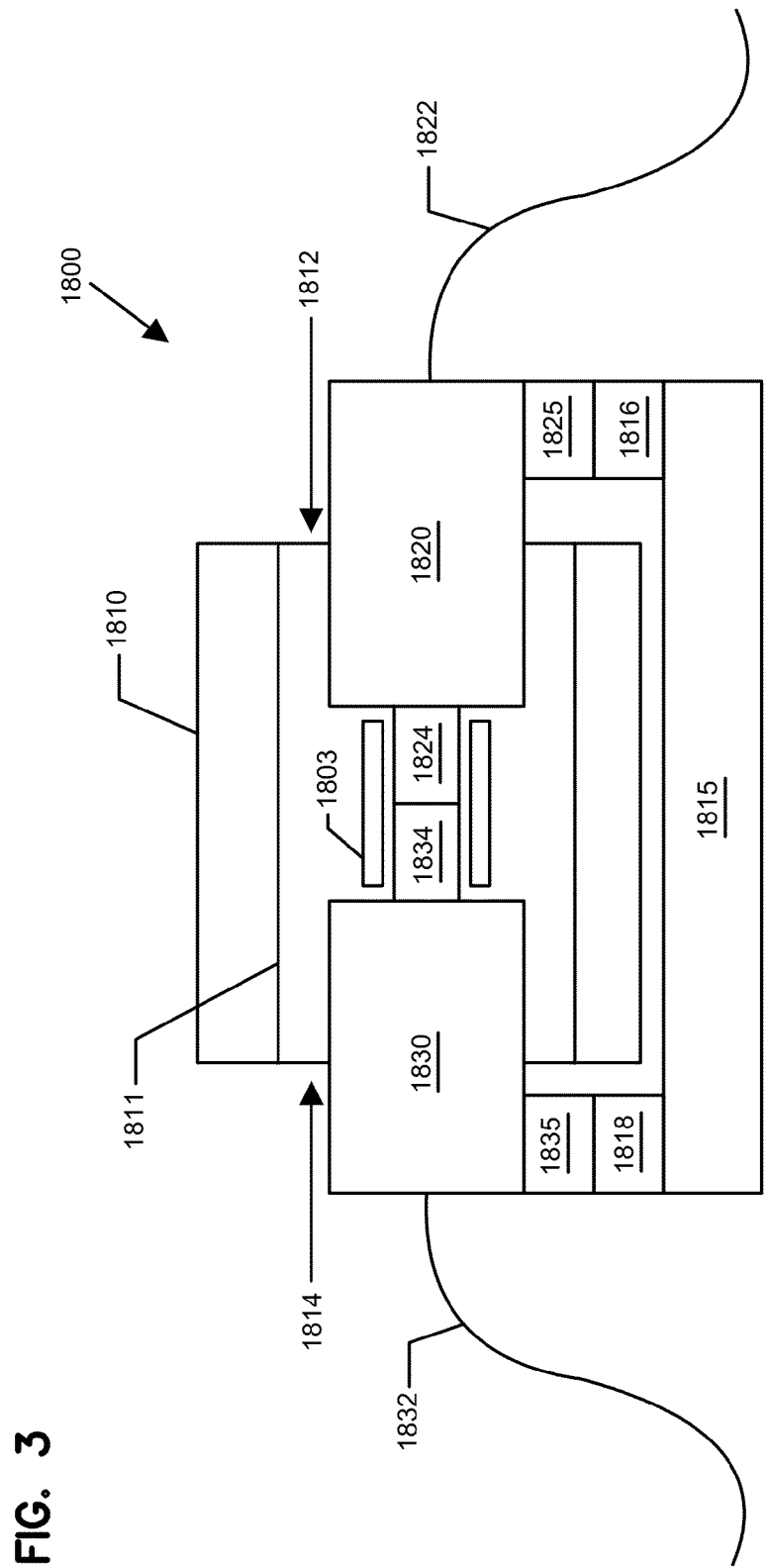
FIG. 3 is a block diagram of one high-level example of a coupler and media reading interface that are suitable for use in the management system of FIG. 2 in accordance with aspects of the present disclosure.

FIG. 3 is a schematic diagram of one example connection system 1800 including a connector assembly 1810 configured to collect physical layer information from at least one segment of physical communications media. The example connector assembly 1810 of FIG. 3 is configured to connect segments of optical physical communications media in a physical layer management system. The connector assembly 1810 includes a fiber optic adapter defining at least one connection opening 1811 having a first port end 1812 and a second port end 1814. A sleeve (e.g., a split sleeve) 1803 is arranged within the connection opening 1811 of the adapter 1810 between the first and second port ends 1812, 1814. Each port end 1812, 1814 is configured to receive a connector arrangement as will be described in more detail herein.

A first example segment of optical physical communication media includes a first optical fiber 1822 terminated by a first connector arrangement 1820. A second example segment of optical physical communication media includes a second optical fiber 1832 terminated by a second connector arrangement 1830. The first connector arrangement 1820 is plugged into the first port end 1812 and the second connector arrangement 1830 is plugged into the second port end 1814. Each fiber connector arrangement 1820, 1830 includes a ferrule 1824, 1834 through which optical signals from the optical fiber 1822, 1832, respectively, pass.

The ferrules 1824, 1834 of the connector arrangements 1820, 1830 are aligned by the sleeve 1803 when the connector arrangements 1820, 1830 are inserted into the connection opening 1811 of the adapter 1810. Aligning the ferrules 1824, 1834 provides optical coupling between the optical fibers 1822, 1832. In some implementations, each segment of optical physical communication media (e.g., each optical fiber 1822, 1832) carries communication signals (e.g., communications signals S1 of FIG. 1). The aligned ferrules 1824, 1834 of the connector arrangements 1820, 1830 create an optical path along which the communication signals (e.g., signals S1 of FIG. 1) may be carried.

In some implementations, the first connector arrangement 1820 may include a storage device 1825 that is configured to store physical layer information (e.g., an identifier and/or attribute information) pertaining to the segment of physical communications media (e.g., the first connector arrangement 1820 and/or the fiber optic cable 1822 terminated thereby). In some implementations, the connector arrangement 1830 also includes a storage device 1835 that is configured to store information (e.g., an identifier and/or attribute information) pertaining to the second connector arrangement 1830 and/or the second optic cable 1832 terminated thereby.

In one implementation, each of the storage devices 1825, 1835 is implemented using an EEPROM (e.g., a PCB surface-mount EEPROM). In other implementations, the storage devices 1825, 1835 are implemented using other non-volatile memory device. Each storage device 1825, 1835 is arranged and configured so that it does not interfere or interact with the communications signals communicated over the media segments 1822, 1832.

In accordance with some aspects, the adapter 1810 is coupled to at least a first media reading interface 1816. In certain implementations, the adapter 1810 also is coupled to at least a second media interface 1818. In some implementations, the adapter 1810 is coupled to multiple media reading interfaces. In certain implementations, the adapter 1810 includes a media reading interface for each port end defined by the adapter 1810. In other implementations, the adapter 1810 includes a media reading interface for each connection opening 1811 defined by the adapter 1810. In still other implementations, the adapter 1810 includes a media reading interface for each connector arrangement that the adapter 1810 is configured to receive. In still other implementations, the adapter 1810 includes a media reading interface for only a portion of the connector arrangement that the adapter 1810 is configured to receive.

In some implementations, at least the first media reading interface 1816 is mounted to a printed circuit board 1815. In the example shown, the first media reading interface 1816 of the printed circuit board 1815 is associated with the first port end 1812 of the adapter 1810. In some implementations, the printed circuit board 1815 also can include the second media reading interface 1818. In one such implementation, the second media reading interface 1818 is associated with the second port end 1814 of the adapter 1810.

The printed circuit board 1815 of the connector assembly 1810 can be communicatively connected to one or more programmable processors (e.g., processors 216 of FIG. 2) and/or to one or more network interfaces (e.g., network interfaces 216 of FIG. 2). The network interface may be configured to send the physical layer information (e.g., see signals S2 of FIG. 1) to a physical layer management network (e.g., see communications network 101 of FIG. 1 or IP network 218 of FIG. 2). In one implementation, one or more such processors and interfaces can be arranged as components on the printed circuit board 1815. In another implementation, one or more such processor and interfaces can be arranged on separate circuit boards that are coupled together. For example, the printed circuit board 1815 can couple to other circuit boards via a card edge type connection, a connector-to-connector type connection, a cable connection, etc.

When the first connector arrangement 1820 is received in the first port end 1812 of the adapter 1810, the first media reading interface 1816 is configured to enable reading (e.g., by the processor) of the information stored in the storage device 1825. The information read from the first connector arrangement 1820 can be transferred through the printed circuit board 1815 to a physical layer management network, e.g., network 101 of FIG. 1, network 218 of FIG. 2, etc. When the second connector arrangement 1830 is received in the second port end 1814 of the adapter 1810, the second media reading interface 1818 is configured to enable reading (e.g., by the processor) of the information stored in the storage device 1835. The information read from the second connector arrangement 1830 can be transferred through the printed circuit board 1815 or another circuit board to the physical layer management network.

In some such implementations, the storage devices 1825, 1835 and the media reading interfaces 1816, 1818 each comprise three (3) leads—a power lead, a ground lead, and a data lead. The three leads of the storage devices 1825, 1835 come into electrical contact with three (3) corresponding leads of the media reading interfaces 1816, 1818 when the corresponding media segment is inserted in the corresponding port. In certain example implementations, a two-line interface is used with a simple charge pump. In still other implementations, additional leads can be provided (e.g., for potential future applications). Accordingly, the storage devices 1825, 1835 and the media reading interfaces 1816, 1818 may each include four (4) leads, five (5) leads, six (6) leads, etc.

Figure 8:
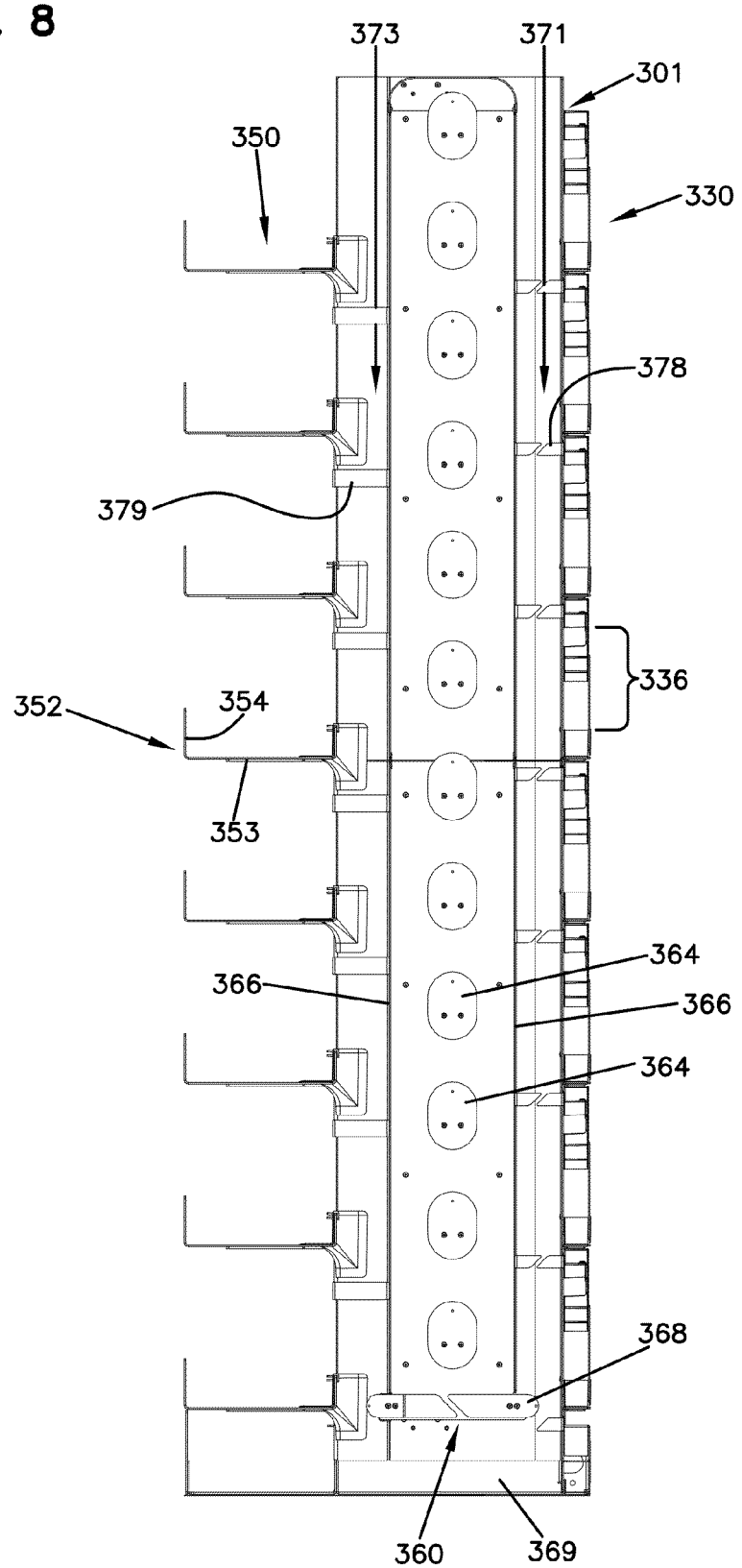

FIGS. 4-8 show one example rack system 300 on which one or more connector assemblies (e.g., distribution modules 400 of FIGS. 9-10) can be mounted. The example rack system 300 includes a rack 301 having a front 302 (FIG. 4), a rear 303 (FIG. 5), a top 304 (FIG. 6), a bottom 305, a first side 306 (FIG. 7), and a second side 307 (FIG. 8).

In certain implementations, the rack system 300 may include two or more adjacent racks 301. For example, two or more racks 301 may be arranged in a row with the first side 306 of one rack 301 being located adjacent the second side 307 of another rack 301. In some implementations, an end cover may be attached to a rack 301 at one or both ends of the row to protect the exposed sides of the rack 301. For example, an end cover having a U-shaped transverse cross-section may extend from the bottom of the rack 301 to the top of the rack 301 across the exposed side 306, 307 of the rack 301.

Figure 6:
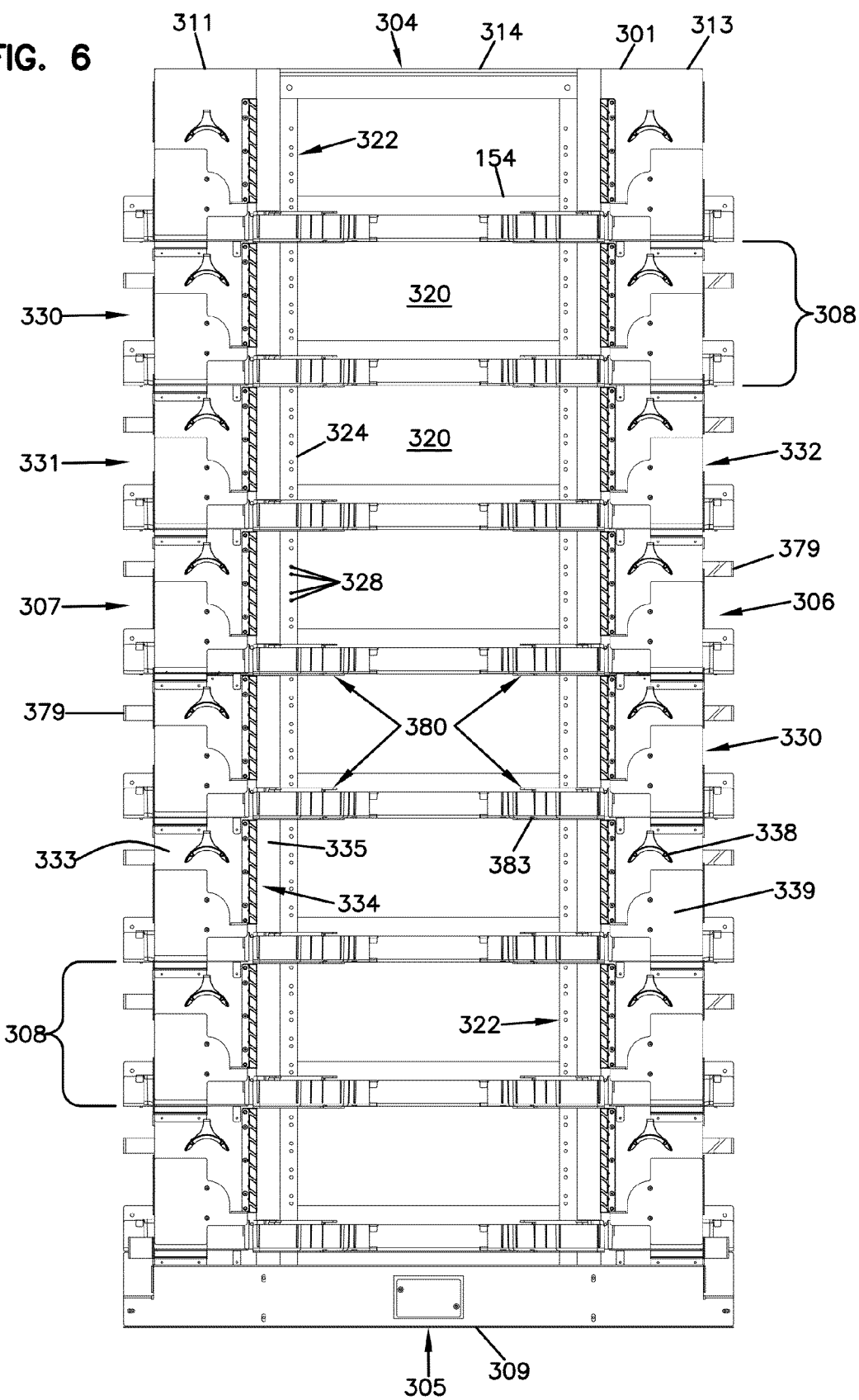
FIG. 6 is a front view of the example rack of FIG. 4 in accordance with the principles of the present disclosure.
Figure 7:
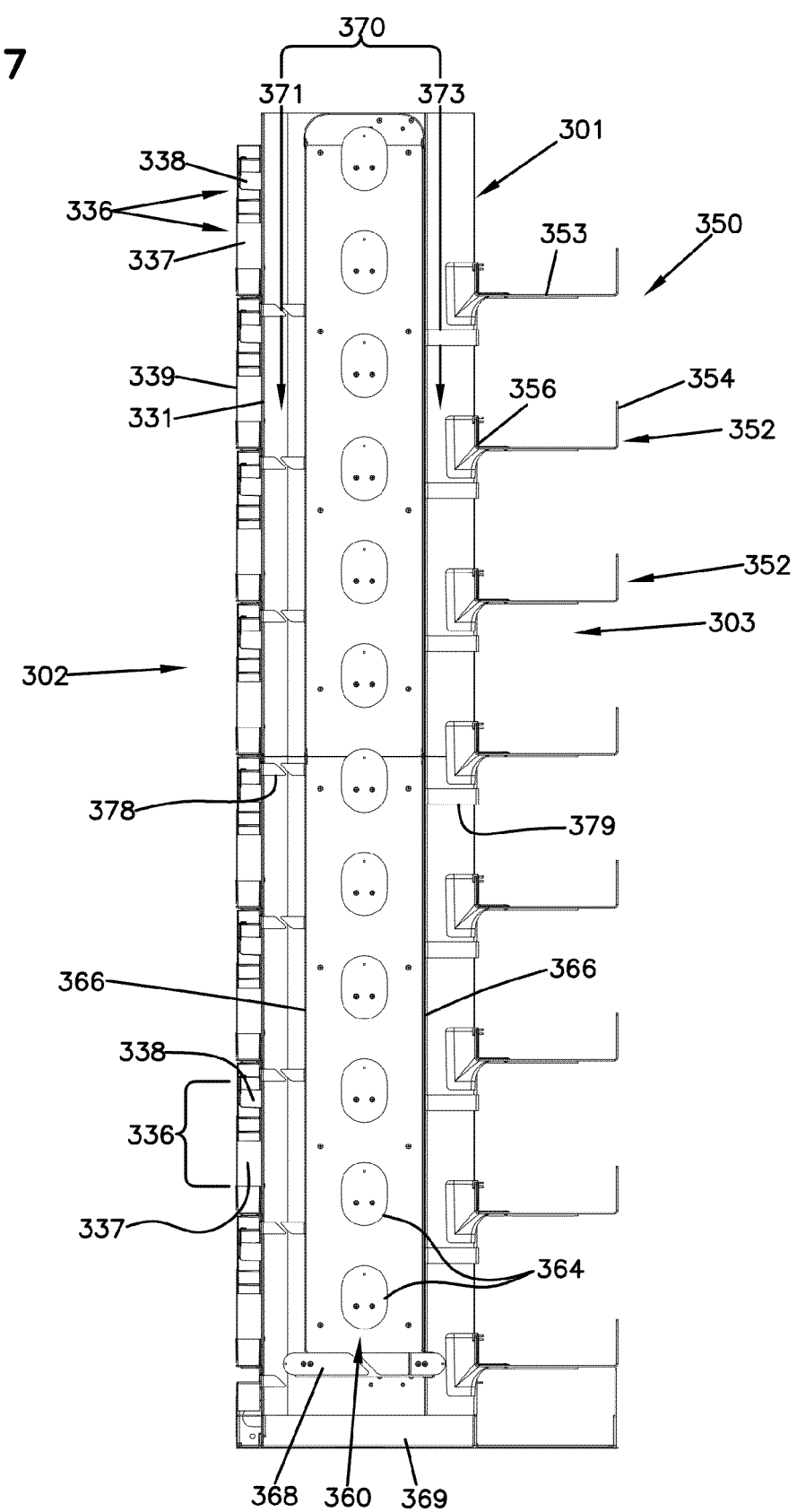
FIGS. 7 and 8 are side elevational views of the example rack of FIG. 4 in accordance with the principles of the present disclosure.

Each rack 301 defines one or more distribution sections 308 (FIG. 6). Each distribution section 308 includes a mounting area 320 at which one or more distribution modules 400 can be installed. Each distribution module 400 includes a plurality of front ports 422 coupled to at least one rear port 424 (e.g., see FIG. 10). In the example shown, the distribution module 400 includes a chassis housing 410 in which one or more coupler modules 420 are installed. Each coupler module 420 includes at least a first set of couplers 421 (FIG. 10) that define the front cable ports 422.

Patch cables 510 are routed between distribution modules 400 on the racks 301. For example, a first terminated end 512 (e.g., see FIG. 23) of each patch cable 510 may be plugged into a first front port 422 of a distribution module 400 and a second terminated end 514 (e.g., see FIG. 23) of each patch cable 510 may be plugged into a second front port 422 of the same or a different distribution module 400. Each distribution section 308 of the rack 301 is associated with one or more cable management sections 330 (FIG. 4) for managing the patch cables 510, one or more travel sections 350 (FIG. 5) along which the patch cables 510 can be routed within and/or between racks 301, and one or more tracks 380 (FIGS. 17, 24, and 25) along which the patch cables 510 can be routed between the management sections 330 and the travel sections 350.

Distribution cables 520 are routed (e.g., via cable raceways) between the distribution modules 400 and a communications network (e.g., communications network 101 of FIG. 1 and/or IP network 218 of FIG. 2). For example, a terminated end 522 of each distribution cable 520 may be plugged into a rear port 424 of the distribution module 400

Figure 22:
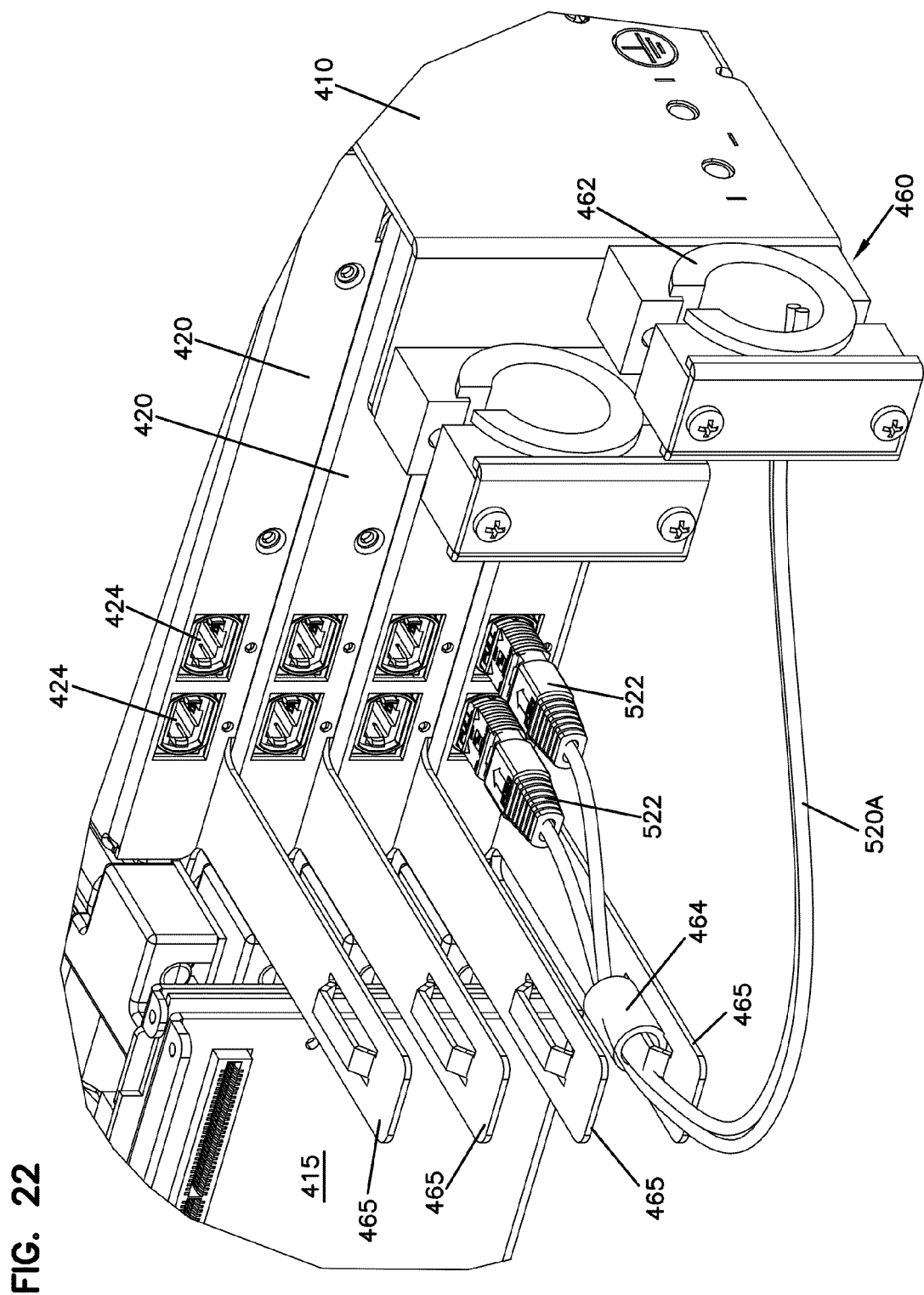
FIG. 22 is an enlarged view of a portion of the distribution module shown in FIG. 21 with two distribution cables plugged into a rear of the distribution modules.

(e.g., see FIG. 22). The opposite ends of the distribution cables 520 couple (e.g., via connectors, optical splices, etc.) with components of the communications network. The racks 301 include one or more vertical cable guides/channels 374 (FIGS. 18 and 20) along which the distribution cables 520 may be routed between the distribution modules 400 and the cable raceways or other routing structures.

PLI cables (e.g., power and/or data cables) 530 also may be routed (e.g., via cable raceways) between the distribution modules 400 and a data network (e.g., communications network 101 of FIG. 1 and/or IP network 218 of FIG. 2). For example, a terminated end 532 of each PLI cable 530 may be plugged into a PLI port 428 of the distribution module 400 (e.g., see FIG. 28). The opposite ends of the PLI cables 530 couple (e.g., via connectors, optical splices, etc.) with components of the data network. In certain implementations, the data network shares at least some components with the communications network. In certain implementations, the racks 301 also include additional vertical cable guides/channels 375 (FIGS. 18 and 20) along which the PLI cables 530 may be routed between the distribution modules 400 and the cable raceways or other routing structures.

In some implementations, grounding cables also may be routed (e.g., via cable raceways) to the distribution modules 400. For example, an end of each grounding cable may be connected to a grounding plate or grounding port of the distribution module 400 (e.g., see FIGS. 10 and 19). The opposite ends of the grounding cables may be routed to a grounding bar (e.g., located at the top of the rack 301). In some implementations, the grounding cables are routed from the grounding bar through the additional vertical cable guides/channels 375 (FIGS. 18 and 20), to the distribution modules 400. In certain implementations, the a group of PLI cables are routed down a first of the additional vertical cable channels 375 and a group of grounding cables are routed down a second of the additional vertical cable channels 375.

Figure 4:
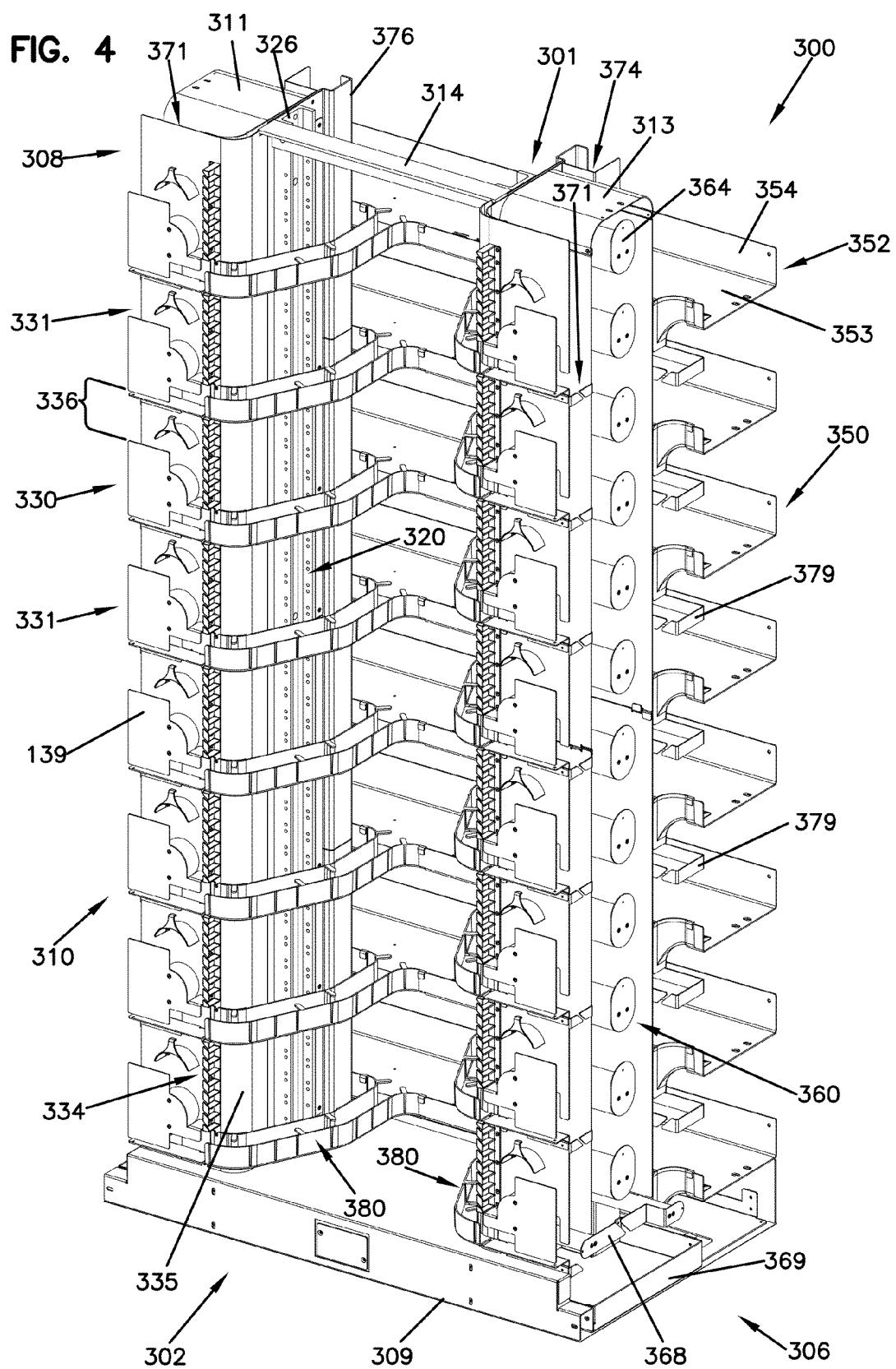
FIG. 4 is a front, perspective view of an example rack suitable for use in a rack system configured in accordance with the principles of the present disclosure.

The bottom 305 of the rack 301 includes a base 309 (FIG. 4). In some implementations, the base 309 is configured to be secured to the ground (e.g., using bolts, screws, rivets, or other fasteners). In certain implementations, the base 309 is configured to receive distribution cables 520 and/or PLI cables 530 from one or more cable raceways (e.g., floor-level or below-ground raceways) or other routing structures. For example, the base 309 may include cut-outs or openings through which the distribution cables 520 and/or PLI cables 530 can be routed up to guides/channels 374, 375 at the rear 303 of the rack 301 as will be described in more detail herein.

Figure 5:
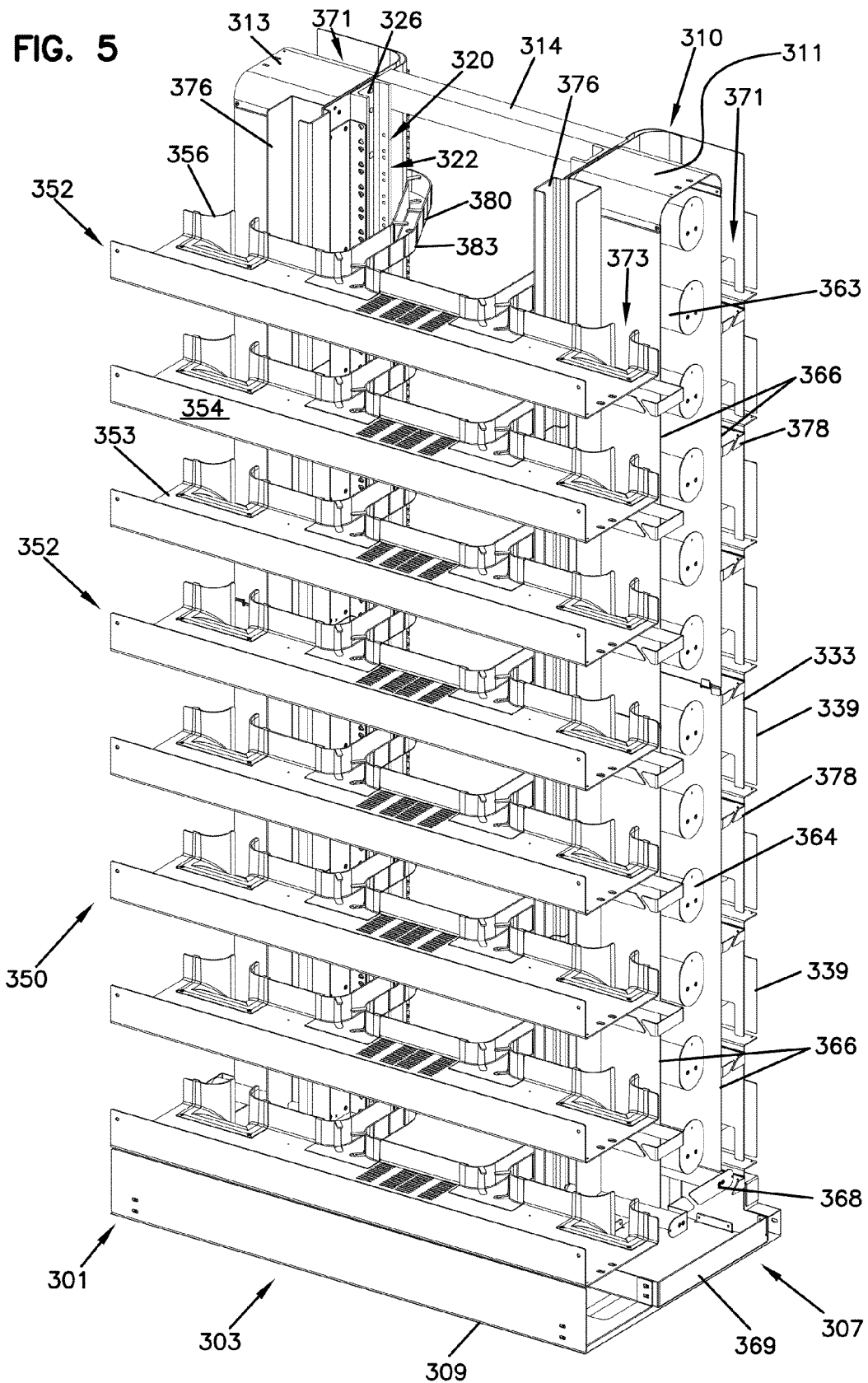
FIG. 5 is a rear, perspective view of the example rack of FIG. 4 in accordance with the principles of the present disclosure.

The rack 301 also includes a frame construction 310 extending upwardly from the base 309 (FIGS. 4 and 5). Certain types of frame constructions 310 may be configured to receive distribution cables 520 and/or PLI cables 530 transitioned from overhead cable raceways or other routing structures. The frame construction 310 of the rack 301 defines and/or supports the mounting areas 320 (FIG. 6), the cable management sections 330 (FIG. 4), the travel sections 350 (FIG. 5), and at least one storage section 360 (FIGS. 7 and 8) at which slack length of the patch cables 510 can be stored. In the example shown, the frame construction includes a first tower 311 and a second tower 313 interconnected by at least one bracing member 314 (FIG. 4).

In some implementations, one or more of the distribution cables 520 and/or PLI cables 530 are routed to the rack 301 along raceways. In some implementations, the cables are routed along overhead raceways connected to a top 304 of the rack 301. In other implementations, the cables are routed along floor-level or below-ground raceways connected to the bottom 305 of the rack 301. Such raceways facilitate routing cables within a building. For example, the raceways may form a passageway or channel along which cables may be routed to the rack 301 from a point of entry into the building. In some implementations, the raceways include U-shaped troughs along which cables can be routed. In other implementations, the raceways include enclosed tubes or covered troughs through which the cables are routed.

In some implementations, the travel section 350 is located at the rear 303 of the rack 301 (see FIG. 5). In the example shown, the travel section 350 includes one or more troughs 352 extending across the rear 303 of the rack 301 (e.g., between the first and second towers 311, 313). At least one of the sides 306, 307 of the rack 301 provides a cable slack storage area 360. In certain implementations, both sides 306, 307 of the rack 301 provide slack storage areas 360. For example, a side of each tower 311, 313 may define a storage section 360. In other implementations, however, the travel and storage sections 350, 360, respectively, may be located on any desired side of the rack 301.

Figure 17:
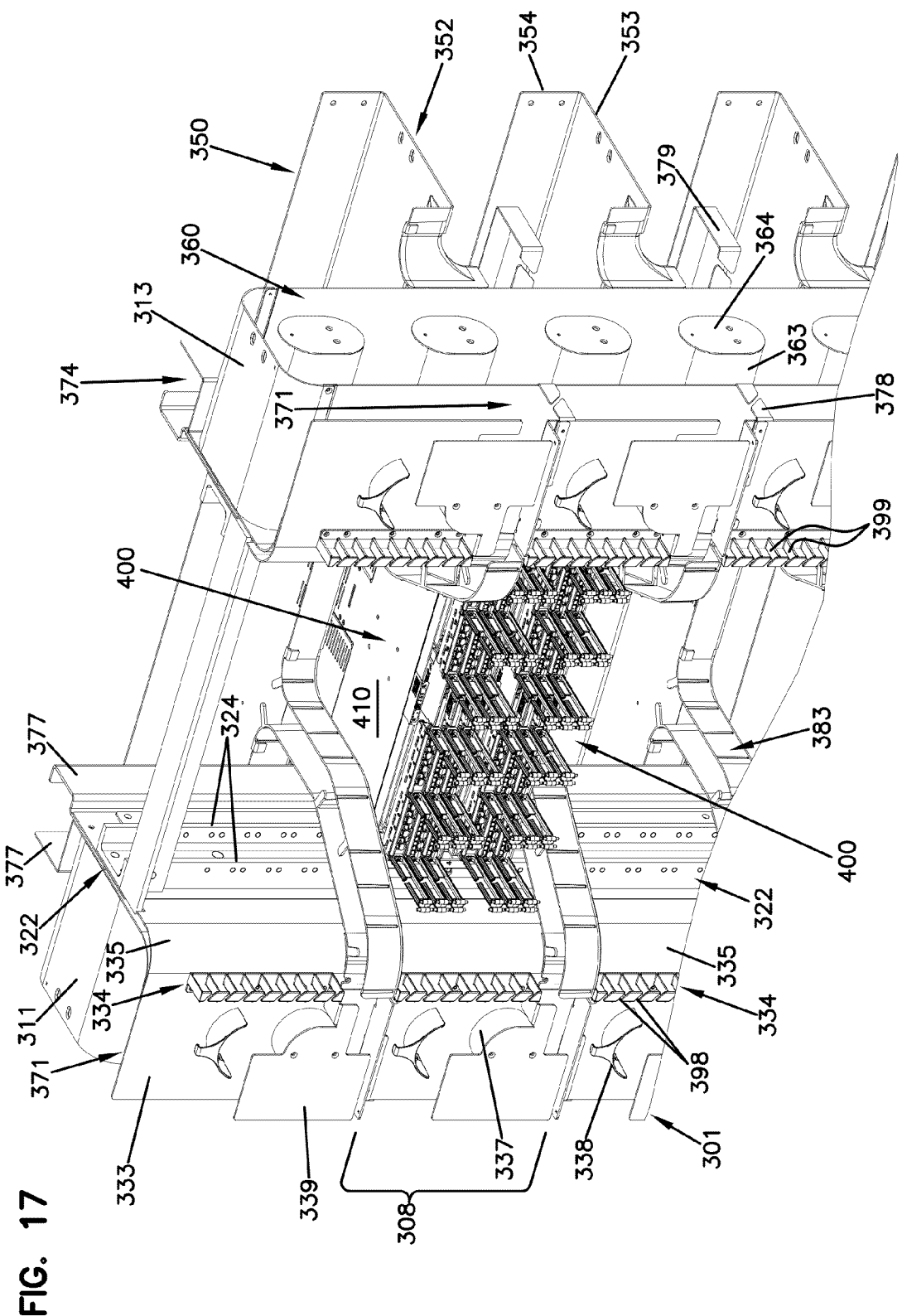
FIG. 17 is a front, perspective view of a top of the rack of FIG. 16 with the two distribution modules visible.

The mounting areas 320 of the rack 301 are configured to position the distribution modules 400 so that the front ports 422 of the distribution modules 400 are accessible from the front 302 of the rack 301 (e.g., see FIG. 17). The management sections 330 are provided at the front 302 of the rack 301. For example, in one implementation, the mounting areas 320 are provided between the towers 311, 313 (FIG. 4) and the management sections 330 are provided at the fronts of the towers 311, 313. In certain implementations, the rear ports 424 of the distribution modules 400 are accessible from the rear 303 of the rack 301 (e.g., see FIGS. 21-22).

Figure 9:
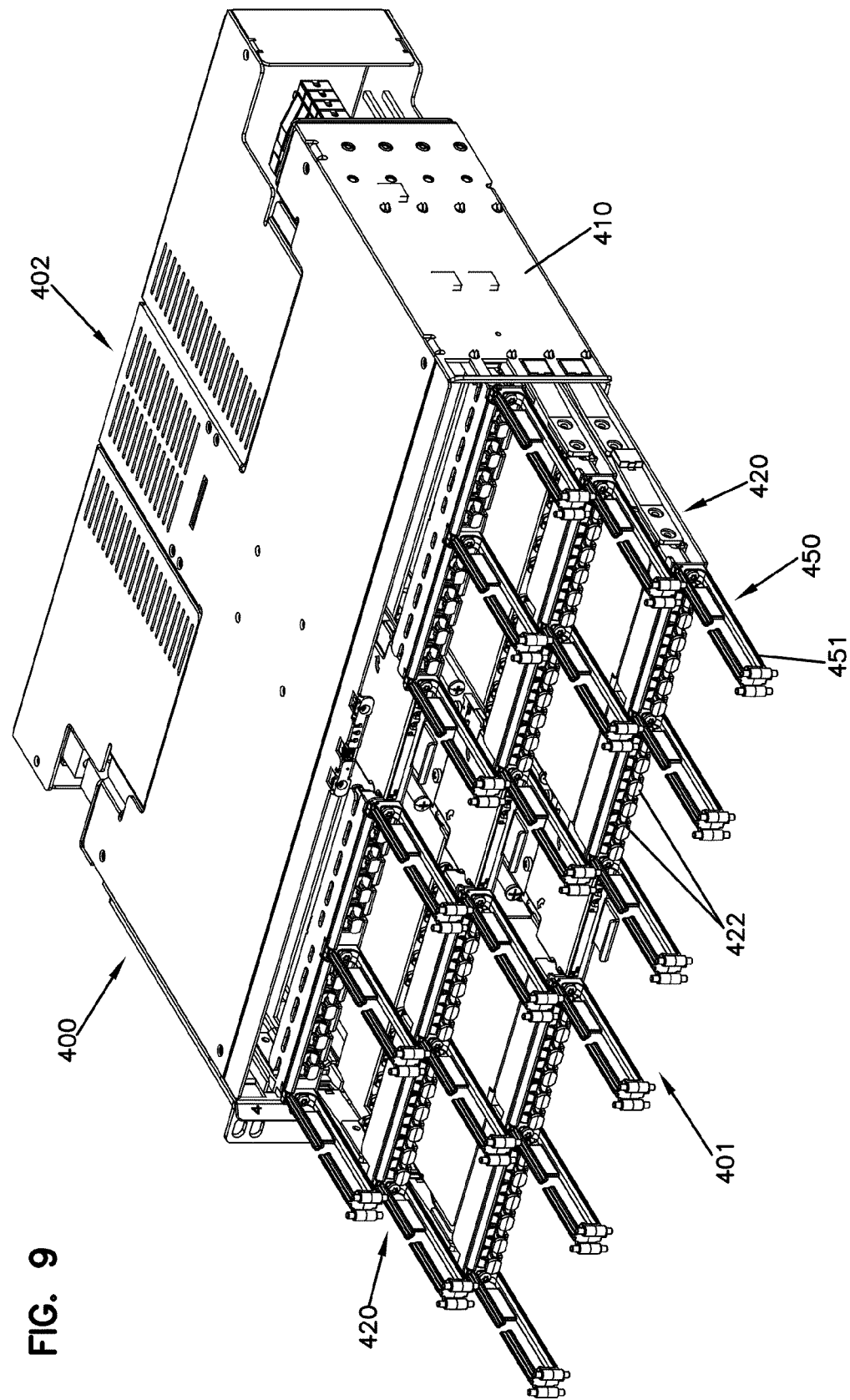
FIG. 9 is a front, perspective view of an example distribution module suitable for mounting to the rack of FIGS. 4-8.

Referring to FIGS. 9-15, each distribution module 400 mounted to the rack 301 includes a first side 401 that is accessible from the front 302 of the rack 301 and a second side 402 that is accessible from the rear 303 of the rack 301 (FIG. 9). One or more cables 500 can be routed to ports of the distribution modules 400 to connect the distribution modules 400 to other distribution modules 400, to a communications network (e.g., communications network 101 of FIG. 1 or IP network 218 of FIG. 2), and/or to a data network (e.g., IP network 218 of FIG. 2 or communications network 101 of FIG. 1).

Each distribution module 400 is configured to couple together (e.g., electrically couple, optically couple, etc.) one or more distribution cables 520 with two or more patch cables 510. In certain implementations, each of the distribution modules 400 includes one or more front cable ports 422 at the first side 401 to receive patch cables 510 and one or more rear cable ports 424 to receive distribution cables 520. In some implementations, a first set of couplers 421 also defines the rear ports 424 of the distribution modules 400. For example, in certain implementations, distribution cables 520 can be routed within the distribution modules 400 from the second sides 402 of the distribution modules 400 to rear ports 424 defined by the first set of couplers 421 to form an optical path between the distribution cables 520 and the patch cables 510.

Figure 10:
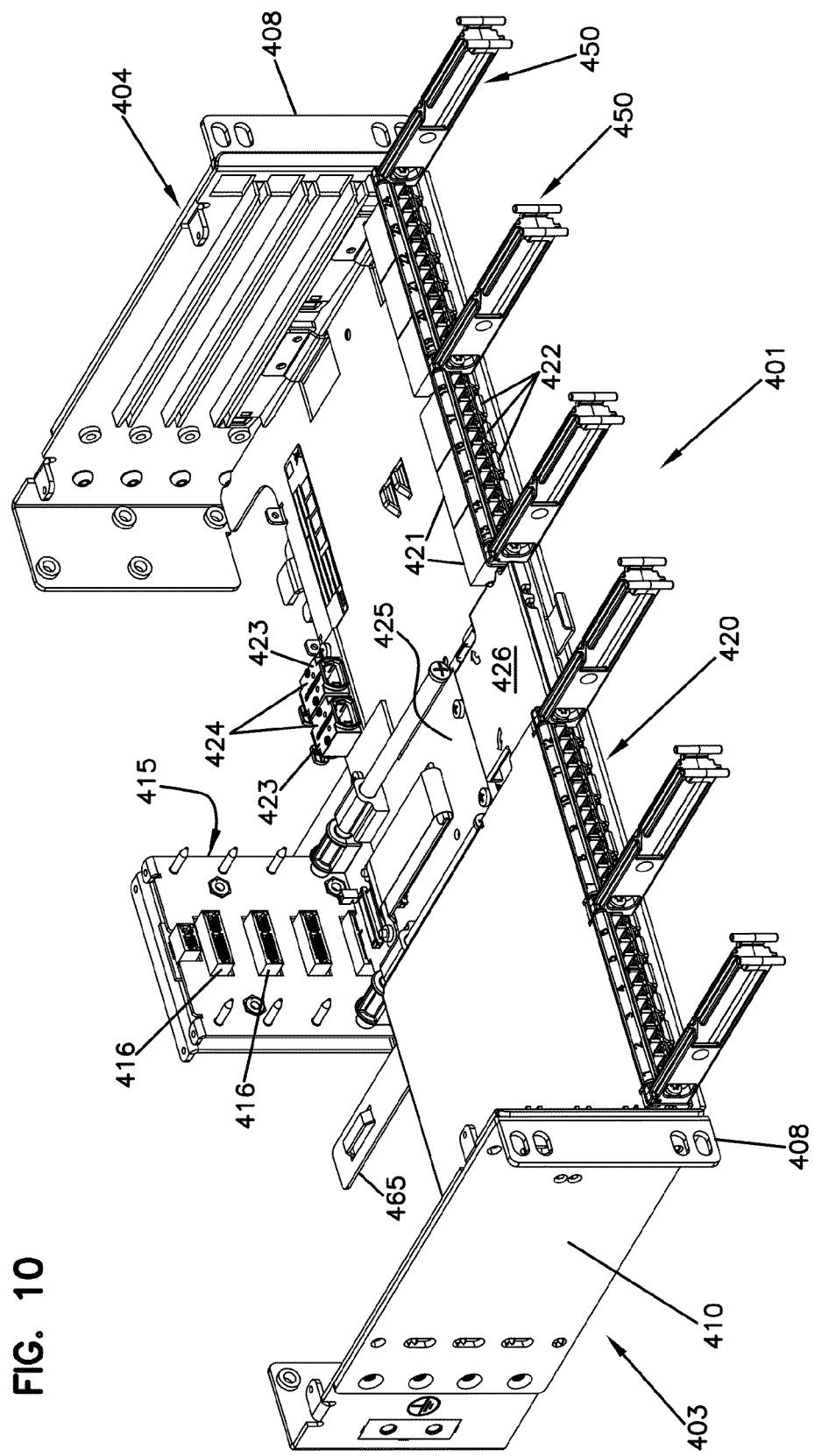
FIG. 10 is a front, perspective view of the example distribution module of FIG. 9 with portions of the chassis housing and some of the coupler modules removed for ease in viewing the backplane of the distribution module.
Figure 11:
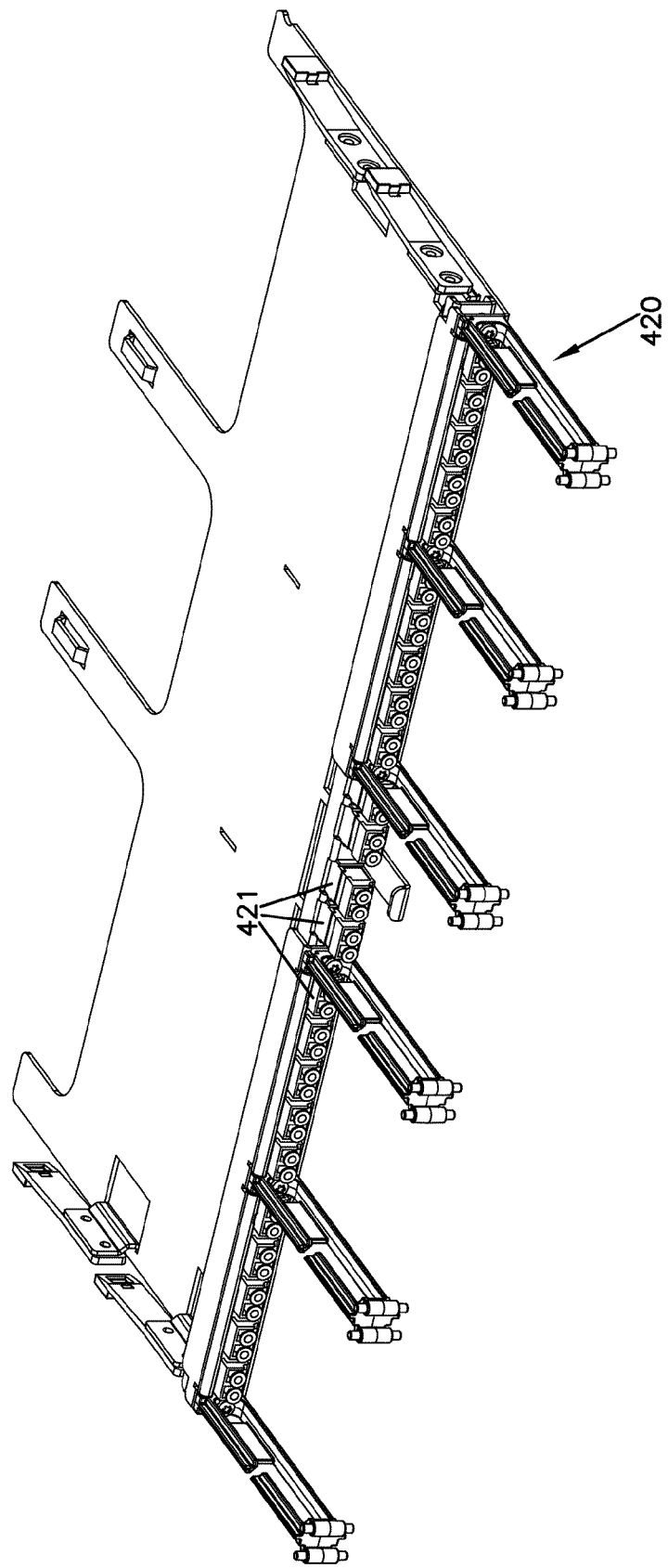
FIG. 11 is a front, perspective view of an example passive coupler module.

In other implementations, however, certain types of distribution modules 400 may include a second set of couplers 423 located at the second side 402 of the distribution module 400 (see FIG. 10). The couplers 423 of the second set are communicatively coupled to the couplers 421 of the first set (e.g., using a hydra cable or other connection cable). For example, in some implementations, distribution cables 520 can be routed to the rear ports 424 of the second set of couplers 423 to form an optical path between the distribution cables 520 and the patch cables 510 plugged into the front ports 422 of the first set of couplers 421.

In accordance with some aspects, one or more of the distribution modules 400 may be "smart" distribution modules. As the term is used herein, a "smart" distribution module is a distribution module having PLI functionality. In some implementations, a smart distribution module 400 may include a chassis having a backplane 415 configured to connect to a data network. In such implementations, one or more PLI cable ports 428 are provided at the distribution modules 400 to receive the PLI cables 530. For example, a chassis processor 430 (FIG. 28), which is connected to the backplane 415, may be define PLI cable ports 428 for one or more PLI cables 530.

One or more of the coupler modules 420 received at the distribution module 400 may be "smart" coupler modules. As the term is used herein, a smart coupler module is a coupler module having PLI functionality. Certain types of smart coupler modules include a circuit board arrangement 425, a processor 426, and one or more "smart" couplers. A "smart" coupler is a coupler having at least one media reading interface configured to read physical layer information stored on or in one or more physical media segments received at the coupler. The processor 426 may manage the media reading interfaces via the circuit board arrangement 425. The circuit board arrangement 425 of each coupler module is configured to connect the processor 426 to the backplane 415 of the distribution module 400. In some implementations, all of the couplers 421, 423 include media reading interfaces. In other implementations, only the front couplers 421 or only the rear couplers 423 include media reading interfaces.

A "smart" distribution module 400 may include memory in which physical layer information pertaining to the distribution module 400 can be stored. For example, the memory may be provided on the chassis processor 430. Non-limiting examples of physical layer information pertaining to a distribution module 400 include an indication of the size of the distribution module 400 (e.g., 1 RU, 2 RU, 3 RU, etc.), a part number, a model number, a catalogue number, a date of manufacture, an indication of the number of coupler modules 420 that the distribution module 400 is configured to receive.

A "smart" coupler module 420 may include memory in which physical layer information pertaining to the coupler module 420 can be stored. For example, the memory may be provided on the processor 426. Non-limiting examples of physical layer information pertaining to a coupler module 420 include a part number, a model number, a catalogue number, a date of manufacture, a number of available ports, an insertion count for the front couplers 421 (or ports thereof), an insertion count for the rear couplers 423 (or ports thereof), and an indication of whether the coupler module or ports thereon are configured to single mode or multi-mode.

In accordance with other aspects, one or more of the coupler modules 420 positioned at the distribution module 400 may be "passive" coupler modules. As the term is used herein, a "passive" coupler module is a coupler module that does not have PLI functionality. For example, in some implementations, a passive coupler module may have one or more "passive" couplers that do not include media reading interfaces. In certain implementations, the passive coupler module does not have a circuit board arrangement or a processor (see FIG. 11).

In accordance with some aspects, a passive coupler module may be installed at a smart distribution module 400. For example, the passive coupler module may have the same or similar dimensions of the smart coupler module to enable the passive coupler module to fit within the smart distribution module 400. In other implementations, the passive coupler module may be installed at a "passive" distribution module 400. As the term is used herein, a "passive" distribution module 400 is a distribution module that does not include a backplane or a chassis processor. In certain implementations, a smart coupler module may be installed at the passive distribution module.

Figure 12:
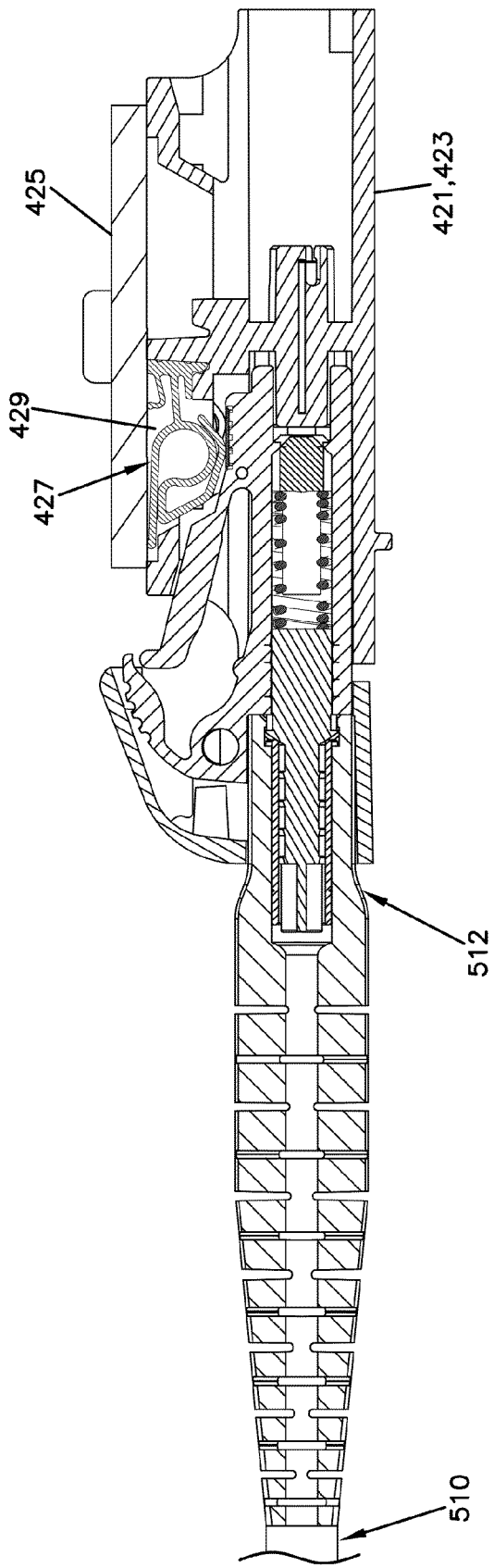
FIG. 12 is a cross-sectional view of an example implementation of a smart coupler configured to optically couple together LC-type optical connectors.
Figure 13:
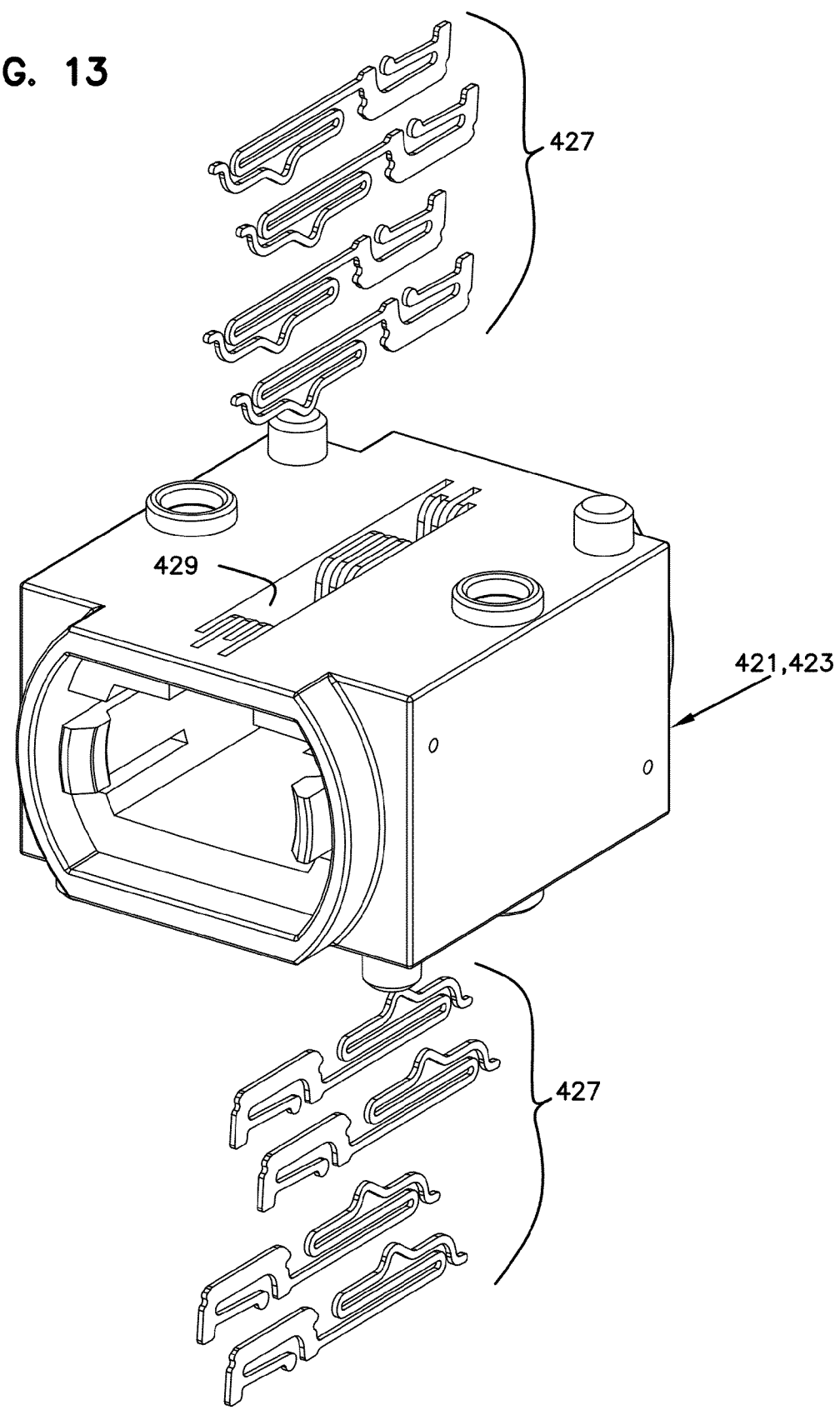
FIG. 13 is an exploded view of an example implementation of a smart coupler configured to optically couple together MPO-type optical connectors.

FIGS. 12 and 13 illustrate some example implementations of smart couplers (e.g., couplers 421 and/or 423). FIG. 12 is a cross-sectional view of a coupler 421, 423 configured to optically couple together LC-type optical connectors. FIG. 13 is an exploded view of a coupler 421, 423 configured to optically couple together MPO-type optical connectors. Each smart coupler 421, 423 includes one or more media reading interfaces 427. For example, the smart couplers 421, 423 may include the media reading interfaces 427 within one or more through-openings 429 leading from an exterior of the coupler 421, 423 to a through-passage of the coupler 421, 423 (e.g., see FIG. 12).

Figure 14:
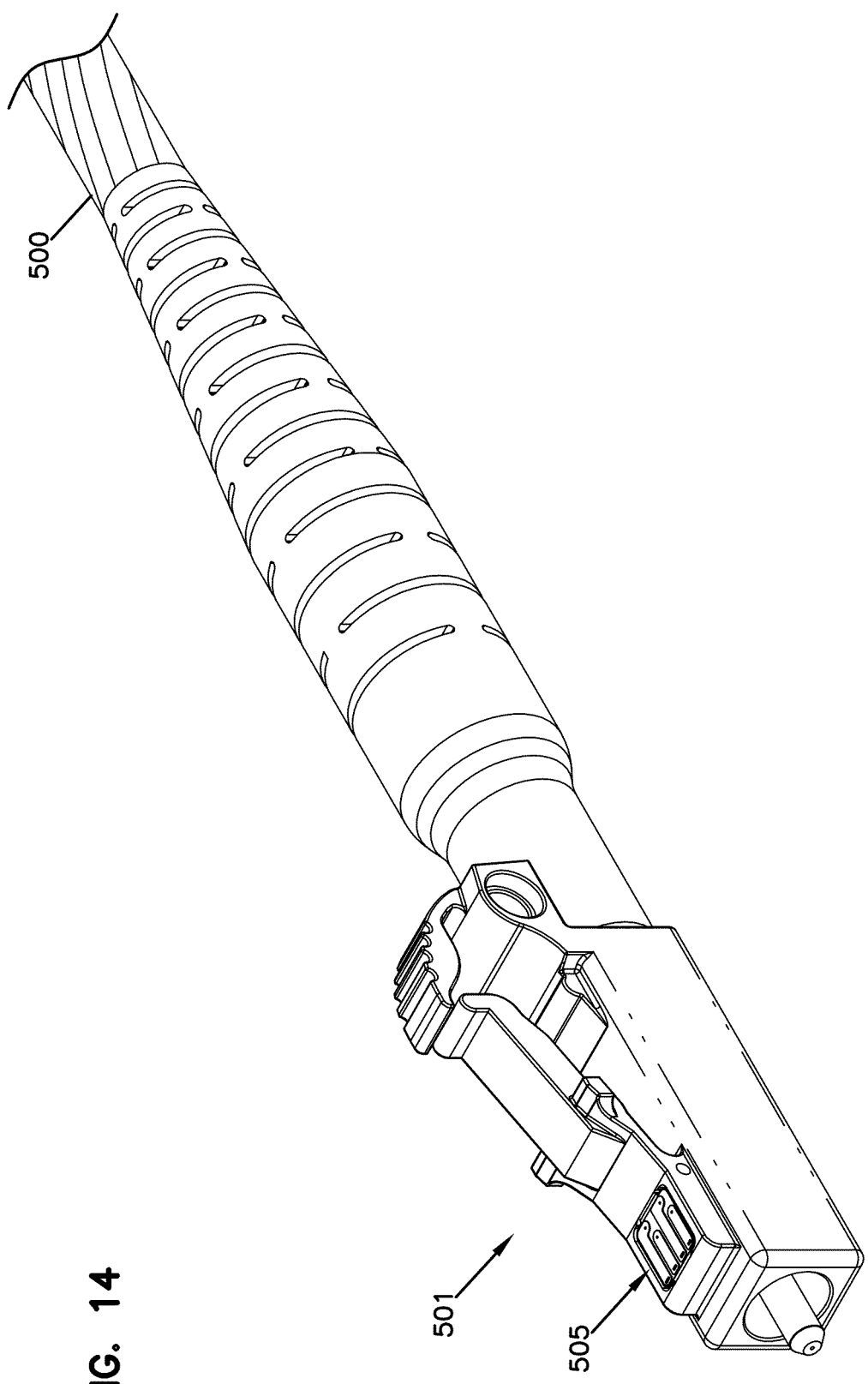
FIG. 14 illustrates an example "smart" media segment implemented as an LC-type optical connector.
Figure 15:
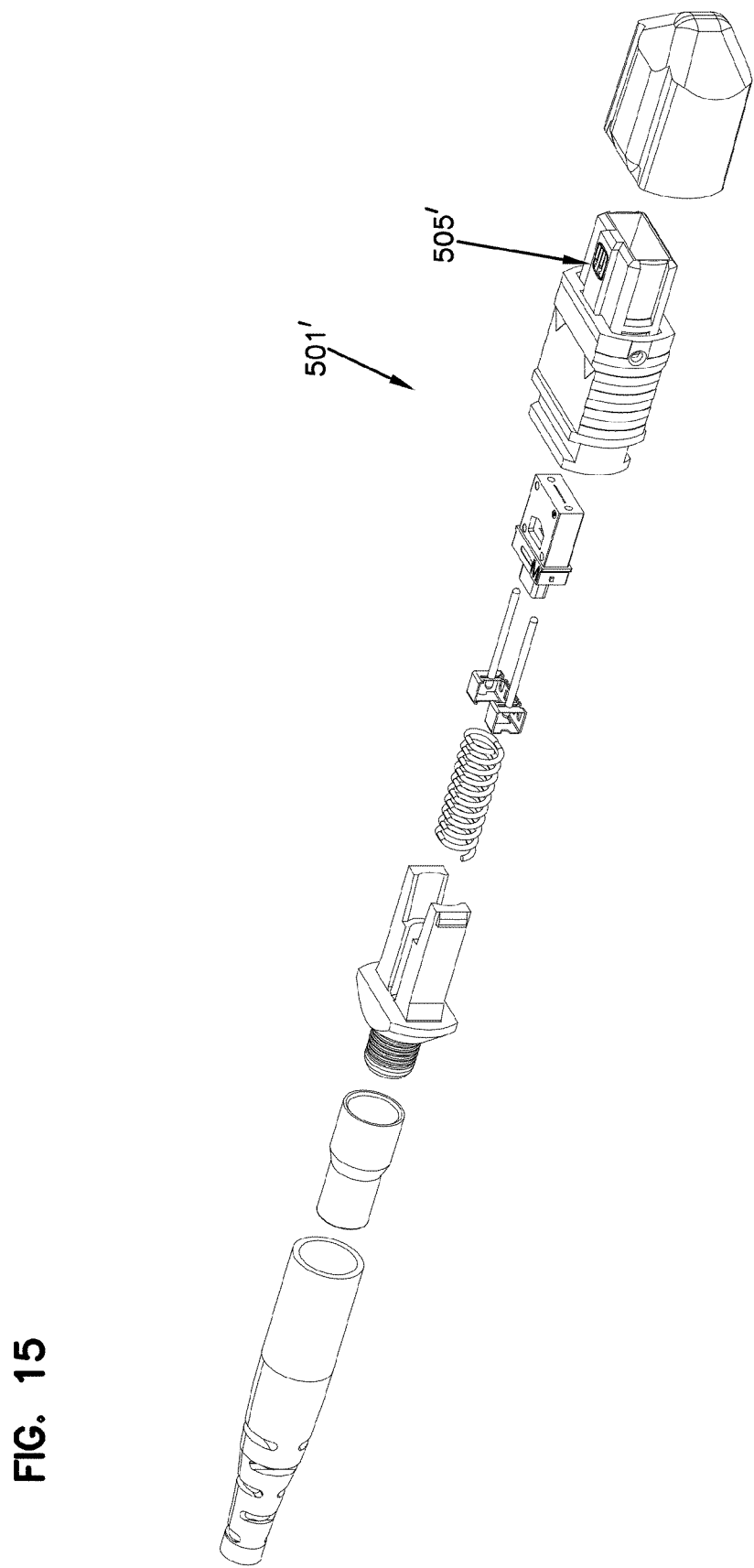
FIG. 15 illustrates an example "smart" media segment implemented as an MPO-type optical connector.

FIGS. 14 and 15 illustrate some example implementations of "smart" media segments 500. As the term is used herein, a "smart" media segment 500 is a media segment having a storage device configured to store physical layer information. FIG. 14 is a perspective view of an example LC-type optical connector 501 having a storage device 505. FIG. 15 is an exploded view of an example MPO-type optical connector 501' having a storage device 505'. In the examples shown, the storage devices 505, 505' are positioned at keys of the connectors 501, 501'.

The media reading interfaces 427 of the smart couplers 421, 423 are coupled to the circuit board arrangement 425 of the smart coupler module 420. In some implementations, each media reading interface 427 determines whether a connectorized end of a media segment 500 has been received at a port of the smart coupler 421, 423. In certain implementations, each media reading interface 427 may act as a switch to complete or break an electrical connection when a media segment is received at the coupler. For example, insertion of a fiber optic connector 501, 501' into one of the couplers 421, 423 may flex a portion of the media reading interface 427 through the opening 429 towards the circuit board 426.

In some implementations, each media reading interface 427 of a smart coupler 421, 423 forms an electrical connection between the storage device 505, 505' of the received connector 501, 501' and the circuit board arrangement 425 of the coupler module 420 (see FIG. 12). By connecting the storage device 505, 505' to the circuit board arrangement 425, the media reading interface 426 enables the processor 426 of each coupler module 420 to read and/or write data to and/or from the storage device 505, 505'.

Some example types of smart couplers 421, 423 are disclosed in more detail in U.S. Provisional Application No. 61/303,961, filed Feb. 12, 2010, titled "Fiber Plugs and Adapters for Managed Connectivity," U.S. Provisional Application No. 61/413,828, filed Nov. 15, 2010, titled "Fiber Plugs and Adapters for Managed Connectivity," U.S. Provisional Application No. 61/437,504, filed Jan. 28, 2011, titled "Fiber Plugs and Adapters for Managed Connectivity," and U.S. application Ser. No. 13/025,841, filed Feb. 11, 2011, titled "Managed Fiber Connectivity Systems," the disclosures of which are hereby incorporated herein by reference in their entirety.

Additional details pertaining to some example types of coupler modules 420 are disclosed in U.S. Provisional Application No. 61/303,948, filed Feb. 12, 2010, titled "Bladed Communications System," U.S. Provisional Application No. 61/413,844, filed Nov. 15, 2010, titled "Communications Bladed Panel Systems," U.S. Provisional Application No. 61/439,693, filed Feb. 4, 2011, titled "Communications Bladed Panel Systems," and U.S. application Ser. No. 13/025, 750, filed Feb. 11, 2011, titled "Communications Bladed Panel Systems," the disclosures of which are hereby incorporated herein by reference in their entirety.

Certain types of chassis housings 410 may include a back plane 415 to which the coupler modules 420 may be communicatively (e.g., electrically) coupled (see FIG. 10). In some implementations, the back plane 415 includes a connector port 416 for each coupler module 420. In the example shown, each coupler module 420 includes at least one printed circuit board 425 that connects to the connector port 416 using a card-edge connection. In other implementations, the circuit board 425 of each coupler module 420 can connect to the respective port 416 using a connectorized cable or other type of connectors.

In some implementations, the coupler modules 420 also include a processor 426. For example, as discussed above with respect to FIG. 2, the processor 426 of each coupler module 420 may be a slave processor that connects to a master processor 430 (FIG. 28) through the back plane 415. In some implementations, one master processor 430 controls multiple slave processors 426. In certain implementations, one master processor 430 is installed on the backplane 415 and controls the slave processor 426 of each coupler module 420 of the distribution module 400. In other implementations, one master processor 430 may control the slave processors 426 of multiple distribution modules 400. In still other implementations, each distribution module 400 may be associated with multiple master processors 430. In still other implementations, each coupler module 420 has an independent processor 426.

In accordance with some implementations, the coupler modules 420 are slideably mounted to the chassis 410. For example, in some implementations, the coupler modules 420 can be moved between a retracted position and at least a first extended position. The coupler module 420 is housed within the chassis 410 when in the retracted position. At least a portion of the coupler module 420 extends from the front of the chassis 410 when in the first extended position. For example, the coupler module 420 may be moved to the first extended position to facilitate insertion and/or removal of a connectorized end 512, 514, 522 of one or more cables 510, 520 at the ports 422, 424 of the coupler module 420.

In certain implementations, the coupler modules 420 also can move to a second extended position in which more of the coupler modules 420 extend from the chassis 410 as compared to the first extended position (e.g., compare the three coupler modules 420 of FIG. 9). In some implementations, the coupler modules 420 remain connected to the backplane 415 when moved between the retracted and first extended positions. In certain implementations, the coupler modules 420 are disconnected from the backplane 415 when the coupler modules 420 are in the second extended position. For example, the coupler module 420 may be moved to the second extended position to facilitate replacement of the processor 426.

In some implementations, each coupler module 420 includes one or more cable retainers 450 (FIG. 9) that manage the patch cables 510 plugged into the coupler modules 420. Each retainer 450 defines a channel 451 through which one or more patch cables 510 may be routed. The retainers channels 451 aid in guiding and organizing the patch cables 510 between the front ports 422 and the management sections 330 of the rack 301. When the coupler modules 420 are moved to the extended positions, the front ports 422 move forwardly relative to the rack 301 (e.g., to the management sections 330 of the rack 301). In certain implementations, the retainers 450 manage the patch cables 510 when the coupler modules 420 are moved between the retracted and extended positions to inhibit excessive bending of the patch cables 510 between the front ports 422 and the management sections 330 of the rack 301. For example, each retainer channel 451 has a sufficient cross-sectional area to enable the patch cables 510 to slide within the retainer channel 451.

In some implementations, the coupler modules 420 include coupler blades, such as the coupler blades disclosed in U.S. application Ser. No. 13/025,750, incorporated by reference above. In certain implementations, the couplers of the coupler blades 420 include one or more fiber optic adapters. In other implementations, the couplers of the coupler blades 420 include one or more electrical jacks, punch downs, or other electrical connections. In still other implementations, the couplers of the coupler blades 420 may include both fiber optic adapters and electrical jacks. In other implementations, the coupler modules 420 may include patch panels, termination drawers, etc.

Referring to FIGS. 16-20, the distribution modules 400 are configured to be installed at the mounting sections 320 of the rack 301 in spaced groups 440. Each group 440 of distribution modules 400 defines one distribution section 308 of the rack 301 (see FIG. 16). In some implementations, the distribution sections 308 of the rack 301 are arranged in a vertically stacked arrangement (e.g., see FIGS. 4 and 6). In some such implementations, the mounting sections 320, travel sections 350, and storage sections 360 are arranged in vertically stacked configurations (see FIGS. 4-8). In other implementations, however, the distribution sections 308 can be arranged in other configurations (e.g., horizontal rows, staggered rows or columns, etc.).

In some implementations, each distribution section 308 may have a height of 2 RU. Accordingly, in one implementation, four distribution modules 400, each having a height of ½ RU, may be installed at the mounting area 320 of the distribution section 308. In another implementation, two distribution modules 400, each having a height of 1 RU, may be installed at the distribution section 308. In another implementation, a single distribution module 400 having a height of 2 RU may be installed at the distribution section 308. In other implementations, each distribution section 308 may have a greater or lesser height (e.g., 1 RU, 4 RU, 5 RU, 8 RU, etc.).

FIGS. 16-20 show an enlarged view of a portion of the example rack 301. In the example shown, two distribution modules 400 are mounted in a single distribution section 308. In other implementations, greater or fewer distribution modules 400 may be mounted in each distribution section 308.

The mounting section 320 of each distribution section 308 includes at least one mounting rail 322 to which the distribution modules 400 can be mounted. In the example shown, the mounting area 320 includes two spaced mounting rails 322. In some implementations, a unitary mounting rail 322 runs vertically along the inner side of each tower 311, 313 of the rack 301 from the bottom 305 to the top 304. In other implementations, separate mounting rails 322 are located at each distribution section 308 or mounting section 320. A first end 403 (FIG. 10) of each distribution module 400 is mounted to a first of the mounting rails 322 and a second end 404 (FIG. 10) of the distribution module 400 can be mounted to a second of the mounting rails 322 (see FIG. 16).

In the example shown, each mounting rail 322 includes two rail arms 324 extending from a rail base 326 to define a U-shaped transverse cross-section (e.g., see FIGS. 5 and 17). In one implementation, the rail base 326 of each mounting rail 322 attaches to the respective tower 311, 313. The ends 403, 404 of the distribution modules 400 are mounted to the rail arms 324 (see FIG. 16). For example, each distribution module 400 may include a mounting flange 408 (FIG. 10) at either end of the distribution module 400. Each mounting flange 408 may be fastened to one of the rail arms 324 through one or more holes 328 (FIG. 6) defined in the rail arm 324. In the example shown, each rail arm 324 defines sets of two holes 328 at which the distribution modules 400 can be installed.

In accordance with some aspects, the cable management structures of the rack 301 may provide for separation of the cables 500 into groups that facilitate managing (e.g., adding, removing, deleting, organizing, and/or identifying) the cables 500. In accordance with other aspects, the cable management structures may be configured to inhibit bending of the cables 500 beyond a maximum bend radius. In accordance with other aspects, the cable management structures may be configured to organize the cables 500 to facilitate adding, removing, and rerouting cables 500 within the rack system 300.

Figure 16:
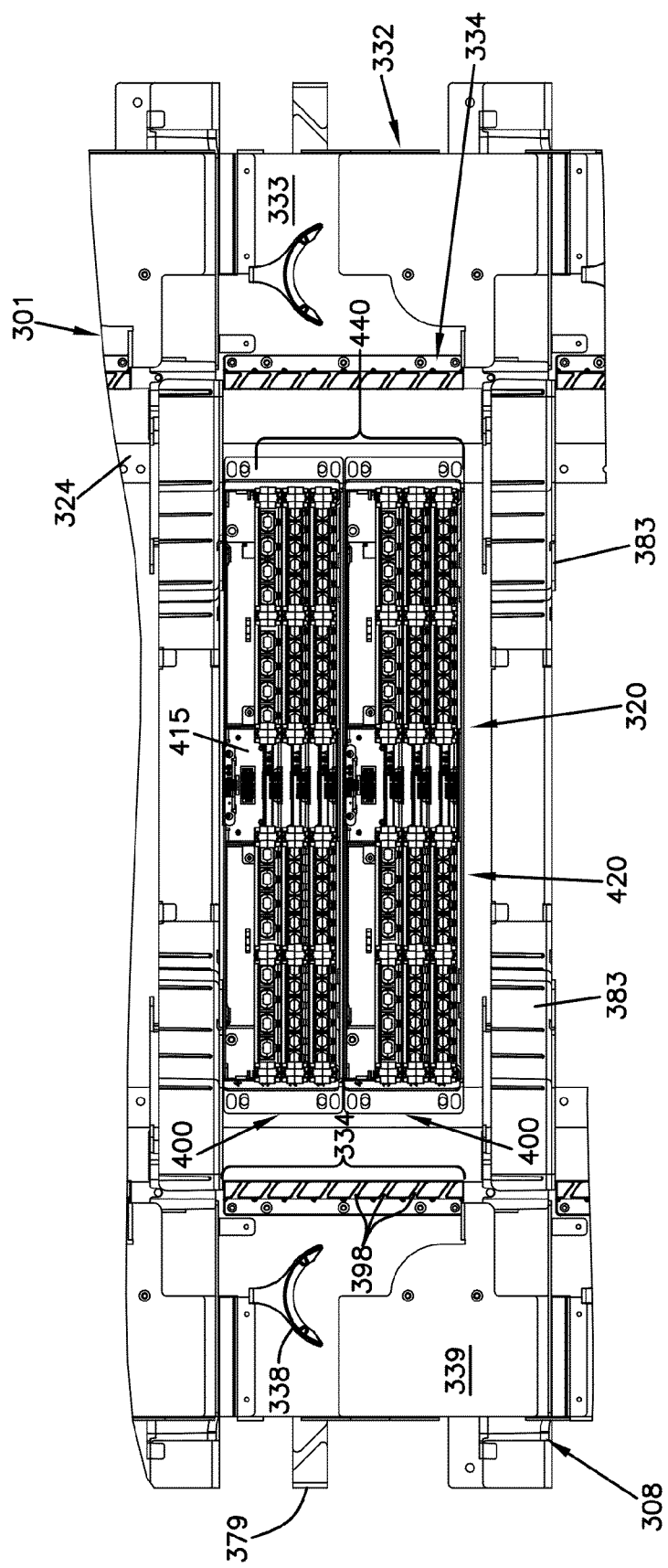
FIG. 16 is a front elevational view of a portion of the example rack of FIGS. 4-8 with two distribution modules mounted to the rack.

For example, as shown in FIGS. 16 and 17, each distribution section 308 defines at least one management section 330 at which the patch cables 510 may be organized. In the example shown, the distribution section 308 defines a first management section 331 at a first side of the mounting area 320 and a second management section 332 at a second side of the mounting area 320. In other implementations, the rack 301 may define management sections 330 on only one side. In some implementations, the management sections 330 are located at the front of the towers 311, 313. In other implementations, the management sections 330 are located at a front of the rack 301, but elsewhere on the framework 310.

Each management section 331, 332 includes one or more cable management structures mounted to a support plate 333 (e.g., see FIG. 17). For example, in some implementations, the front sides 302 of the tower 311, 313 form the support plates 333 of the management sections 3131, 332, respectively. In one implementation, a single support plate 333 extends along all of the management sections 330 of a tower. In other implementations, each management section 330 has a unique support plate 333 separated from the support plates 333 of the adjacent management sections 330 (see FIG. 4).

In certain implementations, each management segment 331, 332 also includes a transition surface 335 located between the support plate 333 and the mounting section 320 (e.g., see FIG. 4). In accordance with some aspects, the transition surface 335 may function as a bend radius limiter for the patch cables 510 routed between the management sections 331, 332 and the distribution modules 400. In accordance with other aspects, routing the patch cables 510 around the transition surface 335 provides slack length of the patch cables 510 to accommodate movement of the distribution modules 420 as will be described in more detail herein.

In certain implementations, each management section 330 includes one or more retention fingers 334 located adjacent the transition surface 335. The retention fingers 334 define channels (e.g., generally horizontal channels) 399 (FIG. 17) that are configured to direct patch cables 510 to and from the distribution modules 400 (e.g., to and from the cable retainers 450 at the first sides 401 of the coupler modules 420). In certain implementations, the retention fingers 334 cooperate with the cable retainers 450 to organize and/or support the patch cables 510 plugged into the front ports 422 of the distribution modules 400. In some implementations, the retention fingers 334 define slots or other openings 398 (FIGS. 16 and 17) through which the patch cables 510 can be inserted into and removed from the channels 399.

In some implementations, each management section 330 includes at least one retention finger channel 399 (FIG. 17) for each distribution module 400 that the distribution section 308 is configured to receive. In certain implementations, each management section 330 includes multiple retention finger channels 399 for each distribution module 400. In one implementation, each management section 330 includes at least one retention finger channel 399 for each coupler module 422 that is capable of being installed at the distribution section 308.

In some implementations, each retention finger 334 may service all of the patch cables 510 extending from a single one of the distribution modules 400. In other implementations, multiple retention fingers 334 may service the patch cables 510 of one distribution module 400. For example, each retention finger 334 may service the patch cables 510 of one coupler module 420 of the distribution module 400. In another implementation, multiple retention fingers 334 may service the patch cables 510 of one coupler module 420. In still other implementations, a single retention finger 334 may service the patch cables 510 of multiple distribution modules 400.

Each management section 330 also includes bend radius limiters 336 (FIGS. 7 and 8) that inhibit patch cables 510 from bending sufficiently to hinder the functionality of the patch cable 510. For example, in certain implementations, each management section 330 includes a full spool 337 and a partial spool 338 (see FIG. 23). In the example shown, the full spool 337 is located beneath the partial spool 338. In other implementations, the management sections 330 can have other configurations of bend radius limiters 336 (e.g., the full spool on top, two or more partial spools, two or more full spools, etc.). In certain implementations, each management section 330 also includes a plate 339 mounted over at least a portion of the bend radius limiters 336 to aid in retaining the patch cables 510 in the management sections 330. In the example shown, the plate 339 mounts over the full spool 338.

Figure 18:
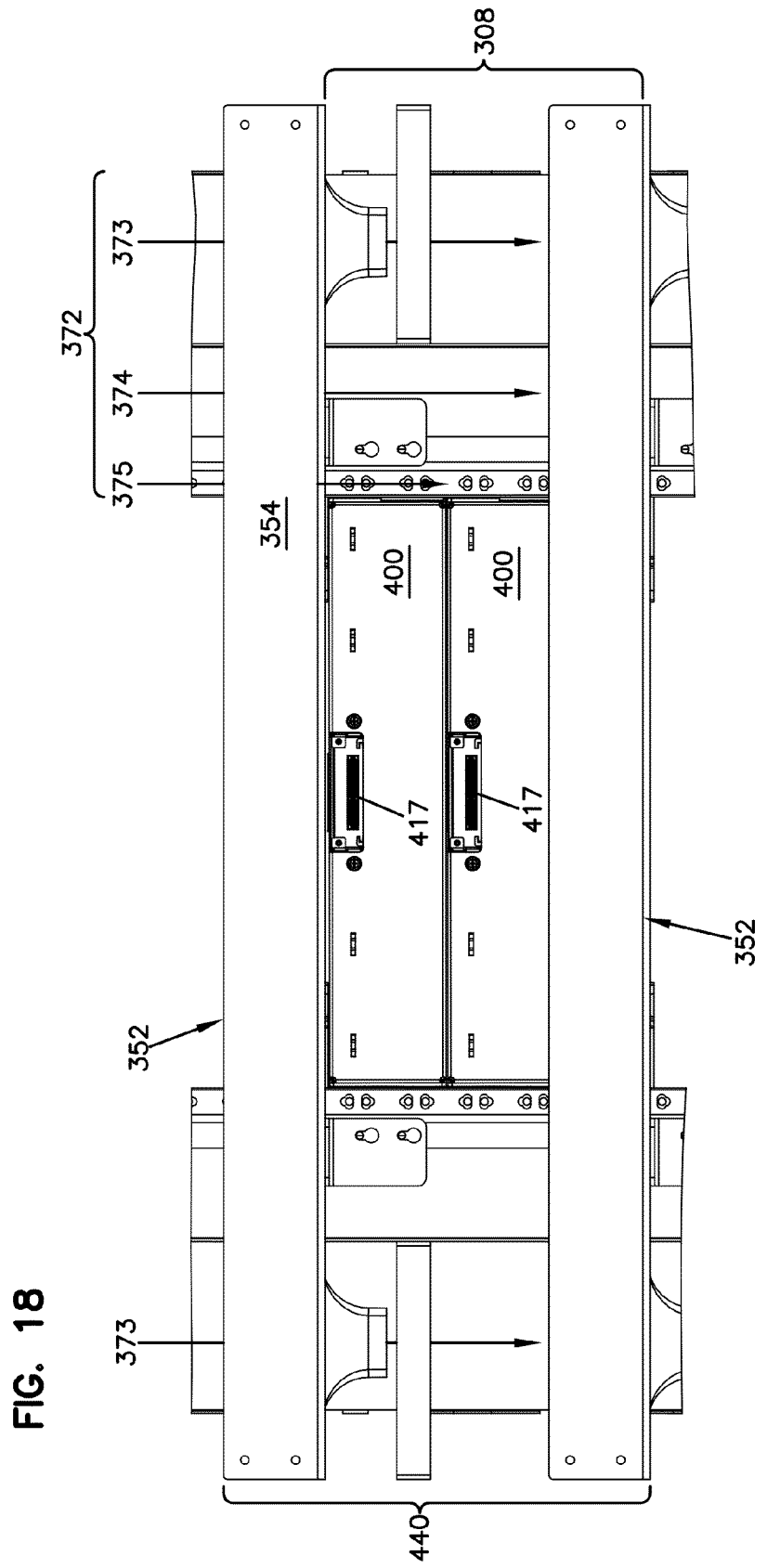
FIG. 18 is a rear elevational view of the portion of the example rack of FIG. 16 where the rear of the two distribution modules is visible.
Figure 19:
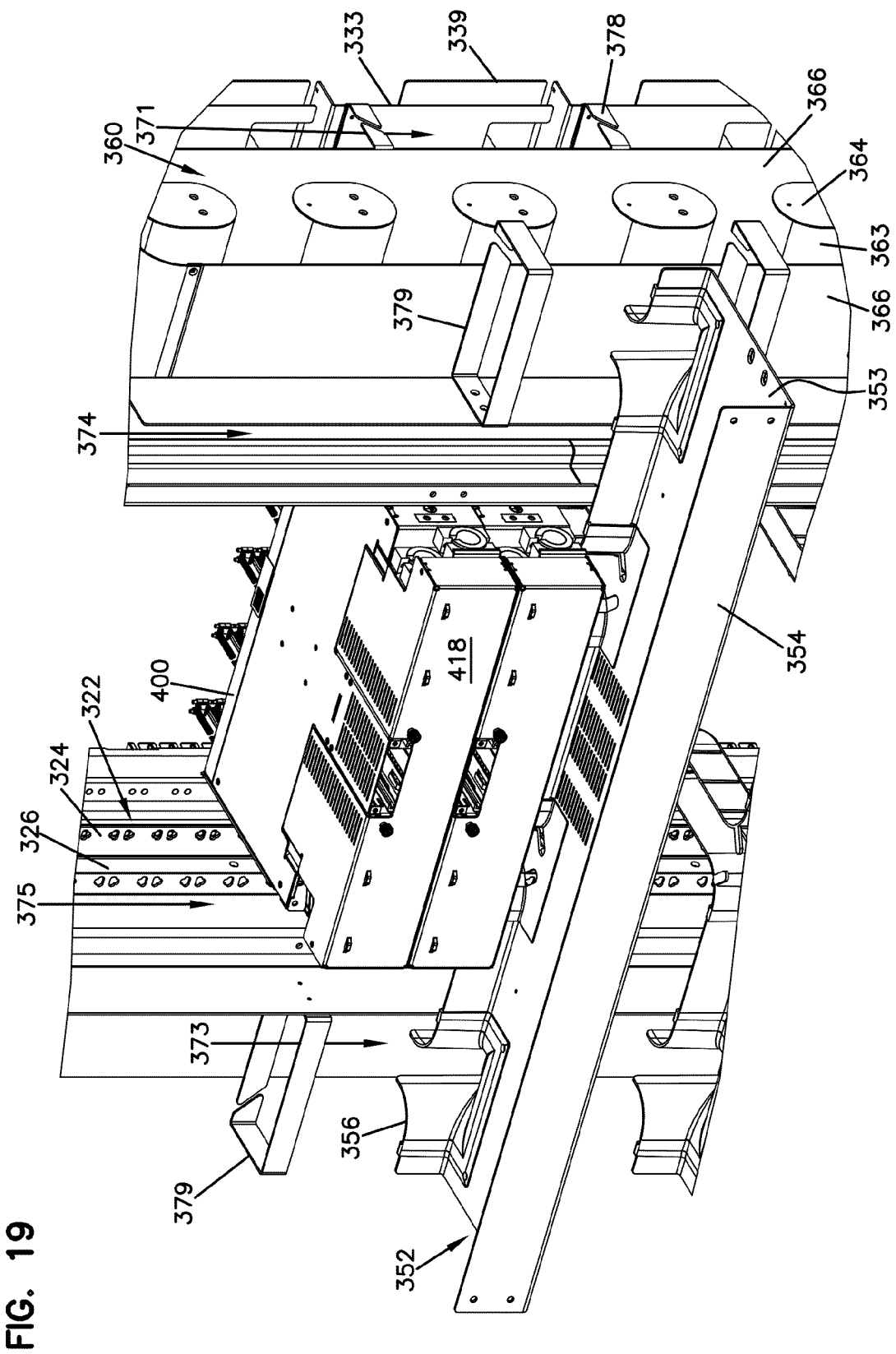
FIG. 19 is a rear, perspective view of the rack of FIG. 18 with the two distribution modules visible.
Figure 20:
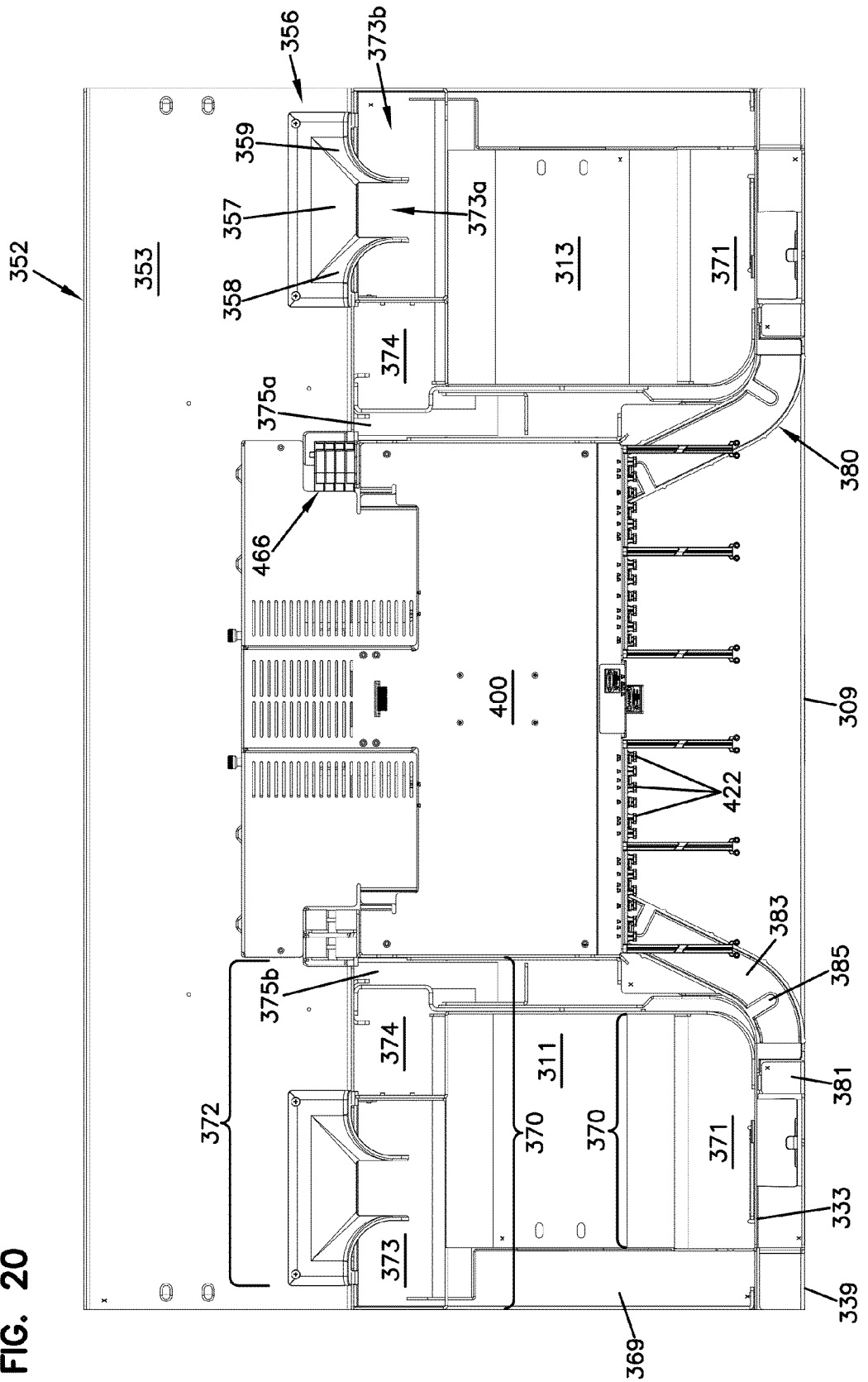
FIG. 20 is a top plan view of the rack of FIGS. 16-19 with a top bracing bar removed so that the top horizontal tracks are fully visible.

The rear 303 of the rack 301 defines one or more travel sections 350 along which the patch cables 510 can be routed across the rack 301 and/or to other racks in the rack system 300 (e.g., see FIGS. 18-20). In accordance with some aspects, the rear 303 of the rack 301 defines one travel section 350 for each distribution section 308 (see FIG. 19). In accordance with other aspects, one travel section 350 can service multiple distribution sections 308. In accordance with still other aspects, multiple travel sections 350 can service one distribution section 308. In some implementations, the troughs 352 of the travel section 350 are connected to a rear side of each tower 311, 313 for support. In other implementations, troughs 352 are otherwise connected to the frame construction 310 at the rear 303 of the rack 301 (FIG. 5).

Each travel section 350 includes at least one trough 352 that extends at least partially across the rear 303 of the rack 301. In the example shown, each travel section 350 has one trough 352 that extends fully across the rear 303 of the rack 301 and connects to each of the towers 311, 313 (see FIG. 19). In certain implementations, each trough 352 includes a tray 353 on which the patch cables 510 can lay and a lip 354 that aids in retaining the patch cables 510 on the tray 353. In one implementation, the tray 353 extends generally horizontally and the lip 354 extends generally vertically. In other implementations, however, the tray 353 can be angled relative to the ground to aid in retaining the patch cables 510 or to aid in limiting the bend radius of the patch cables 510.

The sides 306, 307 of the rack define one or more storage sections 360. Each slack storage area 360 includes one or more cable storage structures (e.g., spools, half-spools, partial-spools, or other bend radius limiters) 362 (e.g., see FIGS. 7 and 8). In the example shown in FIG. 19, the cable storage structures 362 include spools 363 that each have a retaining flange 364 at one end of the spool 363. The spools 363 of each storage section 360 are positioned in a single column between side flanges 366. In other implementations, each slack storage area 360 can include multiple columns of spools 363 or other radius limiters. One or more retainers 368 also can be positioned at the slack storage area(s) 360 to aid in holding the patch cables 510 within the storage area(s) 360. In the example shown, each slack storage area 360 includes one retainer 368 positioned at a bottom 305 of the rack 301.

Referring to FIG. 20, the rack 301 can include one or more cable guides 370 along which various cables 500 can be routed to different sections of the rack 301. For example, in some implementations, the rack 301 includes vertical routing channels and horizontal routing channels. The front 302 of the rack 301 may define one or more front vertical channels 371 through which portions of the patch cables 510 can be routed to upper or lower distribution sections 308 (see FIGS. 7, 8 and 17). The rear 303 of the rack 301 may define one or more rear vertical channels 372 (FIG. 20) through which at least portions of the patch cables 510, distribution cables 520, and PLI cables 530 can be routed to upper or lower distribution sections 308 as will be described in more detail herein.

In some implementations, the front vertical channels 371 are defined between the support plates 333 of the management sections 330 and the side flanges 366 defining the slack storage areas 360 (see FIGS. 17 and 20). Retainers 378 extend between the support plates 333 and the storage area flanges 366 to hold the patch cables 510 within the front vertical channels 371 (see FIG. 17). In some implementations, the front vertical channels 371 span the width of plates 333 and flange 366. In other implementations, the front vertical channels 371 are wider or narrower than the plates 333 and flange 366. At least one recess is defined in the support plate 333 at each distribution section 308 to facilitate transitioning the patch cables 510 from the respective front vertical channels 371 to one of the management sections 330.

Figure 27:
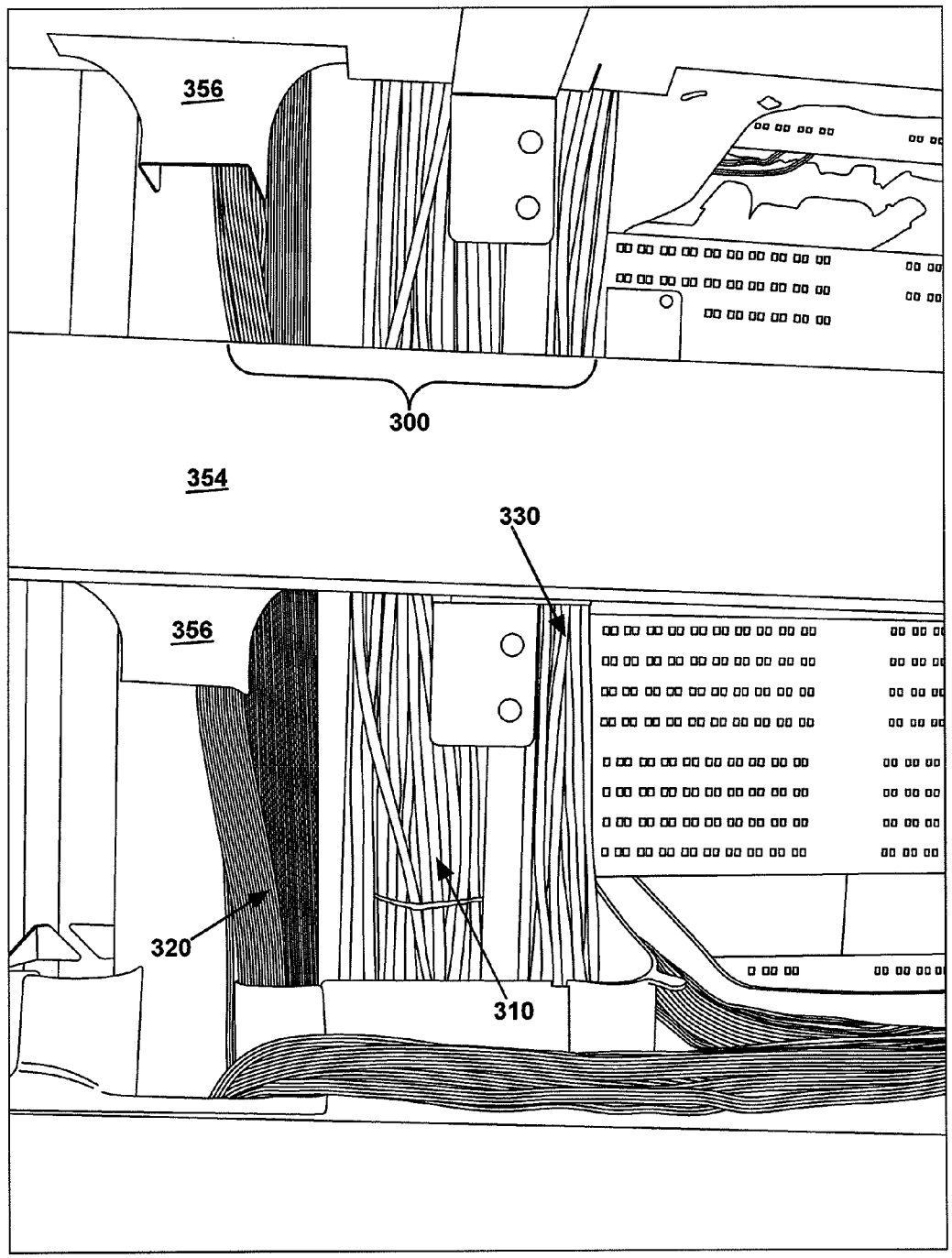
FIG. 27 is a rear view of a portion of an example rack in which distribution cables, patch cables, and PLI cables are routed through channels at the rear of the rack in accordance with the principles of the present disclosure.

In certain types of racks 301, the rear vertical channels 372 include one or more travel channels 373 defined between the troughs 352 of the travel sections 350 and the storage area plates 366 of the storage area 360 (see FIGS. 18, 20 and 27). For example, one or more recesses can be defined in the trays 353 of the troughs 352 to at least partially form the travel channels 373. In the example shown in FIG. 5, two recesses are defined on opposite sides of each tray 353 to form two travel channels 373 (e.g., see FIG. 20). Patch cables 510 enter the travel channels 373 from the troughs 352 via the recesses. Retainers 379 extend between the trays 353 and the storage area plates 366 (see FIG. 19) to aid in maintaining the patch cables 510 within the travel channels 373.

Certain types of troughs 352 include transition members 356 that facilitate routing the patch cables 510 between the troughs 352 and the travel channels 373. In the example shown in FIG. 5, a transition member 356 is installed at each recess on each trough 352. In some implementations, each transition member 356 is configured to funnel one or more of the patch cables 510 from the trough 352 to the travel channel 373 (see FIG. 27). In the example shown, the transition member 356 couples to the tray 353 and an inner lip of the trough 352 (see FIG. 19).

In certain types of racks 301, the rear vertical channels 372 also include one or more distribution channels 374 (see FIGS. 18, 20, and 27). In some implementations, the distribution channels 374 are formed by rails 376. In the example shown in FIG. 5, each rail 376 is generally U-shaped. In certain implementations, each rail 376 is formed from at least one side flange 377. Indeed, in some implementations, each rail 376 includes two side flanges 377 to define the channel 374 (see FIG. 17). In other implementations, each rail 376 may be a unitary piece. In the example shown, each rail 376 is positioned at the rear 303 of the rack 301 so that each distribution channel 374 extends adjacent one of the travel channels 373. In other implementations, the distribution channel(s) 374 may be separated from the travel channel(s) 373.

In certain types of racks 301, the rear vertical channels 372 also include one or more PLI routing channels 375 (see FIGS. 18, 20, and 27). Each additional routing channel 375 extends vertically between an exterior of one of the rails 376 and one of the sides 403, 404 of the distribution modules 400 positioned on the rack 301 (see FIGS. 18, 20, and 27). In some implementations, the additional routing channels 375 have a smaller cross-sectional area than the distribution channels 374, which have a smaller cross-sectional area than the travel channels 373 (see FIG. 20). In other implementations, the distribution channels 374 may have the largest cross-sectional area of the rear vertical channels 372. In still other implementations, the rear vertical channels 372 may have any desired cross-sectional area.

In some implementations, one or more of the vertical channels 370 connect to one of the slack storage areas 360. For example, in certain implementations, the front vertical channels 371 and the travel channels 373 connect to the storage areas 360. In certain implementations, the front vertical channel 371 and the travel channel 373 located at the first side 306 of the rack 301 connect to the storage area 360 located at the first side 306 of the rack 301 (see FIG. 4). The front vertical channel 371 and the travel channel 373 located at the second side 307 of the rack 301 connect to the storage area 360 located at the second side 307 of the rack 301 (see FIG. 5). In certain implementations, the storage sections 360 are located at the outer side of each tower 311, 313. In other implementations, the distribution channels 374 also may connect to the storage areas 360.

In one implementation, the vertical channels 370 connect to the respective storage areas 360 at a bottom of the channels 370. For example, cables routed through the vertical channels 370 may be routed beneath the plates 366 of the respective storage area 360 at the bottom 305 of the rack 301. In certain implementations, the base 309 of the rack 301 defines a storage trough 369 at each slack storage area 360 to aid in transitioning the patch cables 510 between the slack storage area 360 and the vertical channels 371. For example, the trough 369 may inhibit the patch cables 510 from extending onto the floor around the rack 301.

As shown in FIG. 20, the top 304 of certain types of racks 301 provides access to at least some of the vertical channel guides 370. For example, in some implementations, at least the distribution channels 374 and the PLI routing channels 375 extend to the top 304 of the rack 301 (see FIG. 17). The distribution cables 520 and/or the PLI cables 530 can be transitioned at the top 304 of the rack 301 between the channels 374, 375 and one or more overhead raceways or other routing structures. In other implementations, the base 309 of the rack 301 provides access to at least some of the cable guides 370. The distribution cables 520 and/or the PLI cables 530 can be transitioned at the bottom 305 of the rack 301 between the cable guides 370 and one or more floor-level or below-ground tracks.

In the example shown in FIG. 20, the rack 301 includes a first PLI routing channel 375A at one side of the distribution module 400 and a second PLI routing channel 375B at an opposite side of the distribution module 400. In certain implementations, one or more PLI cables 530 may be routed down the first channel 375A and one or more grounding cables may be routed down the second channel 375B. In other implementations, both PLI cables 530 and grounding cables may be routed down both channels 375A, 375B. In still other implementations, the PLI cables include grounding conductors.

Horizontal channel guides 380 extend between the front 302 of the rack 301 to the rear 303 of the rack 301 to connect the management sections 330 to the travel sections 350 (see FIG. 20). For example, at least one horizontal channel guide 380 may extend between the top and bottom of adjacent module groups 440 to connect one of the management sections 330 to one of the travel sections 350 (see FIG. 17). In other implementations, multiple channel guides 380 may service each distribution section 308. For example, in one implementation, at least on horizontal channel guide 380 may extend between each distribution module 400.

Figure 24:
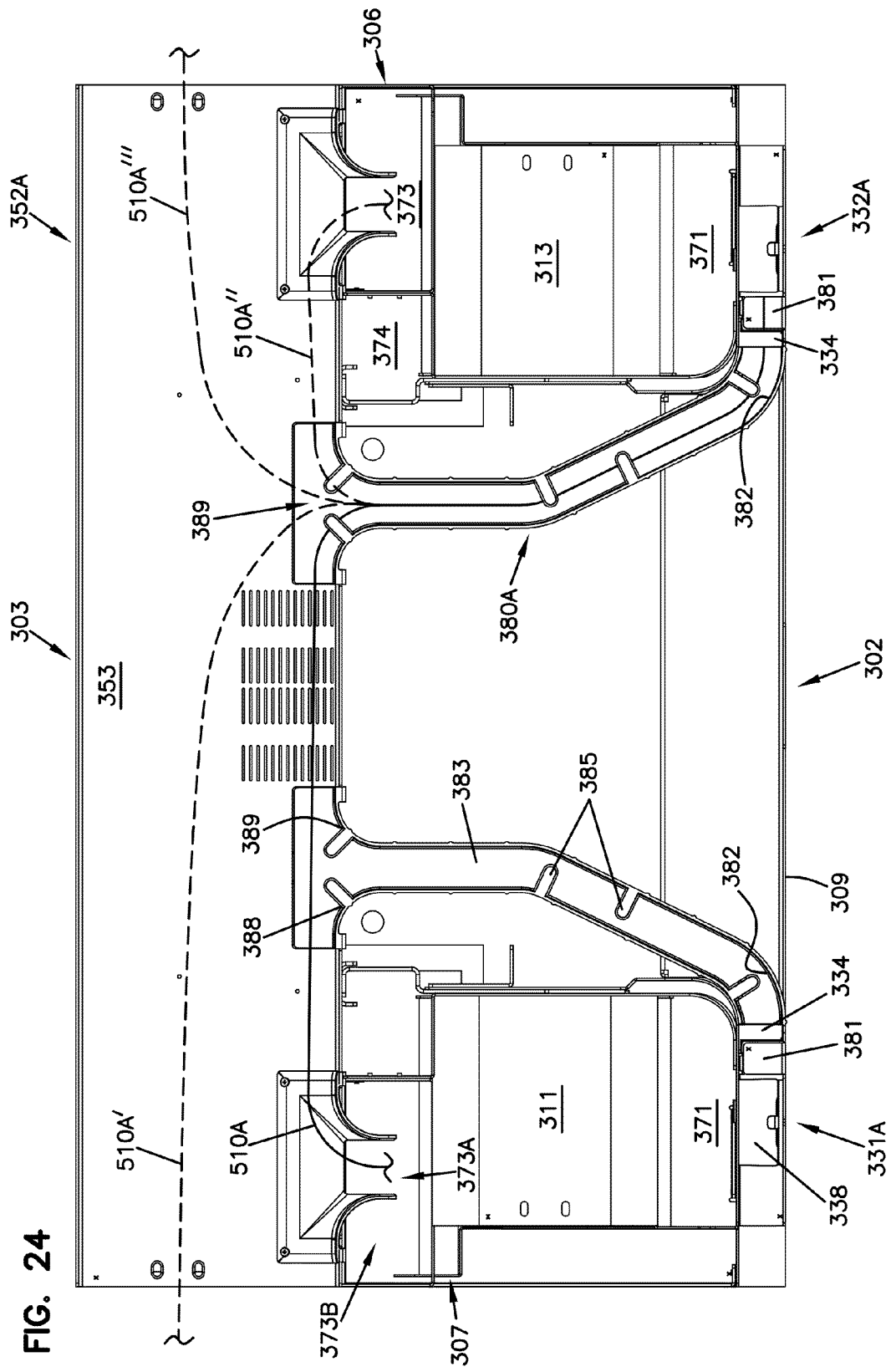
FIGS. 24 and 25 are top plan views of the rack of FIGS. 4-8 with representative patch cables shown routed through the horizontal tracks and over the troughs of the rack.
Figure 25:
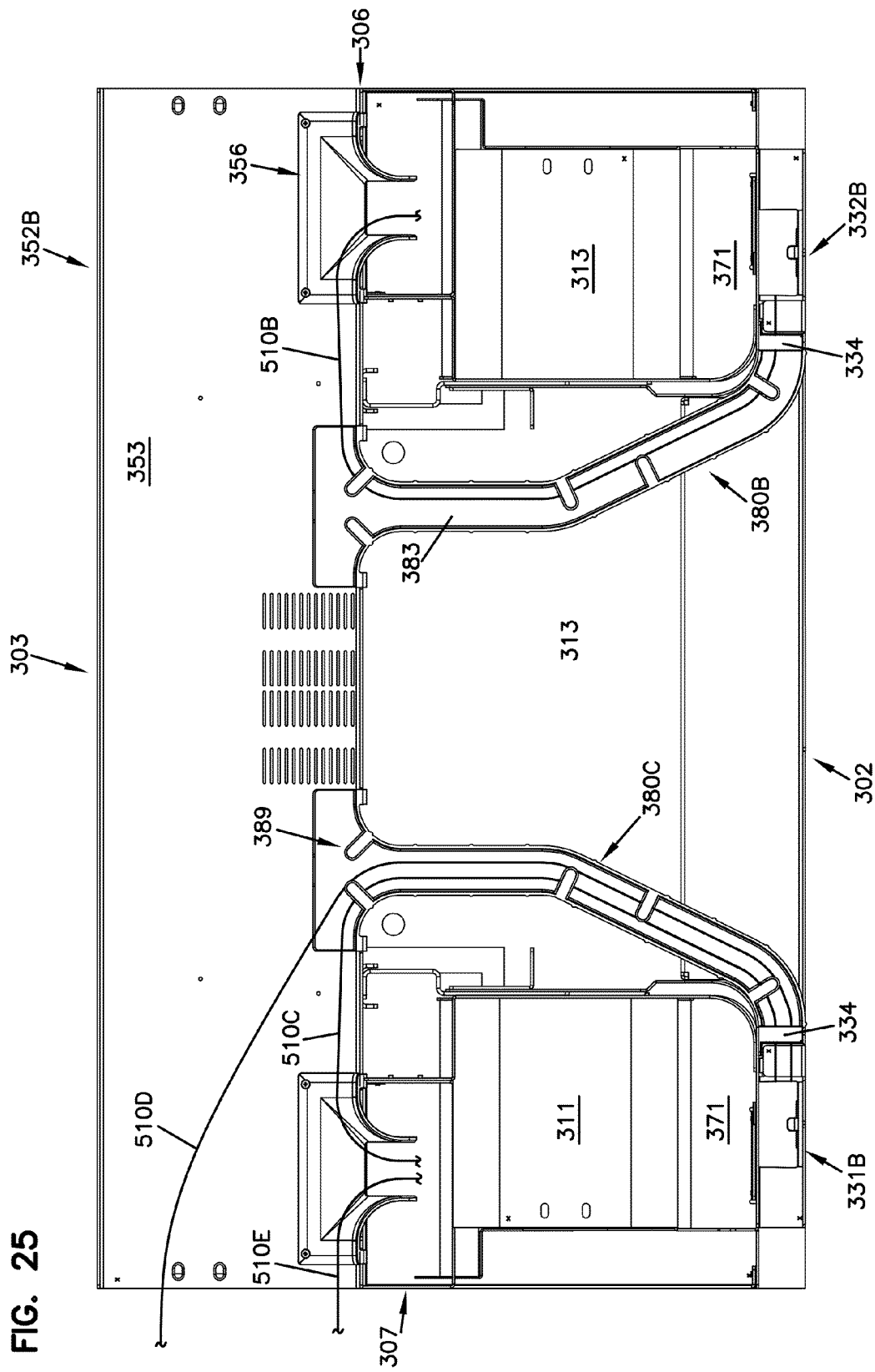

Each horizontal channel guide 380 includes a track or raceway 383 having an entrance port 381 and an exit port 389 (FIGS. 24 and 25). The track 383 extends between a front 302 of the rack 301 and a rear 303 of the rack 301. One or more flanges 385 extend over an open top of the track 383 to aid in retaining the patch cables 510 within the track 383. The entrance port 381 of each track 383 is located at one of the management regions 330 of the distribution section 308 The exit port 389 of each track 383 is located at the troughs 352 of the distribution section 308. In certain implementations, the track 383 provides bend radius protection to fiber optic cables routed therein. For example, the track 383 may define curves 382, 388 that ease the transition of the fibers between one direction and another without bending the fiber beyond a maximum limit.

FIGS. 21-28 illustrate some routing paths that may be utilized by cables routed to, from, and within the rack 301. In general, the distribution cables 520 are routed along the rear 303 of the rack 301 (e.g., from one or more cable raceways) to the rear ports 424 of the distribution modules 400. Signals carried by the distribution cables 520 plugged into the rear ports 424 of the distribution modules 400 pass through the distribution modules 400 to patch cables 510 plugged into the front ports 422 of the distribution modules 400.

The patch cables 510 carry the signals from the respective front ports 422 to either different distribution module ports or other communications equipment. For example, in some implementations, an example patch cable 510 can be routed from a front port 422 of a distribution module 400 located at a source rack 301, through a corresponding management section 330 at the front 302 of the source rack 301, along a horizontal channel guide 380 toward a rear 303 of the source rack 301, to a corresponding travel section 350 at the rear 303 of the source rack 301.

In some implementations, the patch cable 510 is routed along the travel section 350 to the travel section 350 of a destination rack. In other implementations, the source rack 301 is the destination rack 301. From the appropriate travel section 350, the patch cable 510 is routed to a storage section 360 at one of the sides 306, 307 of the destination rack, to a management section 330 at the front 302 of the destination rack, to another front port 422 of the same or a different distribution module 400.

In accordance with certain aspects, one or more PLI cables 530 also can be routed to the rack 301 (e.g., from one or more cable raceways). For example, the PLI cables 530 also may be routed along the rear 303 of the rack 301 to PLI ports 428 at the rear or sides of the distribution modules 400. In some implementations, the PLI cables 530 carry power to the distribution modules 400 or components installed therein. In other implementations, the PLI cables 530 carry PLI signals between the distribution modules 400 and a data network. Certain types of PLI cables 530 can carry both power and PLI signals (e.g., have at least one power wire and at least one communications wire).

One example routing configuration for the example rack 301 will now be described in more detail with respect to FIGS. 21-28. In the example routing configuration, the rack 301 is configured to receive one or more distribution cables 520 (see FIG. 21) that carry communication signals (see signals S1 of FIG. 1) to the distribution modules 400. The rack 301 also is configured to receive one or more patch cables 510 that connect the distribution modules 400 to other distribution modules 400 of the rack system 300 and/or to other communications equipment. The rack 301 also is configured to receive PLI cables 530 that carry PLI signals (see signals S2 of FIG. 1) between the distribution modules 400 or master processors 430 associated therewith and a data network (e.g., network 218 of FIG. 2).

Figure 21:
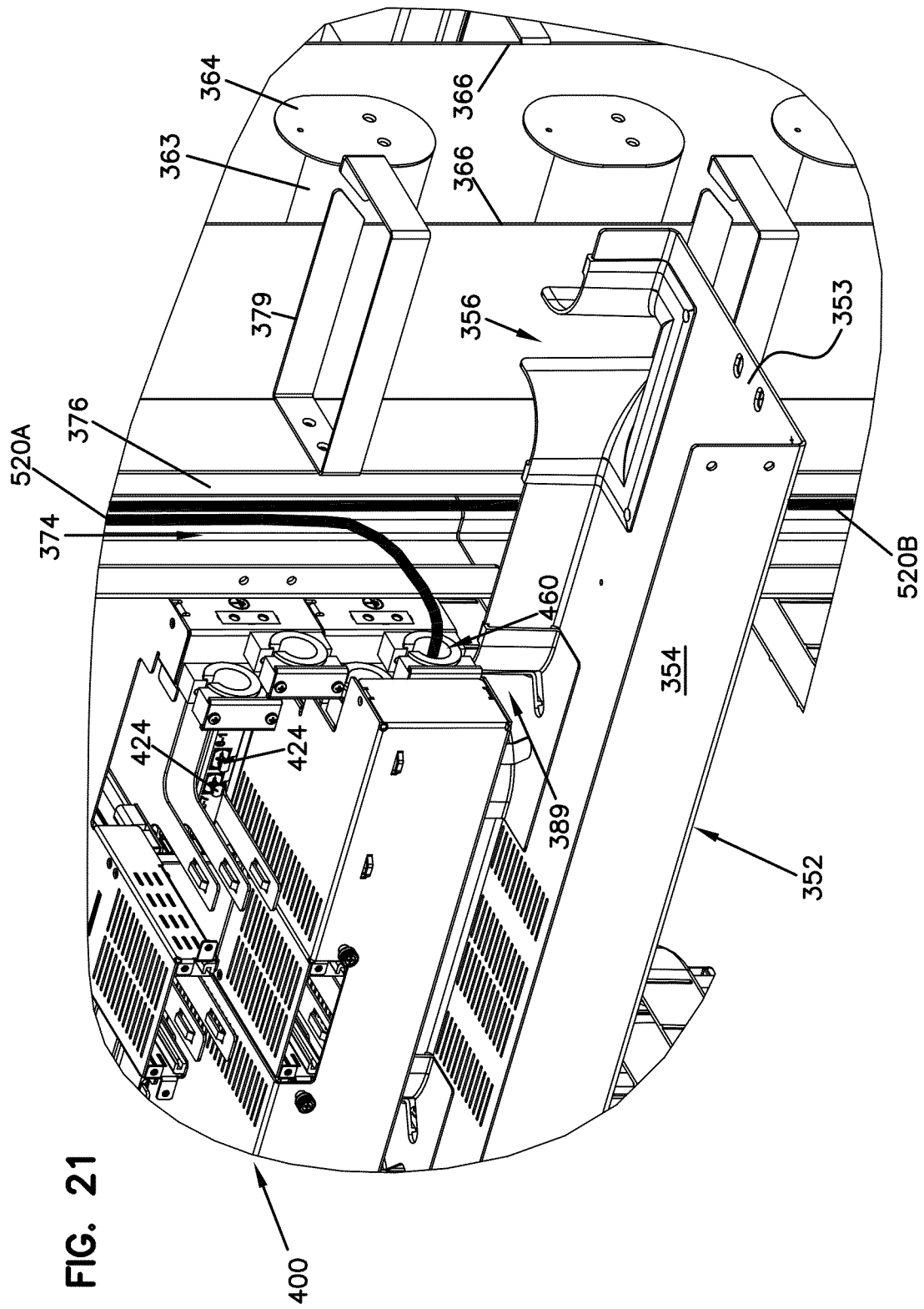
FIG. 21 is an enlarged view of a portion of the rack shown in FIG. 19 in which retention members of the distribution modules are more clearly visible and in which distribution cables are routed.

Referring to FIGS. 21 and 22, in some implementations, the distribution cables 520 are transitioned from an overhead raceway to an entrance of the distribution channel 374 at the top 304 of the rack 301. Each distribution cable 520 is routed through a distribution channel 374 defined by a rail 376 to one of the distribution modules 400 (see FIG. 21). An appropriate number of distribution cables 520 are transitioned from the distribution channel 374 at each distribution module 400.

For example, in FIG. 21, a first distribution cable 520A and a second distribution cable 520B are routed downwardly through the distribution channel 374. The first distribution cable 520A is transitioned out of the distribution channel 374 at the distribution module 400 shown. The second distribution cable 520B continues past the distribution module 400 to a different distribution module 400 located out-of-sight in FIG. 21.

In some implementations, the connectorized end 522 of the distribution cable 520A is routed to a rear port 424 at the second side 402 of the distribution module 400 (see FIG. 22). In other implementations, each distribution cable 520 is routed through the second side 402 of the respective distribution module 400, over a select coupler module 420, to a rear cable ports 424 of a coupler located at the front 401 of the distribution module 400. In such implementations, the connectorized end 522 of each distribution cables 520 is interfaced directly with the connectorized end 512 (FIG. 23) of one or more patch cables 510. The troughs 352 of the rack 301 are sufficiently spaced so that a user can access these ports 424 from the rear 303 of the rack 301.

In certain implementations, the distribution modules 400 include at least one retention arrangement 460 at which the distribution cables 520 can be secured to the second side 402 of the distribution module 400 (FIGS. 21-22). For example, the distribution cables 520 may be routed to the retention arrangement 460 before the connectorized end 522 is plugged into the rear ports 424 of the distribution module 400. In some implementations, the retention arrangement 460 includes at least a first retention structure located at the second side 402 of the distribution module chassis 410. In some implementations, the first retention structure includes a clamping member 462 (FIG. 22). In other implementations, the first retention structure includes a fan-out arrangement 466 (FIG. 20) at which individual fibers of the cables 520 are separated and, optionally, upjacketed.

In certain implementations, the retention arrangement 460 also includes at least one cable tie 464 that fastens each distribution cable 520 to an appropriate coupler module 420 of the distribution module 400. In certain implementations, the cable ties 464 are located at a rear end of an elongated flange 465 extending rearward from the coupler module 420.

The cable ties 464 are positioned so that slack length of the distribution cables 520 routed to the coupler module 420 is provided between the ties 464 and the first retention structure mounted to the distribution module chassis 410. The slack length enables the coupler modules 420 to be slid forwardly relative to the chassis 410 and rack 301 without straining or disconnecting the distribution cables 520. The cable ties 464 also may facilitate securing and/or organizing the distribution cables 520.

In some implementations, one or more of the distribution cables 520 includes multiple optical fibers that are terminated by a multi-fiber connector (e.g., an MPO connector). In some such implementations, one or more of the distribution cables 520 may be routed through one or more clamping members 462, through cable ties 464, to the rear ports 424 at the second side 402 of the distribution module 400 (e.g., see FIG. 22). In other such implementations, one or more of the distribution cables 520 may be routed to one or more fan-out arrangements 466 and separated into individual fibers that may be routed through cable ties 464 over one or more coupler modules 420 to the rear 464 of the front couplers of the coupler modules 420.

In still other implementations, one or more of the distribution cables 520 includes one or more optical fibers that are each terminated by a single-fiber connector (e.g., an LC connector, SC connector, ST connector, FC connector, LX.5 connector, etc.). In some such implementations, one or more of the distribution cables 520 may be routed through one or more clamping members 462, through cable ties 464, to the rear ports 424 at the second side 402 of the distribution module 400. In other implementations, however, other types of retention structures may be utilized.

In the example shown in FIG. 22, two connectorized distribution cables 520 are routed through clamping members 462 to two rear cable ports 424 at the second side 402 of the bottom coupler module 420 of the chassis 410. In one implementation, each of the connectorized distribution cables 520 shown include multi-fiber cables terminated by an MPO connector. In other implementations, however, each distribution cable 520 may include a single optical fiber terminated by a single-fiber connector. In still other implementations, the distribution cables 520 may include electrical cables that terminate at electrical plugs (e.g., RJ plugs), electrical jacks (e.g., RJ jacks), punch downs, wire ties, or other suitable connectors.

Figure 23:
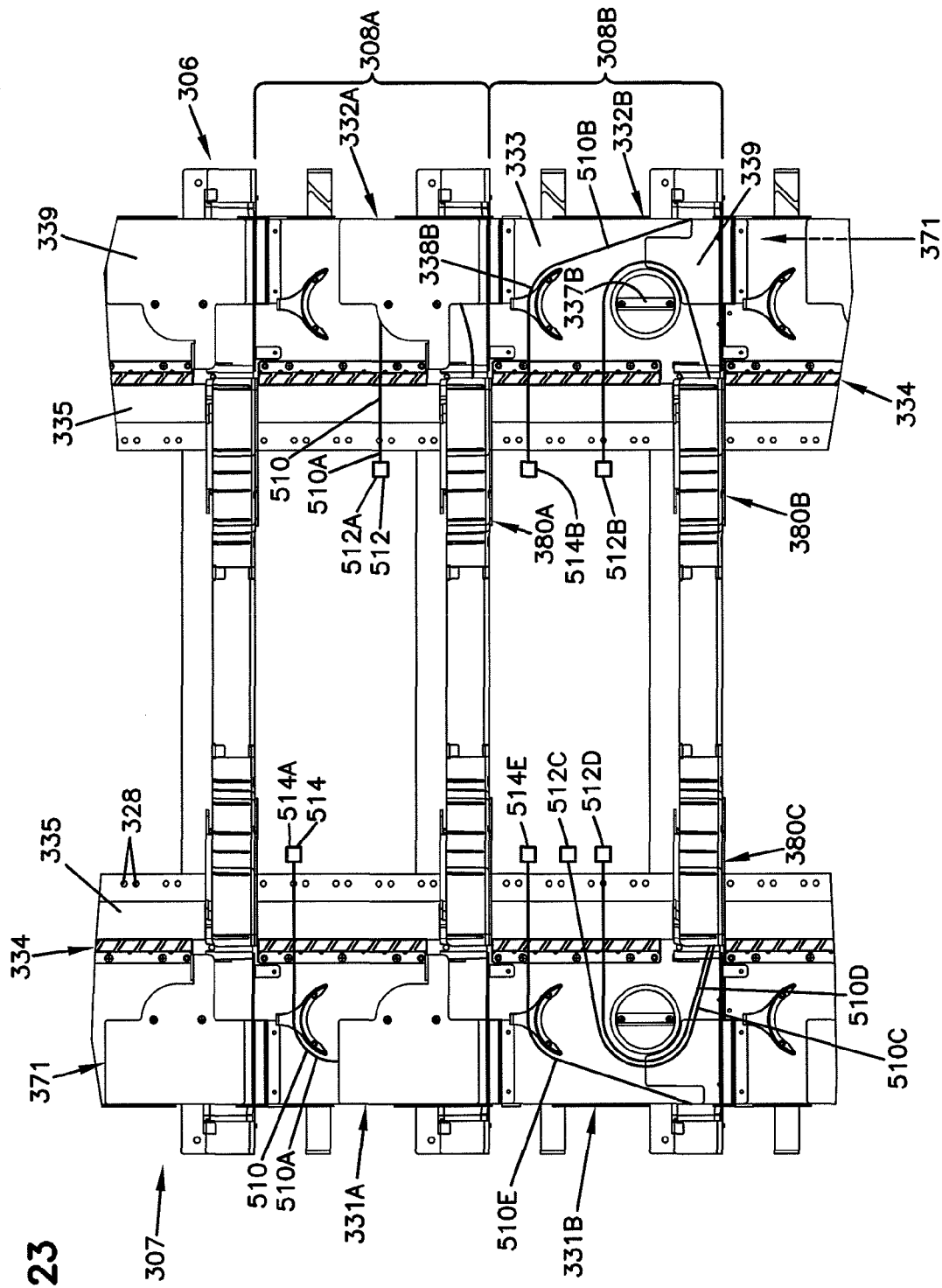
FIG. 23 is an enlarged view of a portion of FIG. 6 with representative patch cables shown routed through the management sections of the rack.

Referring to FIG. 23, the communication signals carried by the distribution cables 520 pass through the distribution modules 400 to the first set of cable ports 422. One or more patch cables 510 carry the communication signals between two respective distribution module ports 422 or between a distribution module port 422 and communications equipment. In general, each patch cable 510 extends from a first connectorized end 512 to a second connectorized end 514. The first connectorized end 512 of each patch cable 510 is plugged into one of the front ports 422 of a distribution module 400. From the first connectorized end 512, each patch cable 510 is routed to a respective management section 330. The connectorized ends 512, 514 of some example patch cables 510 are shown in FIG. 23. For clarity and ease in viewing, the distribution module(s) 400 positioned on the rack 301 are not shown in FIG. 23.

In FIG. 23, seven patch cables 510A-510G are shown routed through the appropriate management sections 330 to different distribution sections 308 of the rack 301. A first example patch cable 510A includes a first connectorized end 512A that is configured to be plugged into one of the front ports 422 of a distribution module 400 located at a first distribution section 308A. From the first connectorized end 512A, the first example patch cable 510A extends to a first management region 332A located on the first side 306 of the rack 301. At the first management region 332A, the first example patch cable 510A extends over the respective transition surfaces 335, through the respective retention fingers 334, to the bend radius limiters 336. The bend radius limiters 336 route the first example patch cable 510A toward a horizontal channel guide 380A associated with the first management region 332A.

The first example patch cable 510A also includes a second connectorized end 514A that is configured to be plugged into one of the front ports 422 of a distribution module 400 located at the first distribution area 308A. In some implementations, the connectorized end 514A may be plugged into a front port 422 of the same coupler module 420 as the first connectorized end 512A. In other implementations, the connectorized ends 514A may be plugged into a front port 422 of a different coupler module 420 of the same or a different distribution module 400. From the second connectorized end 514A, the first example patch cable 510A extends to a first management region 331A located on the second side 307 of the rack 301. At the first management region 331A, the first patch cable 510A extends over the respective transition surface 335, through the respective retention fingers 334, to the bend radius limiters 336. In the example shown, the first patch cable 510A is routed over a partial spool 338 of the limiters 136 and into a front vertical channel 371 at the second side 307 of the rack 301. The connection between the first and second connectorized ends 512A, 514A will be shown with reference to FIGS. 24-27.

A second example patch cable 510B includes a first connectorized end 512B that is configured to be plugged into one of the front ports 422 of a distribution module 400 located at a second distribution area 308B. From the first connectorized end 512B, the second example patch cable 510B extends to a second management region 332B located on the first side 306 of the rack 301. At the second management region 332B, the second example patch cable 510B extends over the respective transition surfaces 335, through the respective retention fingers 334, to the bend radius limiters 336. In the example shown, the second patch cable 510B is routed around a full spool 337 of the bend limiters 336 toward a horizontal channel guide 380A associated with the first management region 332B.

The second example patch cable 510B also includes a second connectorized end 514B that is configured to be plugged into one of the front ports 422 of a distribution module 400 located at the second distribution area 308B. In some implementations, the connectorized end 514B may be plugged into a front port 422 of the same coupler module 420 as the first connectorized end 512B. In other implementations, the connectorized ends 514B may be plugged into a front port 422 of a different coupler module 420 of the same or a different distribution module 400. From the second connectorized end 514B, the second example patch cable 510B extends over the respective transition surface 335, through the respective retention fingers 334, to the bend radius limiters 336. In the example shown, the second patch cable 510B is routed over a partial spool 338 of the bend limiters 336 and into a front vertical channel 371 at the first side 306 of the rack 301. The connection between the first and second connectorized ends 512B, 514B will be shown with reference to FIGS. 24-27.

Third and fourth example patch cables 510C, 510D are shown routed through a second management region 331B at the second side 307 of the rack 301. Each of these patch cables 510C, 510D has a first connectorized end 512C, 512D, respectively that is configured to be plugged into one of the front ports 422 of a distribution module 400 located at the second distribution area 308B. The connectorized ends 512C, 512D may be plugged into front ports 422 of the same or a different coupler module 420. From the connectorized ends 512C, 512D, the third and fourth patch cables 510C, 510D extend over the respective transition surfaces 335, through the respective retention fingers 334, to the bend radius limiters 336 of the second management region 331B at the second side 307 of the rack 301. In the example shown, the third and fourth patch cables 510C, 510D are routed around a full spool 337 at the second management region 331B and into a corresponding horizontal channel guide 380C.

The second ends of the third and fourth patch cables 510C, 510D are not shown in FIG. 23. For example, in some implementations, the second ends of the third and fourth patch cables 510C, 510D may be routed to distribution modules 400 positioned at distribution sections 308 of the rack 301 that are outside the scope of FIG. 23. In other implementations, the second ends of the third and fourth patch cables 510C, 510D may be routed to distribution modules 400 located on a different rack in the rack system 300 as will be described in more detail herein.

A fifth example patch cable 510E includes a second connectorized end 514E that is configured to be plugged into one of the front ports 422 of a distribution module 400 located at the second distribution area 308B. From the second connectorized end 514E, the fifth example patch cable 510E extends over the respective transition surface 335, through the respective retention fingers 334, to the bend radius limiters 336 of a first management region 331A at the second side 307 of the rack 301. In the example shown, the fifth example patch cable 510E is routed over a partial spool 338 and into the front vertical channel 371 at the second side 307 of the rack 301.

The first end of the fifth example patch cable 510E is not shown in FIG. 23. For example, in some implementations, the first end of the fifth patch cable 510E may be configured to plug into a distribution module 400 positioned at a distribution section 308 of the rack 301 that is outside the scope of FIG. 23. In other implementations, the first end of the fifth patch cable 510E may be routed to a distribution module 400 located on a different rack in the rack system 300.

FIGS. 24 and 25 are plan views of the rack 301 with patch cables routed through the horizontal channel guides 380 from the management regions 330 at the front 302 of the rack 301 to a travel region 350 at the rear 303 of the rack 301. From the travel region 350, each patch cable 510 may be routed to a travel channel 373 of the same rack 301, a travel channel of an adjacent rack, a travel channel of a non-adjacent rack located in the same rack system 300 (e.g., a rack positioned adjacent to an adjacent rack), or to communications equipment (e.g., a server, a wall outlet, etc.). FIG. 24 shows a plan view of the first distribution section 308A of the rack 301 and FIG. 25 shows a plan view of the second distribution section 308B of the rack 301. For clarity and ease in viewing, the distribution module(s) 400 positioned on the rack 301 are not shown in FIGS. 24 and 25.

In FIG. 24, the first patch cable 510A is routed from the first management section 332A at the front 302 of the rack 301, along a first horizontal channel guide 380A, to a first cable trough 352A at the rear 303 of the rack 301. In the example shown, the first horizontal channel 380A is connected to the second tower 313. For clarity, only the portion of the first patch cable 510A that extends away from the limiters 336 is shown. The first patch cable 510A is routed along the track 383 of the channel guide 380A from a front port 381 at the management region 332A to a rear port 389 at the trough 152A. Retaining fingers 385 extend over the first patch cable 510A at spaced intervals to aid in holding the first patch cable 510A within the track 383.

At the rear port 389 of the horizontal channel 380, the first patch cable 510A is transitioned onto the first trough 352A. In general, the first patch cables 510A can be transitioned from the exit port 389 towards either the first side 306 of the rack 301 or the second side 307 of the rack 301. In the example shown, the first patch cable 510A is transitioned towards the second side 307 of the rack 301 to one of the transition members 356. The transition member 356 aids in transitioning the first patch cable 510A from the trough 352 to one of the travel channels 373 at the rear 303 of the rack 301.

In other implementations, the first patch cable 510A may be routed past the travel channel 373 at the second side 307 of the rack 301 to a trough 352 of an adjacent rack (see dotted line 510A' of FIG. 24). In other implementations, the first patch cable 510A may be routed to a different travel channel 373 at the first side 306 of the rack 301 (see dotted line 510A" of FIG. 24). In still other implementations, the first patch cable 510A may be routed past the other travel channel 373 at the first side 306 of the rack 301 to a trough 352 of another adjacent rack (see dotted line 510A' of FIG. 24).

In certain implementations, the troughs 352 of adjacent racks 301 align with each other. Accordingly, patch cables 510 may be routed from the horizontal channel exit ports 389, along the troughs 352 of source racks 301, to the troughs 352 of destination racks, to appropriate travel channels 373 at the destination racks. In certain implementations, one or more additional racks 301 may be located between the source rack and the destination rack. In other implementations, the source rack and destination rack are the same rack.

For example, in some implementations, the patch cables 510 include intra-rack patch cables 510 that have a first common length and inter-rack patch cables 510 that may come in one of many standard lengths. For example, the length may vary depending on how many racks the patch cable 510 is expected to span. In other implementations, patch cables 510 having different lengths may be utilized. In still another implementation, patch cables 510 all having a common length may be utilized. In certain implementations, the patch cables 510 have a common length ranging from about one meter to about twenty meters. Indeed, in certain implementations, the patch cables 510 have a common length ranging from about two meters to about ten meters. In one example implementation, each patch cable 510 configured to span one rack 301 is about six meters long.

In FIG. 25, the second, third, and fourth patch cable 510B-510D are routed from the management section 332A, 332B at the front 302 of the rack 301, along first and second horizontal channel guides 380B, 380C, to a second cable trough 352B at the rear 303 of the rack 301. In the example shown, the horizontal channel 380B is connected to the second tower 313 and the horizontal channel 380A is connected to the first tower 3111. For clarity, only the portions of the patch cables 510B-510D that extend away from the limiters 336 are shown.

The second patch cable 510B is routed along the track 383 of the channel guide 380B from a front port 381 at the management region 332B to a rear port 389 at the trough 352B. Retaining fingers 385 extend over the second patch cable 510B at spaced intervals to aid in holding the second patch cable 510B within the track 383. At the rear port 389 of the horizontal channel 380B, the second patch cable 510B is transitioned onto the second trough 352B. In the example shown, the second patch cable 510B is transitioned towards the first side 306 of the rack 301 to one of the transition members 356. The transition member 356 aids in transitioning the second patch cable 510B from the trough 352B to one of the travel channels 373 at the rear 303 of the rack 301.

The third and fourth patch cables 510C, 510D are routed along the track 383 of a channel guide 380C from a front port 381 at the management region 331B to a rear port 389 at the second trough 352B. Retaining fingers 385 extend over the patch cables 510C, 510D at spaced intervals to aid in holding the patch cables within the track 383. At the rear port 389 of the horizontal channel 380C, the third patch cable 510C is transitioned onto the second trough 352B, towards the first side 307 of the rack 301, to one of the transition members 356. The transition member 356 aids in transitioning the third patch cable 510C from the second trough 352B to one of the travel channels 373 at the rear 303 of the rack 301. At the rear port 389 of the horizontal channel 380C, the fourth patch cable 510D is transitioned onto the second trough 352B, towards the first side 307 of the rack 301, to a trough of an adjacent rack.

The fifth patch cable 510E is shown being transitioned onto the second trough 352B from a trough of a rack that is located adjacent the second side 307 of the rack 301. In the example shown, the fifth patch cable 510E is routed to the transition member 356 at the second side 307 of the rack 301 and transitioned into a travel channel 373. In other implementations, the fifth patch cable 510E may be routed across the second trough 352B to the transition member 356 at the first side 306 of the rack 301 or to a trough of another rack that is located adjacent the first side 306 of the rack 301.

As shown in FIG. 20, in certain implementations, each travel channel 373 may be divided into a first portion 373a and a second portion 373b. The first portion 373a of the channel 373 is defined by the funnel portion of each transition member 356. The second portion 373b of the channel 373 is defined by the outer surfaces of the transition member 356 and the retaining fingers 379. In such implementations, patch cables 510 entering the travel channel 373 are routed from one of the transition members 356 into the first portion 373a of the channel 373. The patch cables 510 are transitioned from the first portion 373a to the second portion 373b as they progress through the channel 373 to allow additional patch cables 510 to be transitioned into the first portion 373a at a subsequent (e.g., lower) trough 352 (e.g., see FIG. 27).

Figure 26:
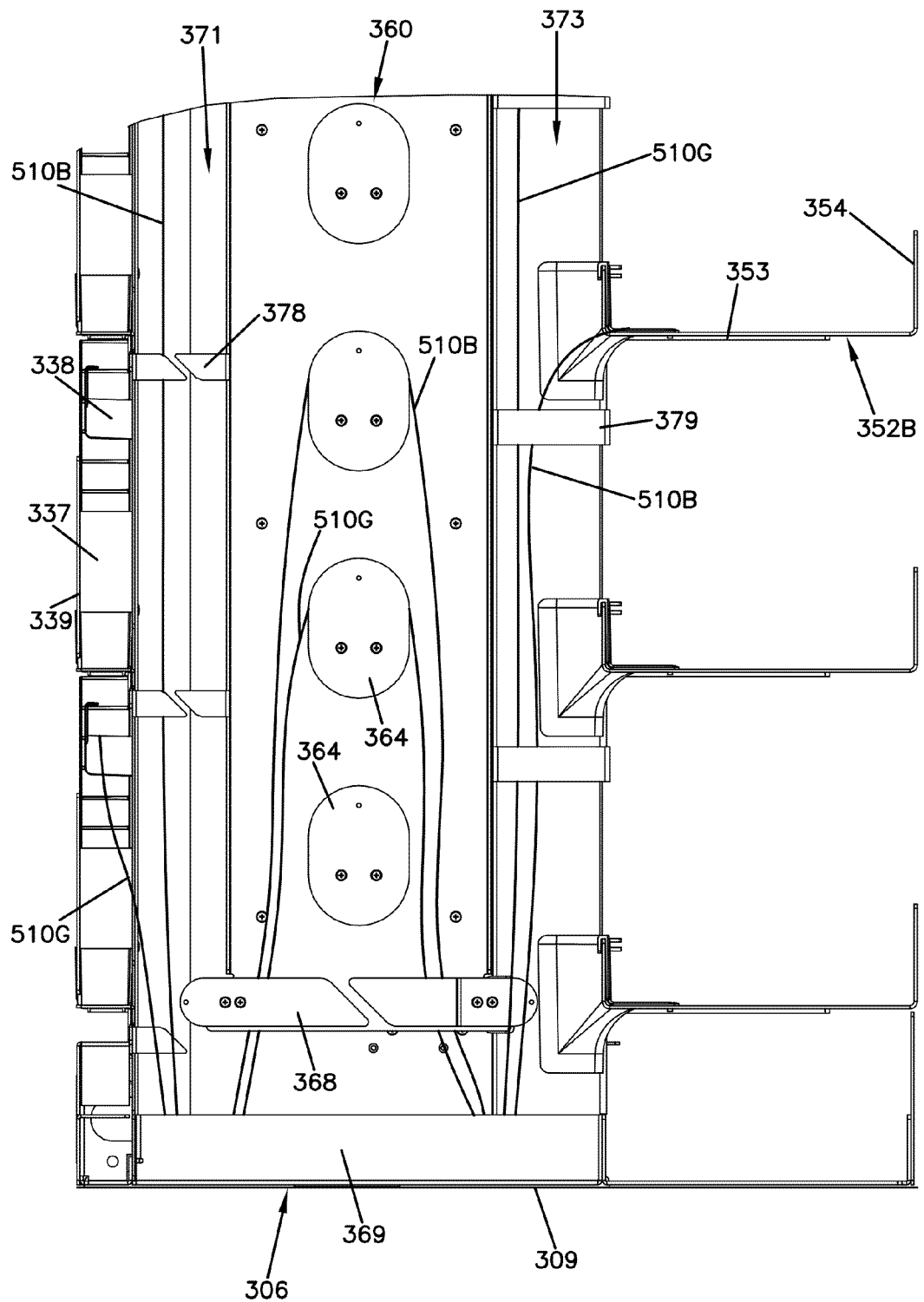
FIG. 26 is an enlarged view of a portion of FIG. 7 with two representative cables routed from the travel section of the rack, through a storage section, to management sections of the rack.

Referring to FIG. 26, the patch cables 510 are routed from the travel channels 373 at the rear 303 of a destination rack 301, through a slack storage region 360, to one of the distribution sections 308 at the front 302 of the destination rack 301. In FIG. 26, a first representative patch cable 510G is routed through the travel channel 373 from a trough 352 out of view of FIG. 20. The second example patch cable 510B also is visible in FIG. 26 being transitioned from the second trough 352B to the travel channel 373. Both of the patch cables 510G, 510B are routed down the travel channel 373 to the storage trough 369 located at the base 309 of the rack 301.

At the trough 369, the patch cables 510G, 510B are wrapped around the second side 307 of the rack 301 to one of the front vertical channel 371. Each of the patch cables 510G, 510B is routed up the front vertical channel 371 to the management section 330 of an appropriate distribution section 308. For example, the second example patch cable 510B is routed up the front vertical channel 371 to a management section 330 out of view of FIG. 26. As shown in FIG. 23, the second patch cable 510B is transitioned from the front vertical channel 371 to the management section 332B of the second distribution section 308B by routing the patch cable 510B between the support plate 333 and the cover plate 339 of the management section 332B. The second patch cable 510B is wound about the half spool 338B at the management region 332B and directed through one of the retention fingers 334. The second connectorized end 514B is plugged into one of the ports 410 of a distribution module 400 mounted at the second distribution section 308B.

The first representative patch cable 510G is transitioned from the front vertical channel 371 to the management section 330 of the bottom distribution section 308 by routing the patch cable 510 between the support plate 333 and the cover plate 339 of the management section 330 (see FIG. 26). As discussed above, the first representative patch cable 510G can be wound about one or more of the limiters 336 at the management region 330 and directed through one of the retention fingers 134 towards the distribution section 308. The second connectorized end of the first representative patch cable 510G can be plugged into one of the ports 410 of a distribution module 400 mounted at the distribution section 308.

In some implementations, when patch cables 510 are routed across the storage trough 369, a slack length of the patch cables 510 is left at the side 306, 307 of the rack 301, but not yet transitioned into the slack storage area 360. In such implementations, the slack length is stored at the spools 363 of the storage area 360 after the second connectorized ends 514 of the patch cables 510 have been routed to the appropriate distribution sections 308. In other implementations, the slack length of the patch cables 510 is routed through the slack storage area 360 before transitioning the patch cables 510 to the front vertical channels 371 of the rack 301.

As further shown in FIG. 26, the patch cables 510 may be transitioned into the slack storage area 360 beneath the retainer 368. Each patch cable 510 is wrapped about one of the spools 363 of the slack storage area 360 in a half-loop configuration. The spool 363 about which the slack length is wrapped depends on the amount of slack length to be taken up. In the example shown, the excess length of the second patch cable 510B is wrapped around the third spool 363 from the storage trough 369 and the first representative patch cable 510G is wrapped around the second spool 363 from the storage trough 369.

In certain implementations, the second connectorized ends 514 of one or more of the patch cables 510 may be disconnected from the front ports 422 and reconnected to different front ports 422 at the same or a different coupler module 420. If the second connectorized ends 514 are reconnected to front ports 422 at a different distribution section 308, then the slack length of the patch cables 510 may need to be adjusted. For example, the slack length may be looped around a higher or lower spool 363 at the slack storage area 360.

Figure 28:
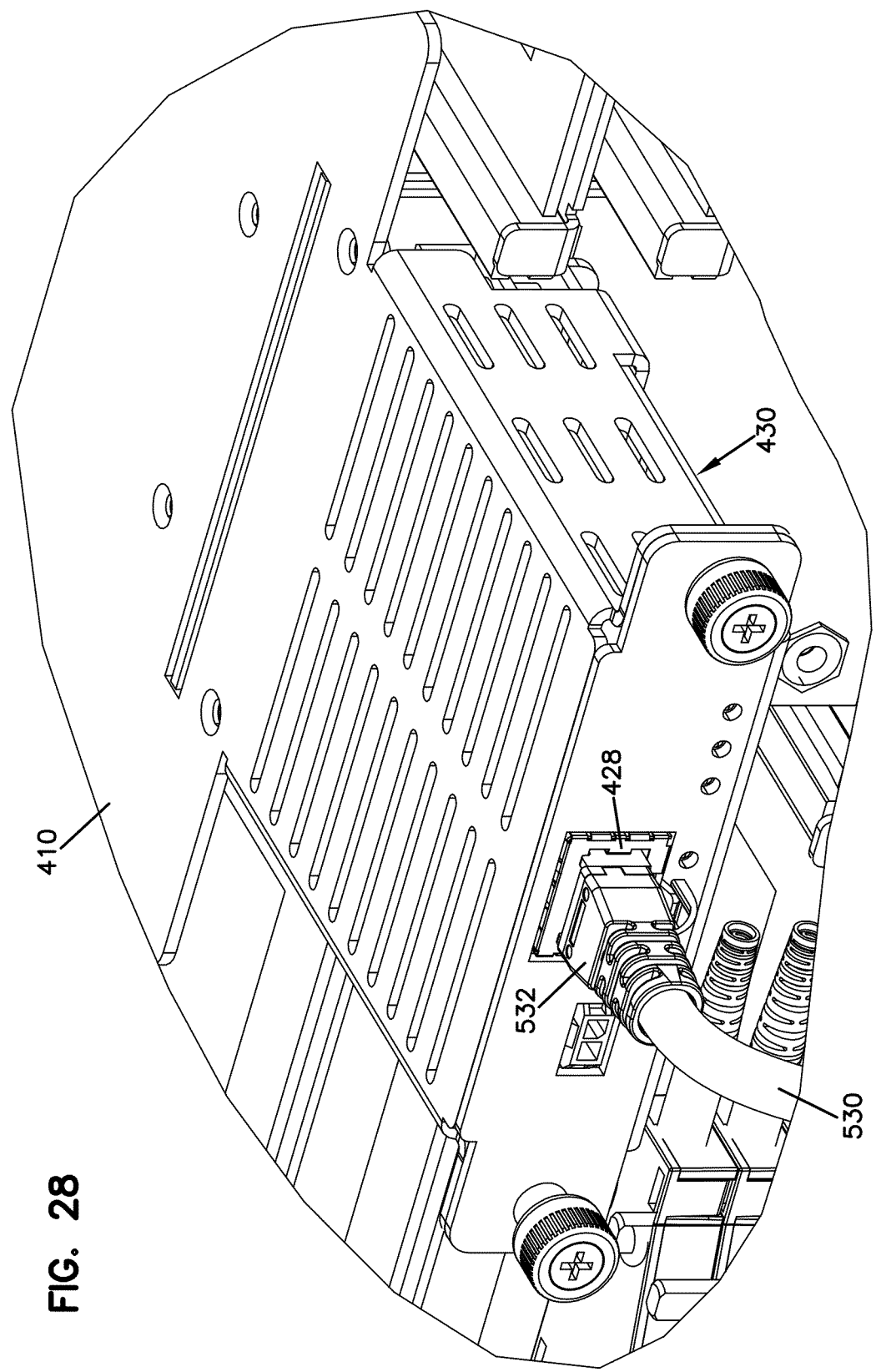
FIG. 28 is an enlarged view of an example master processor of a distribution module with PLI cable routed thereto in accordance with the principles of the present disclosure.

Referring now to FIGS. 27 and 28, in accordance with some aspects, PLI cables 530 can be routed to PLI ports 428 at the distribution modules 400. In some implementations, the PLI cables 530 are transitioned from one or more raceways or other routing structures to one or more of the PLI routing channels 375 (FIGS. 20 and 27) of the rack 301. From the PLI routing channels 375, the PLI cables 530 can be routed to an appropriate distribution module 400 (e.g., to a side or rear of the distribution module 400). In other implementations, however, the PLI cables 530 can be routed along the distribution channels 374 instead of along separate channels 375.

As shown in FIG. 27, in some implementations, the PLI cables 530 are configured to plug into PLI ports 428 (e.g., power connection ports, USB ports, electrical ports, and/or physical layer management ports) of the distribution modules 400. In one implementation, the PLI port 428 is formed on the master processor 430 associated with the distribution module 400 (see FIG. 28). In another implementation, the PLI port 428 is formed on the back plane 415 of each distribution module 400. In still other implementations, each coupler module 420 within the distribution module 400 defines a PLI port 428.

In some implementations, the PLI cables 530 are configured to carry power to the distribution modules 400. In other implementations, the PLI cables 530 are configured to carry PLI signals (e.g., signals S2 of FIG. 1). In certain implementations, the PLI cables 530 electrically connect to the back plane 415 of a distribution module 400 to connect the distribution module 400 to a data network (e.g., network 101 of FIG. 1, network 218 of FIG. 2, etc.). In certain implementations, physical layer information (e.g., pertaining to the distribution cables 520, patch cables 510, coupler modules 420, the distribution module 400, etc.) is carried by the PLI cables 530 between the distribution modules 400 and the data network.

Figure 29:
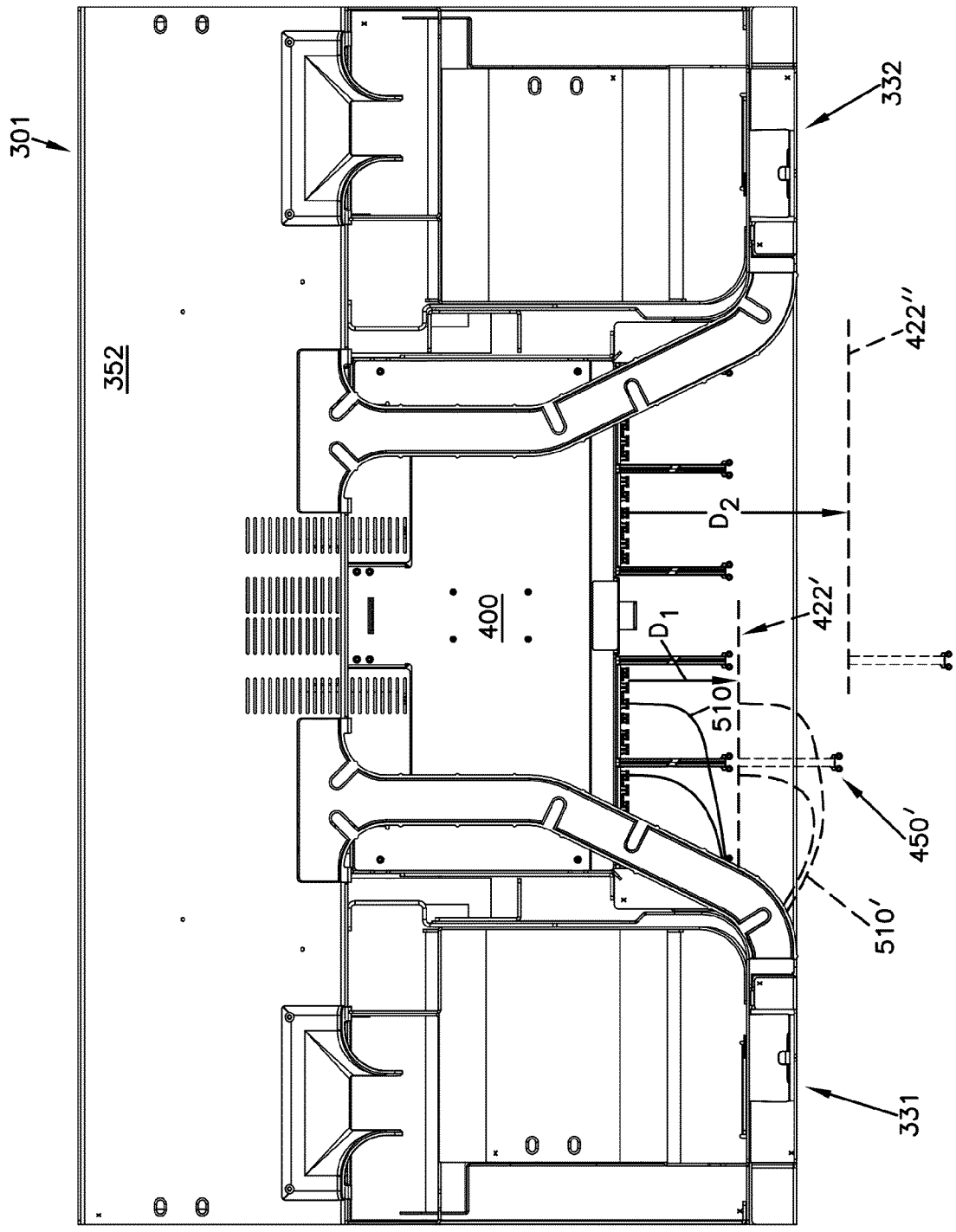
FIG. 29 is a plan view of an example rack showing an example coupler module moving from a retracted position, to a first extended position, and to a second extended position in accordance with the principles of the present disclosure.
Figure 30:
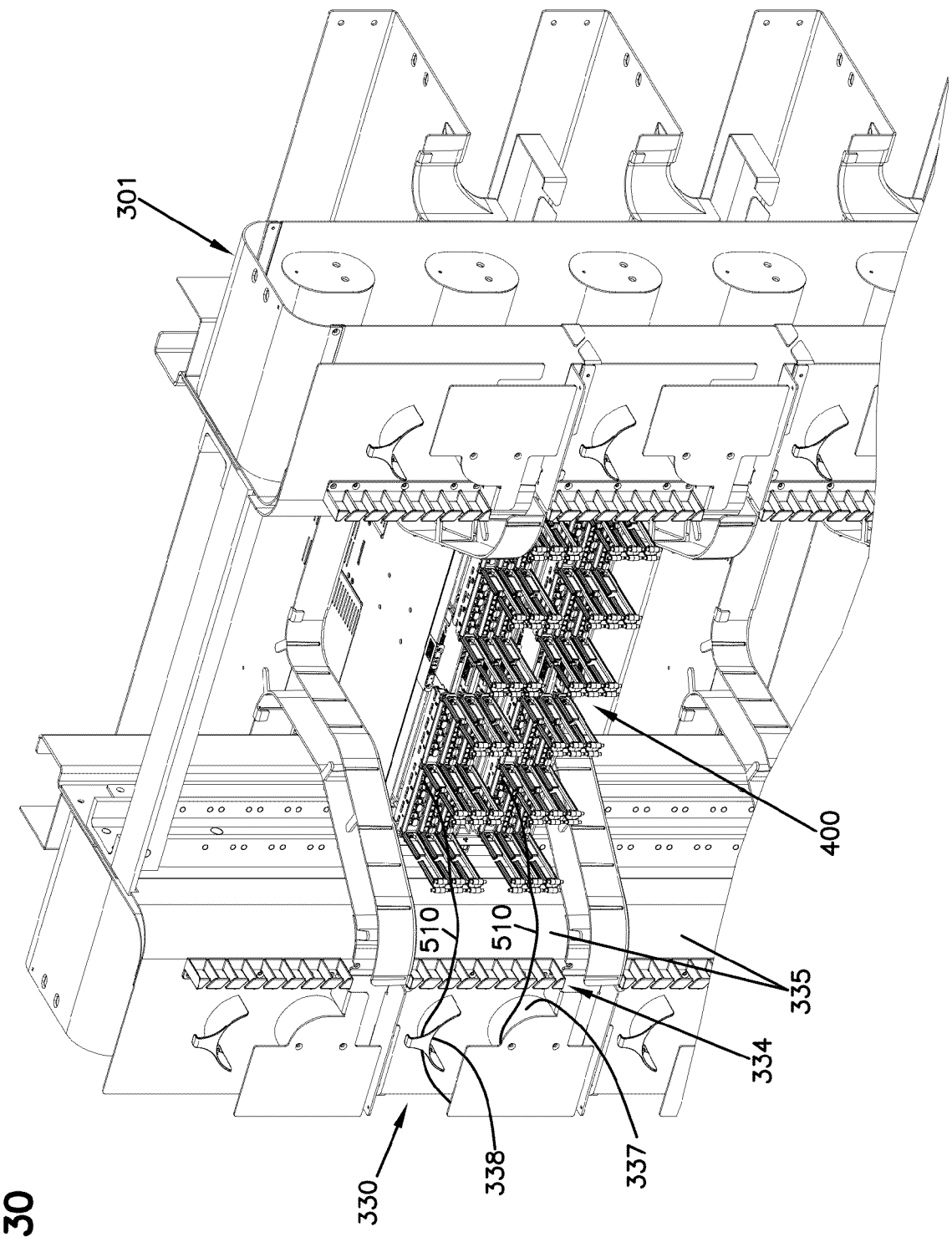
FIG. 30 is a partial front, perspective view of the rack of FIG. 4 with two example distribution modules mounted thereto.

Referring to FIGS. 29 and 30, the management regions 330 manage the patch cables 510 when one or more coupler modules 420 are moved relative to the chassis 410 of the distribution modules 400. For example, in some implementations, the distribution modules 400 are mounted to the rack 301 so that the front ports 422 are located at positions recessed from the front 302 of the rack 301 (e.g., see FIGS. 29-30). The retention fingers 334 and transition surfaces 335 of the management regions 330 and the retaining members 450 of the coupler modules 420 cooperate to manage bending of the patch cables 510 during movement of the coupler modules 420 between the retracted position and at least the first extended position.

The front ports 422 of each coupler modules 420 are configured to travel over a distance D1 when the coupler module 420 moves between the retracted position and the first extended position. In some implementations, the distance D1 ranges from about one inch to about six inches. Indeed, in some implementations, the distance D1 ranges from about two inches to about five inches. In one example implementation, the distance D1 is about three inches. In another example implementation, the distance D1 is about four inches.

The front ports 422 of each coupler modules 420 are configured to travel over a distance D2 when the coupler module 420 moves between the retracted position and the second extended position. In some implementations, the distance D2 ranges from about two inches to about ten inches. Indeed, in some implementations, the distance D2 ranges from about four inches to about eight inches. In one example implementation, the distance D2 is about five inches. In another example implementation, the distance D2 is about six inches. In another example implementation, the distance D2 is about seven inches.

Patch cables 510 plugged into front ports 422 of distribution modules 400 mounted to a rack 301 extend forwardly from the front ports 422 and sideways into the retainer members 450 of the respective coupler module 420. From the retaining member 450, the patch cables 510 extend toward the transition surfaces 335 of a respective management region 330. In certain implementations, patch cables 510 plugged into the front ports 422 at one side of the distribution module 400 extend towards the management regions 332 at the first side 306 of the rack 301 and patch cables 510 plugged into the front ports at another side of the distribution module 400 extend toward the management regions 331 at the second side 307 of the rack 301. At the respective management regions 330, the patch cables 510 follow the transition surfaces 335 forwardly and sideways toward the respective retention fingers 334. The patch cables 510 are routed through channels defined by the appropriate retention fingers 334 and forwarded to the bend radius limiters 336.

When one or more of the coupler modules 420 is moved (e.g., pulled) forwardly to the first extended position (e.g., see first ports 422' represented by a dashed line in FIG. 29), slack length of the corresponding patch cables 510 unbends at least partially from the transition surfaces 335 (see patch cable 510' shown as a dotted line in FIG. 29) to accommodate the movement. However, the patch cables 510 remain held by the retaining fingers 334 and retaining members 450. The retention fingers 334 extend sufficiently forward of the rack 301 to provide ample cross-sectional space in which the patch cables 510 can move (see FIG. 30) to accommodate movement of the first connectorized ends 512 with the coupler modules 420. Accordingly, movement of the coupler modules 420 to at least the first extended position does not place strain on the patch cables 510. Further, the patch cables 510 remain organized and managed throughout the movement between the retracted and extended positions.

In some implementations, the retention fingers 334 provide sufficient room for the patch cables 510 to move away from the transition surfaces 335 without exceeding a maximum bend radius when the coupler modules 420 are moved to the second extended position (e.g., see first ports 422" represented by a second dashed line in FIG. 29). In other implementations, however, the patch cables 510 are disconnected from a coupler module 420 before the coupler module 420 is moved to the second extended position. For example, the patch cables 510 may be disengaged from the retention fingers 334 through slots 398 to accommodate the movement of the coupler module 420.

In accordance with some aspects of the disclosure, a process for storing slack patch cable length in a rack system including at least a first rack includes plugging a first connectorized end of a first patch cable at a first front port positioned at the first rack; routing the first patch cable forwardly and sideways from the first front port, over a transition surface, to a front of the first rack to provide a first slack length of the first cable at the front of the first rack; and routing the first patch cable sideways through a retention finger towards a first management section located at the front of the first rack at which the first patch cable is routed around a bend radius limiter and into a horizontal channel. The process also includes routing the first patch cable through the horizontal channel from the front of the first rack, beneath the first front port, to a rear of the first rack; routing the first patch cable over a trough located at the rear of the first rack towards a first travel channel located at a rear of a destination rack at which the first patch cable is routed downwardly to a bottom, rear of the destination rack; and routing the first patch cable from the bottom, rear of the destination rack, around one side of the destination rack, to a bottom, front of the destination rack including leaving a second slack length of the first cable at the side of the destination rack. The process also may include routing the first patch cable upwardly from the bottom, front of the destination rack to a destination management section at which the first patch cable is wrapped at least partially around a bend radius limiter; routing the first patch cable from the destination management section, sideways through a second retention finger, and rearward and sideways over a second transition surface to a second front port positioned at the destination rack; and plugging a second connectorized end of the first patch cable at the second front port positioned at the destination rack.

In some implementations, the process for storing slack patch cable length also includes moving the first coupler module forwardly to the extended position while the connectorized end of the first patch cable remains in the first front port; removing the connectorized end of the first patch cable from the first front port while the first coupler module is in the extended position; plugging a connectorized end of a second patch cable into the first front port while the first coupler module is in the extended position; and moving the first coupler module rearward to the retracted position with the connectorized end of the second patch cable in the first front port. In one example implementation, the first coupler module is moved forwardly about three inches.

In some implementations, the process for storing slack patch cable length also includes removing the additional patch cables from the retention fingers at the front of the first rack; and moving the first coupler module to a second extended position while the connectorized ends of the additional patch cables remain plugged into the front ports of the first coupler module, the second extended position being located forwardly of the first extended position. In one example implementation, the first coupler module is moved forwardly about six inches.

In accordance with some implementations, a process for coupling at least one distribution cable to at least one patch cable at a first rack includes routing a distribution cable vertically along a rear of the first rack to a coupler module; moving the first coupler module forwardly to an extended position; accessing a connectorized end of the first distribution cable from the front of the first rack and plugging the connectorized end of the first distribution cable into a first rear port from the front of the first rack while the first coupler module is in the extended position. The process also may include moving the first coupler module rearward to a retracted position; and plugging a connectorized end of the patch cable into a first front port of the coupler module.

In some implementations, the process also includes moving the first coupler module to the extended position without unplugging the connectorized end of the distribution cable from the first rear port; removing the connectorized end of the patch cable from the first front port; plugging a connectorized end of a second patch cable into the first front port; and moving the first coupler module to the retracted position.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A rack having a front, a rear, a top, a bottom, a first side, and a second side, the rack comprising:
   a plurality of front ports mounted to the rack at a location intermediate the front and the rear, the front ports being configured to move horizontally relative to the rack between a retracted position and an extended position that is forward of the retracted position;
   a first plurality of bend radius limiters located at the front of the rack on at least one of the first and second sides;
   a plurality of retention fingers located at the front of the rack between the bend radius limiters and the front ports, each retention finger defining a channel that extends forwardly of the rack;
   at least one transition section located on the first rack, the transition section defining a contoured surface extending between the first ports and the retention fingers; and
   a plurality of patch cables having first connectorized ends plugged into the front ports, a first slack length of each cable extending over the transition section between one of the front ports and one of the retention fingers when the front ports are in the retracted position, each cable extending through the channel of one of the retention fingers, and at least a portion of each cable being wrapped at least partially around one of the bend radius limiters.

2. The rack of claim 1, wherein the channels defined by the retention fingers have sufficient area to accommodate the patch cables when the front ports are moved to the extended position, wherein the first slack length of each cable unbends from the transition section when the front ports are moved to the extended position.

3. The rack of claim 2, wherein the front ports are moved about three inches between the retracted and extended positions.

4. The rack of claim 1, wherein the front ports are configured to move to a second extended position that is farther forward relative to the rack than the first extended position, and wherein each retention finger defines a slot through which the patch cables can be removed from the respective channels when the front ports are moved to the second extended position.

5. The rack of claim 4, wherein the front ports are moved about six inches between the retracted position and the second extended position.

6. The rack of claim 1, wherein the front ports are positioned on at least one coupler module that is mounted to at least one distribution module that is mounted on the rack, the coupler module being moveable relative to the distribution module to move the front ports between the retracted and extended positions.

7. The rack of claim 1, wherein the plurality of bend radius limiters includes at least one spool and at least one half-spool.

* * * * *